(12) United States Patent  
Yamazaki et al.

(10) Patent No.: US 8,619,219 B2  
(45) Date of Patent: Dec. 31, 2013

(54) THIN FILM TRANSISTOR, DISPLAY DEVICE AND LIQUID CRYSTAL DISPLAY DEVICE AND METHOD FOR MANUFACTURING THE SAME

(75) Inventors: Shunpei Yamazaki, Tokyo (JP); Shinji Maekawa, Shizuoka (JP); Yohei Kanno, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/552,845

(22) Filed: Jul. 19, 2012

(65) Prior Publication Data

US 2012/0282717 A1    Nov. 8, 2012

Related U.S. Application Data

(63) Continuation of application No. 12/984,627, filed on Jan. 5, 2011, now Pat. No. 8,228,453, which is a continuation of application No. 10/573,775, filed as application No. PCT/JP2004/018105 on Nov. 30, 2004, now Pat. No. 7,868,957.

(30) Foreign Application Priority Data

Dec. 2, 2003 (JP) ................................ 2003-403666  
Dec. 2, 2003 (JP) ................................ 2003-403848

(51) Int. Cl.  
*G02F 1/1333* (2006.01)

(52) U.S. Cl.  
USPC .............. 349/106; 349/43; 349/110; 349/187

(58) Field of Classification Search  
None  
See application file for complete search history.

(56) References Cited

U.S. PATENT DOCUMENTS 5,132,248 A    7/1992    Drummond et al.  
5,427,976 A    6/1995    Koh et al.  
(Continued)

FOREIGN PATENT DOCUMENTS

CN    1134600    10/1996  
EP    0683405 A1 * 11/1995  
(Continued)

OTHER PUBLICATIONS

International Search Report of Application No. PCT/JP2004/018105; PCT7530-7540) Dated Mar. 8, 2005.

(Continued)

*Primary Examiner* — Mike Stahl  
(74) *Attorney, Agent, or Firm* — Nixon Peabody LLP; Jeffrey L. Costellia

(57) ABSTRACT

As a wiring becomes thicker, discontinuity of an insulating film covering the wiring has become a problem. It is difficult to form a wiring with width thin enough for a thin film transistor used for a current high definition display device. As a wiring is made thinner, signal delay due to wiring resistance has become a problem. In view of the above problems, the invention provides a structure in which a conductive film is formed in a hole of an insulating film, and the surfaces of the conductive film and the insulating film are flat. As a result, discontinuity of thin films covering a conductive film and an insulating film can be prevented. A wiring can be made thinner by controlling the width of the hole. Further, a wiring can be made thicker by controlling the depth of the hole.

27 Claims, 56 Drawing Sheets

(56) References Cited

U.S. PATENT DOCUMENTS

| | | | |
|---|---|---|---|
| 5,706,064 | A | 1/1998 | Fukunaga et al. |
| 5,757,451 | A | 5/1998 | Miyazaki et al. |
| 5,994,721 | A * | 11/1999 | Zhong et al. .................. 257/89 |
| 6,118,505 | A * | 9/2000 | Nagata et al. ................ 349/106 |
| 6,132,800 | A * | 10/2000 | Shimada et al. .............. 427/108 |
| 6,162,654 | A * | 12/2000 | Kawabe ......................... 438/30 |
| 6,180,976 | B1 | 1/2001 | Roy |
| 6,387,737 | B1 | 5/2002 | Yamazaki et al. |
| 6,630,274 | B1 | 10/2003 | Kiguchi et al. |
| 6,855,957 | B1 | 2/2005 | Yamazaki et al. |
| 6,909,477 | B1 * | 6/2005 | Yi et al. ....................... 349/106 |
| 6,952,036 | B2 | 10/2005 | Suzuki et al. |
| 6,994,414 | B2 | 2/2006 | Hashimoto et al. |
| 7,022,556 | B1 | 4/2006 | Adachi |
| 7,067,845 | B2 | 6/2006 | Murakami et al. |
| 7,259,429 | B2 | 8/2007 | Yamazaki |
| 7,528,019 | B2 | 5/2009 | Lee et al. |
| 7,709,843 | B2 | 5/2010 | Yamazaki et al. |
| 7,821,065 | B2 | 10/2010 | Murakami et al. |
| 7,868,957 | B2 | 1/2011 | Yamazaki et al. |
| 7,928,946 | B2 | 4/2011 | Yamazaki et al. |
| 2001/0005245 | A1 * | 6/2001 | Sakamoto et al. ........... 349/106 |
| 2002/0060757 | A1 * | 5/2002 | Kiguchi et al. ................ 349/43 |
| 2003/0059987 | A1 | 3/2003 | Sirringhaus et al. |
| 2003/0083203 | A1 | 5/2003 | Hashimoto et al. |
| 2004/0038138 | A1 | 2/2004 | Kiguchi et al. |
| 2004/0075789 | A1 * | 4/2004 | Wang ............................ 349/106 |
| 2004/0113161 | A1 | 6/2004 | Suzuki et al. |
| 2004/0119903 | A1 * | 6/2004 | Chang et al. .................. 349/43 |
| 2004/0132294 | A1 * | 7/2004 | Takagi et al. ................ 438/689 |
| 2005/0022374 | A1 | 2/2005 | Hirai et al. |
| 2005/0250262 | A1 | 11/2005 | Suzuki et al. |
| 2006/0093928 | A1 * | 5/2006 | Hung et al. ...................... 430/7 |
| 2006/0176413 | A1 | 8/2006 | Moriya |
| 2006/0209235 | A1 * | 9/2006 | Kim .............................. 349/110 |
| 2006/0222970 | A1 * | 10/2006 | Kobayashi ........................ 430/7 |
| 2007/0222933 | A1 | 9/2007 | Ohmi |
| 2008/0024701 | A1 | 1/2008 | Abe et al. |
| 2011/0095312 | A1 | 4/2011 | Murakami et al. |

FOREIGN PATENT DOCUMENTS

| | | |
|---|---|---|
| EP | 1 061 383 A1 | 12/2000 |
| EP | 1 369 928 A1 | 12/2003 |
| JP | 03-159174 | 7/1991 |
| JP | 11-326951 | 11/1999 |
| JP | 2000-221319 | 8/2000 |
| JP | 2001-179167 | 7/2001 |
| JP | 2003-133691 | 5/2003 |
| JP | 2003-317945 | 11/2003 |
| JP | 2003-318193 | 11/2003 |
| JP | 2003-318401 | 11/2003 |
| WO | WO 02/067335 A1 | 8/2002 |
| WO | WO 2005-059990 A1 | 6/2005 |

OTHER PUBLICATIONS

Written Opinion (Application No. PCT/JP2004/018105; PCT7530-7540) Dated Mar. 8, 2005.

Office Action (Application No. 200480035952.1;PCTCN7530/7540) Dated Apr. 11, 2008 with English Translation.

Specification of Abandoned U.S. Appl. No. 08/579,360, filed Dec. 27, 1995.

* cited by examiner

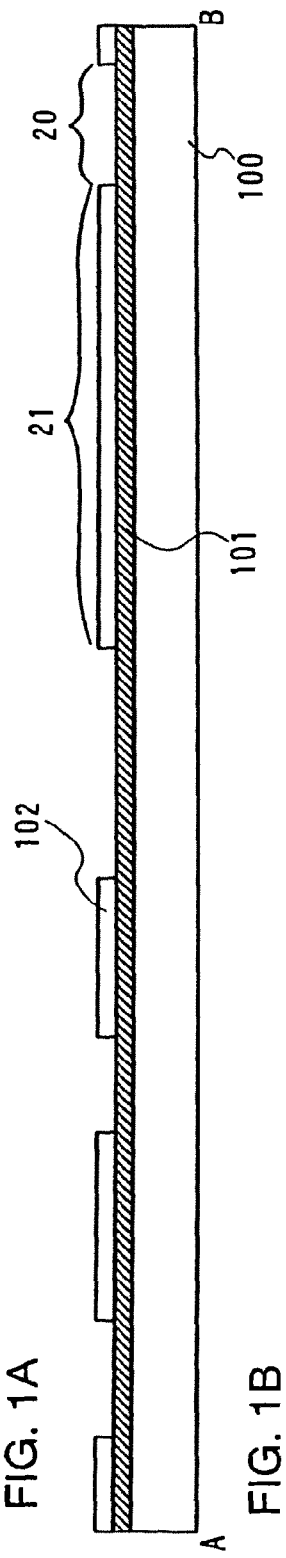
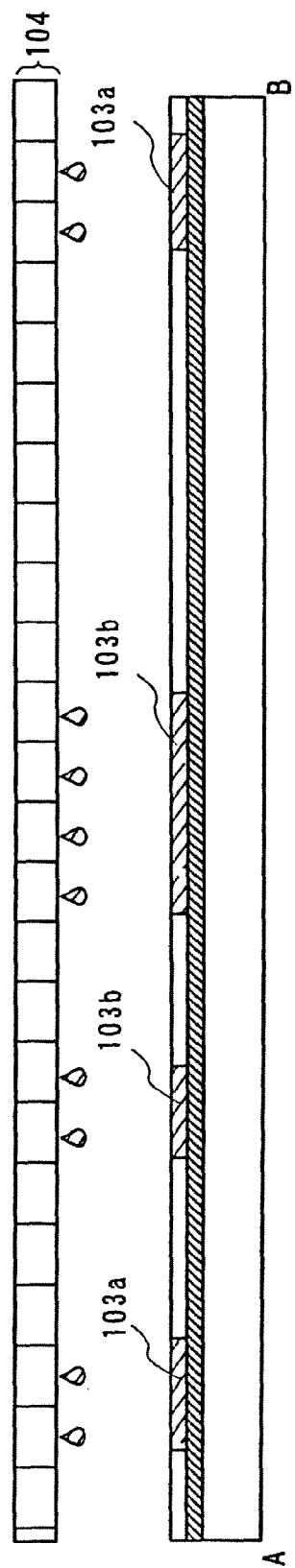
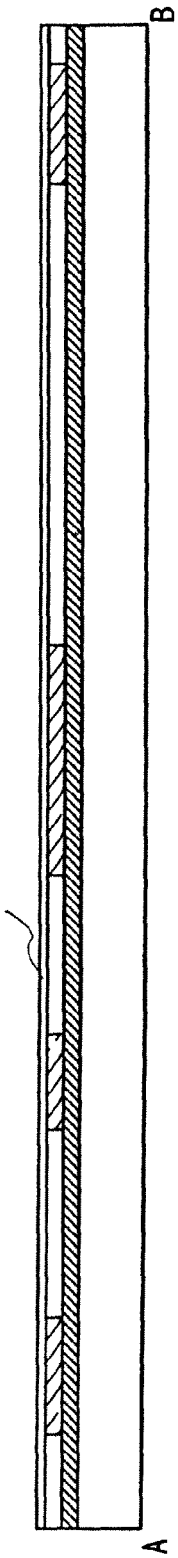
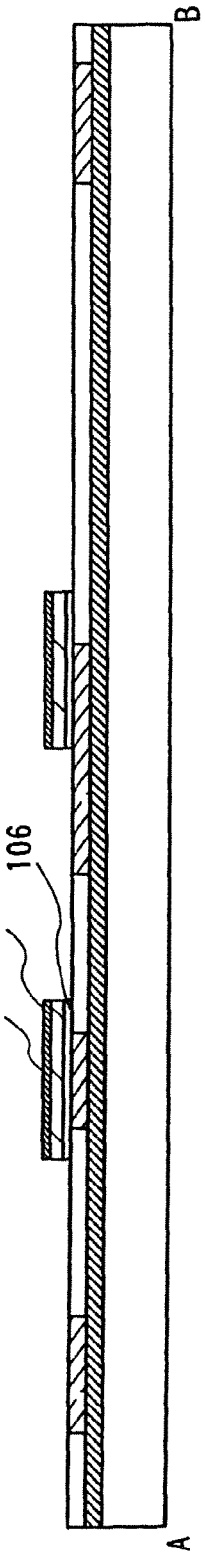
FIG. 1A
FIG. 1B
FIG. 1C
FIG. 1D

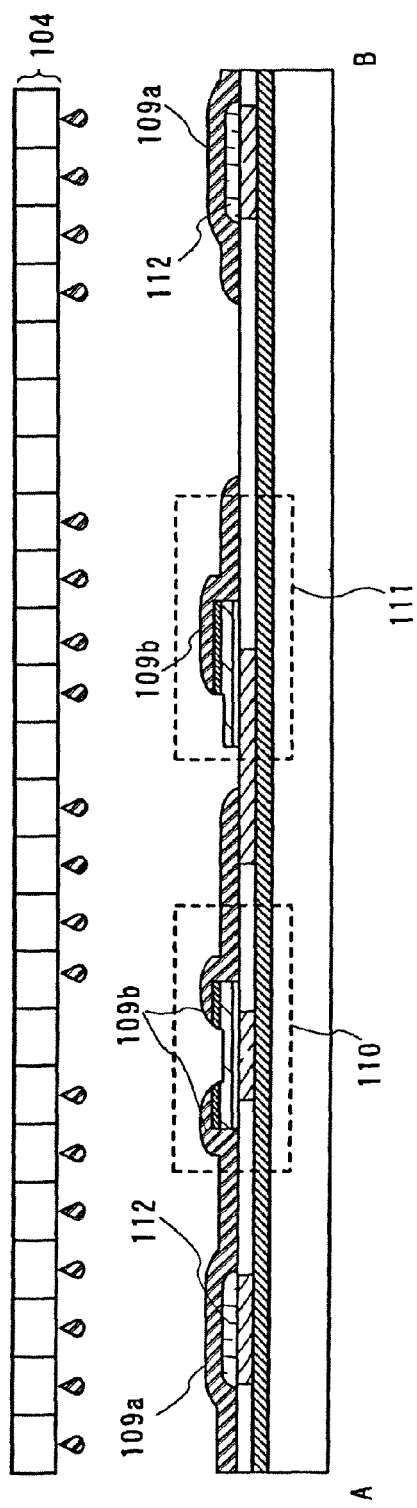
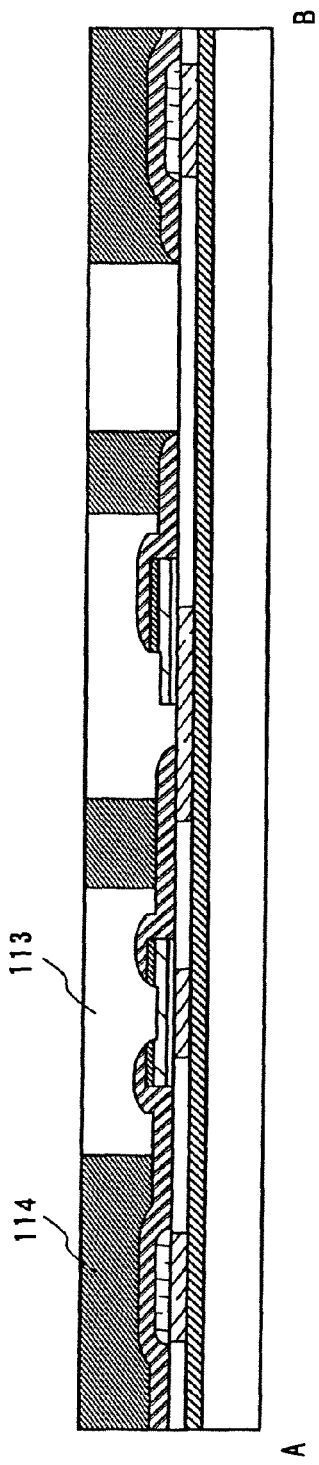

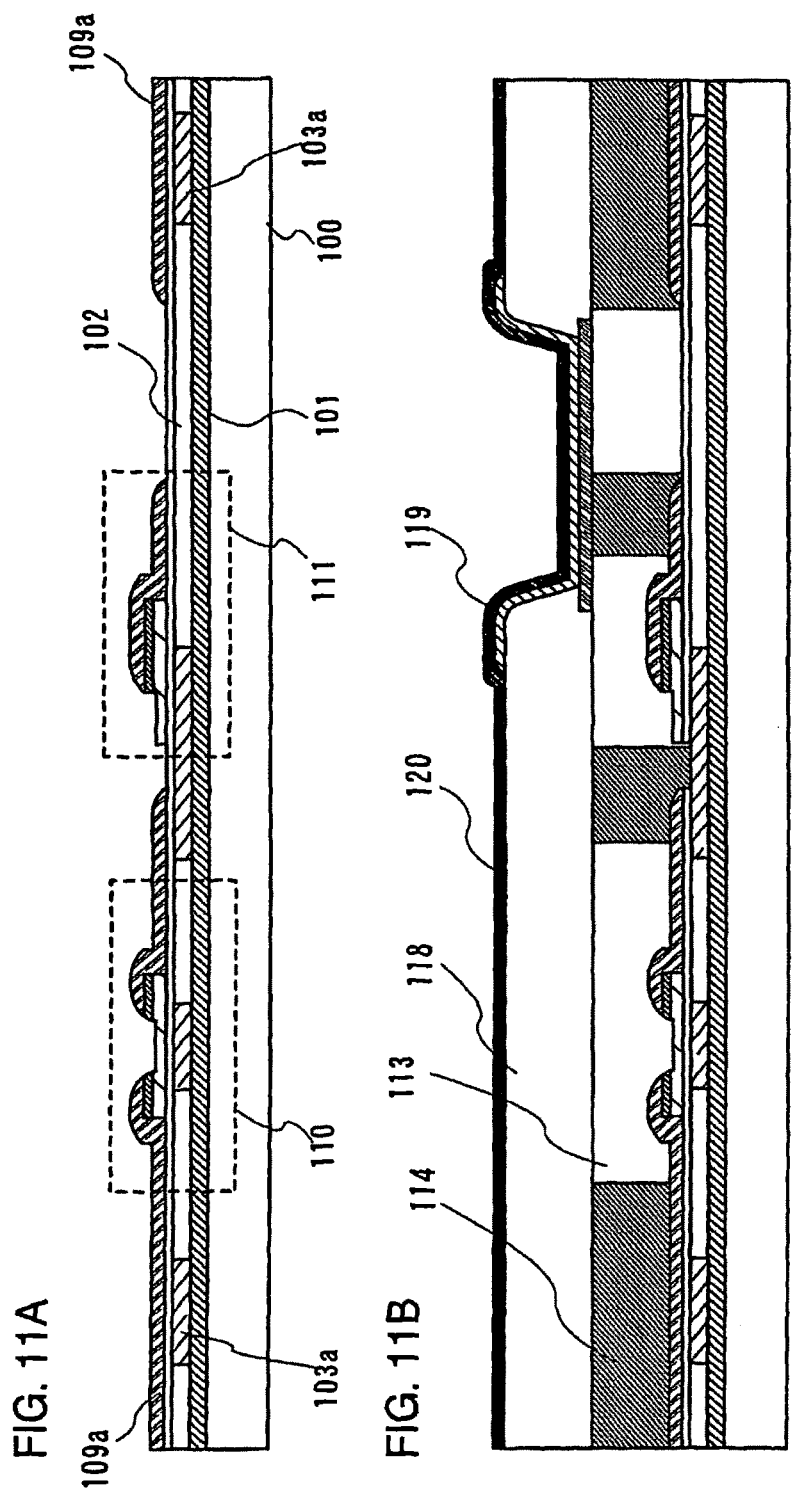

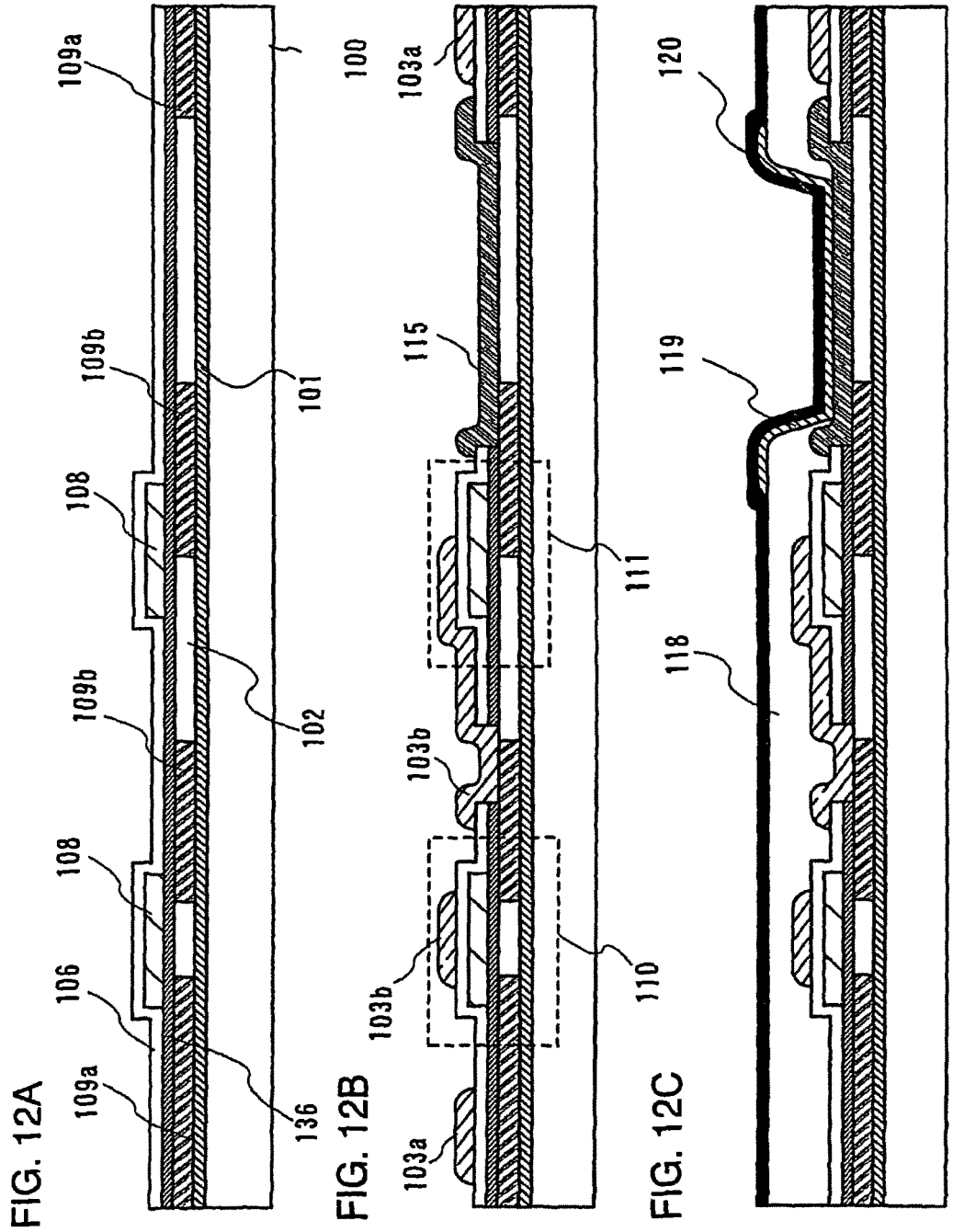

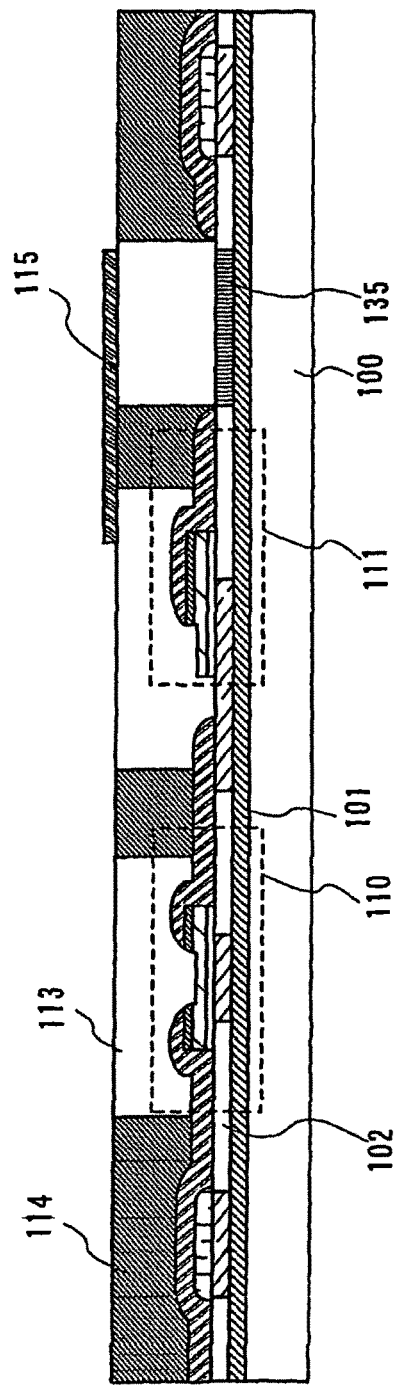
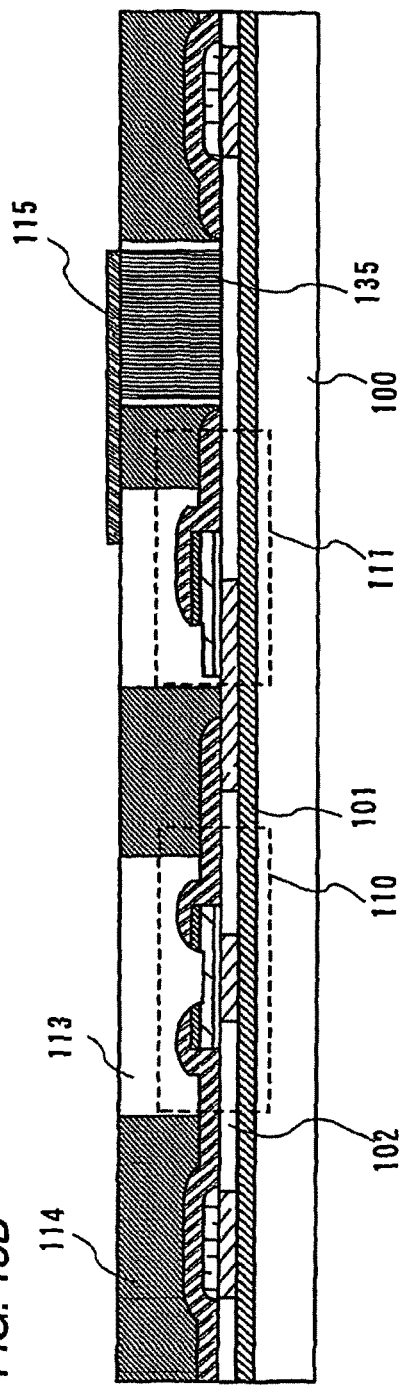
FIG. 13A
FIG. 13B

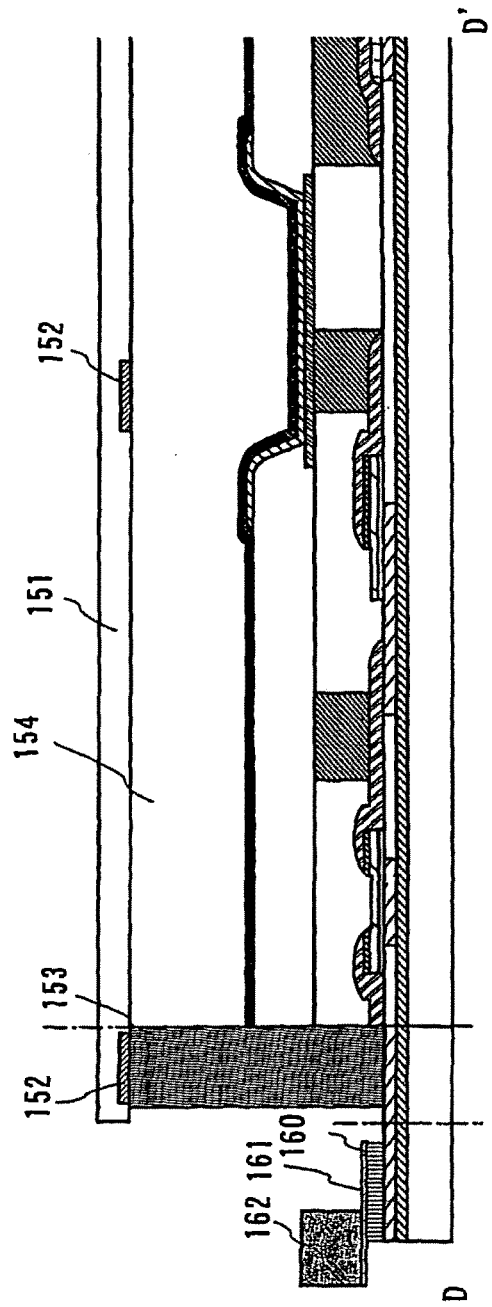
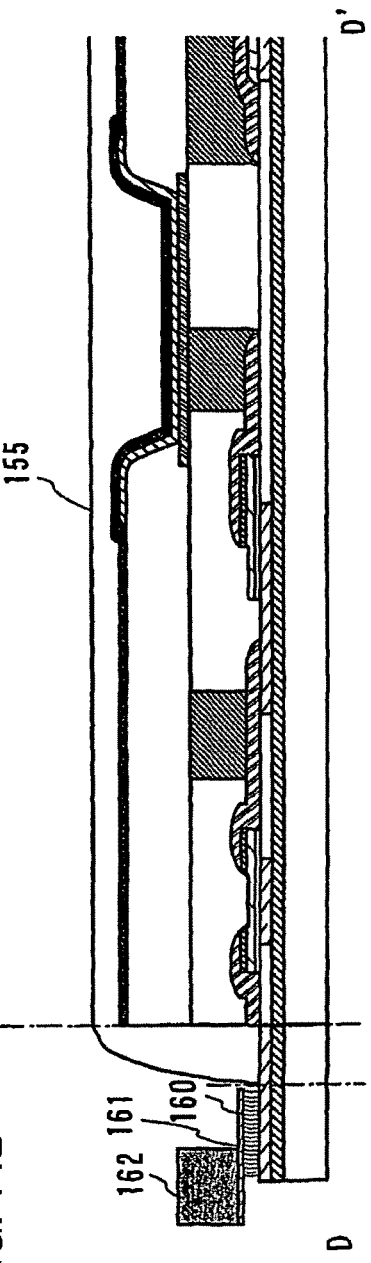

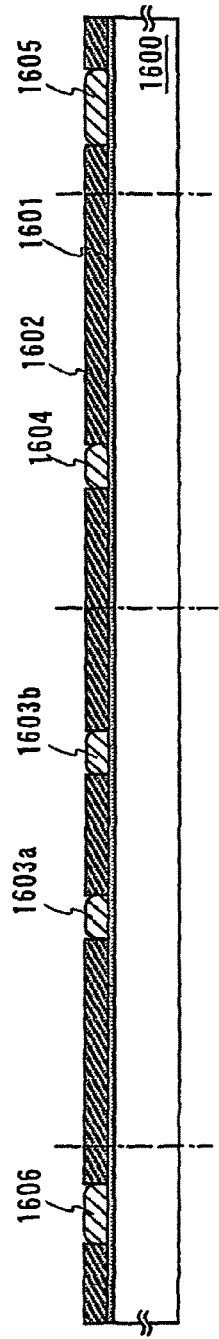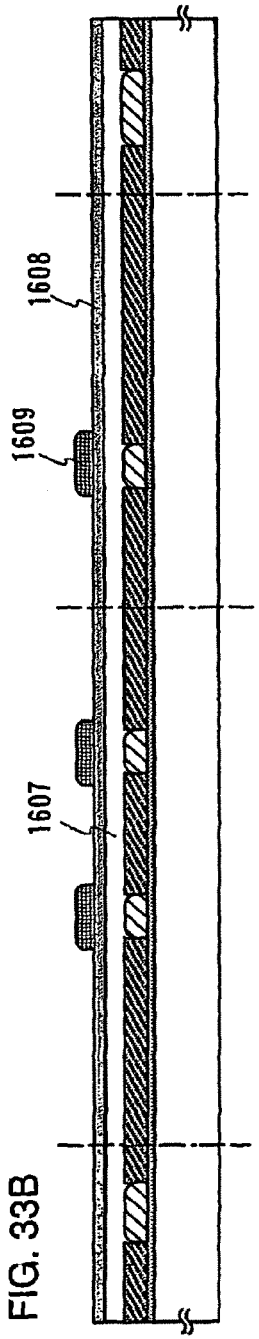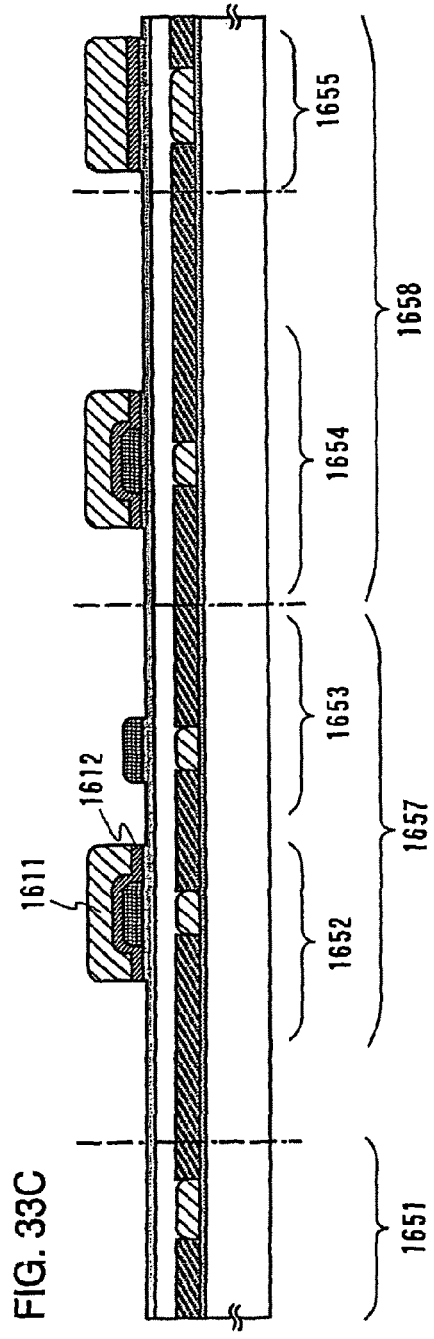

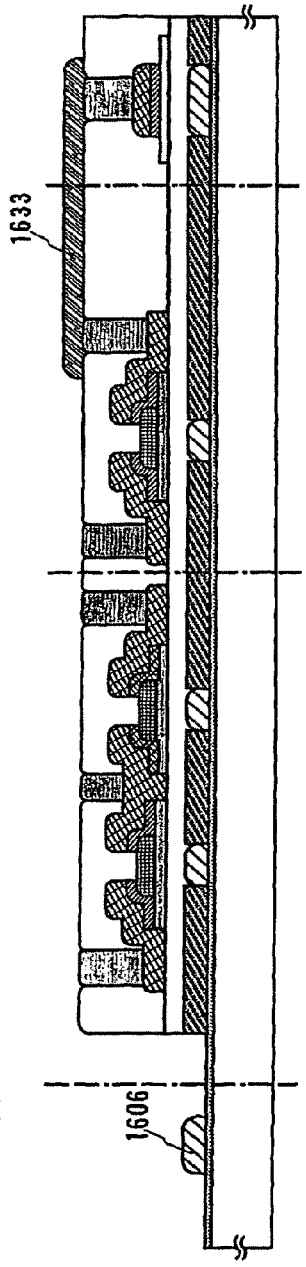
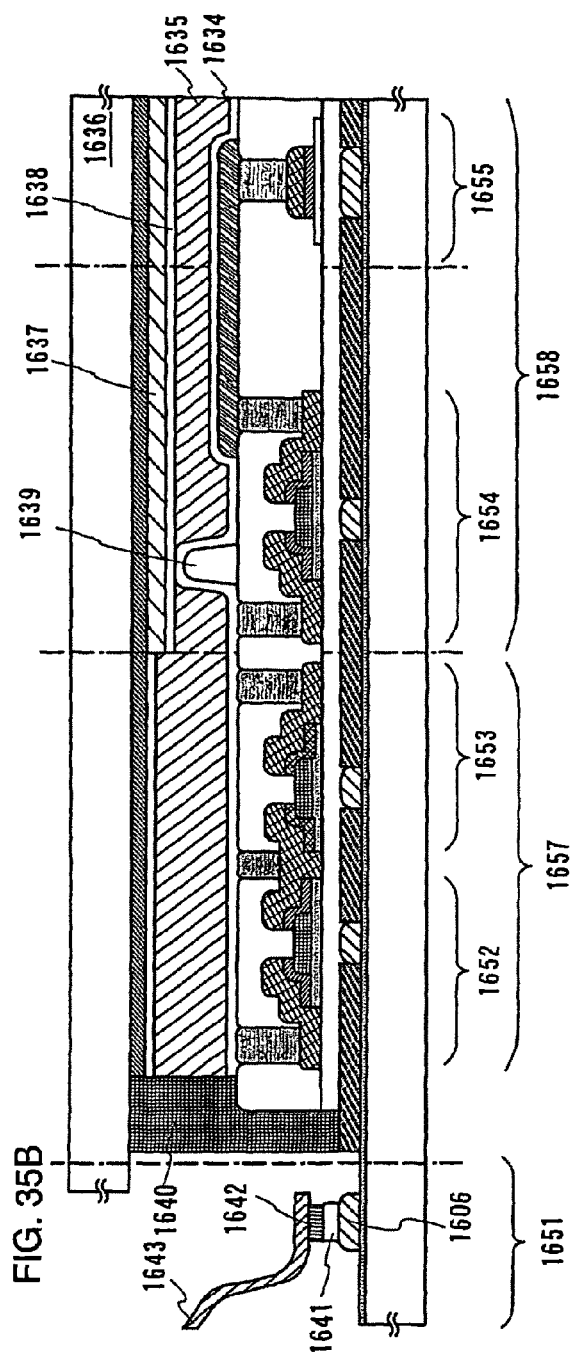
FIG. 35A
FIG. 35B

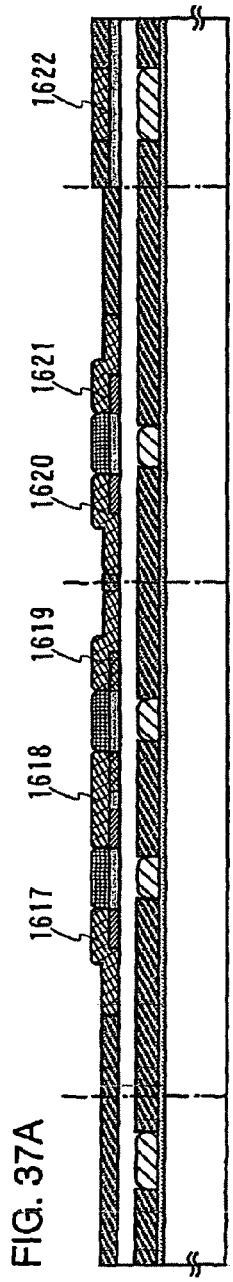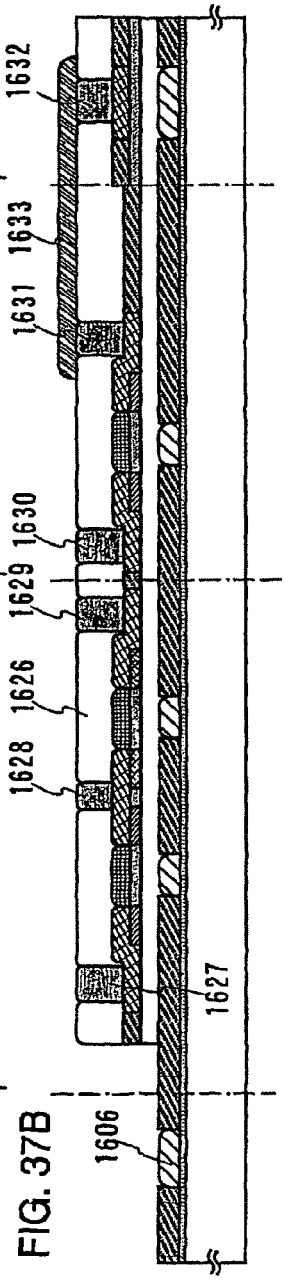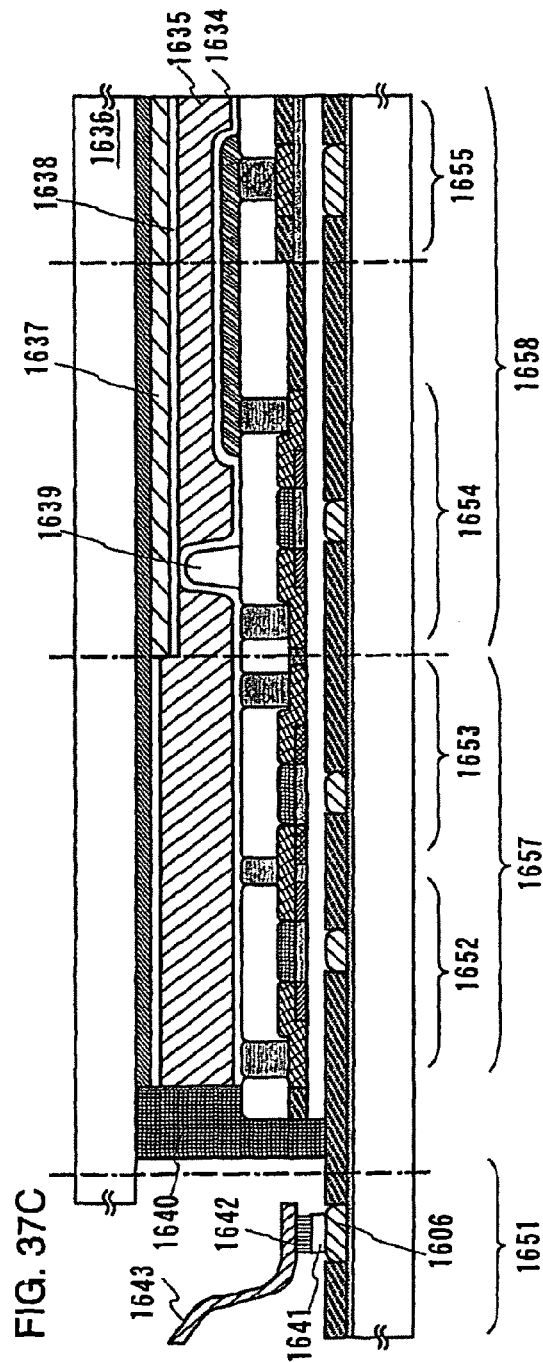

THIN FILM TRANSISTOR, DISPLAY DEVICE AND LIQUID CRYSTAL DISPLAY DEVICE AND METHOD FOR MANUFACTURING THE SAME

TECHNICAL FIELD

The present invention relates to methods for fabricating a wiring, a thin film transistor, and a display device, each of which employs a method by which a pattern can be selectively formed. In particular, the invention relates to a display device having an active element such as a transistor formed over a large glass substrate by using a droplet discharge method typified by ink-jet as a method by which a pattern can be selectively formed, and to a fabrication method of the display device. Further, the invention relates to a wiring, a thin film transistor, and a display device which are formed by a method by which a pattern can be selectively formed.

BACKGROUND ART

Conventionally, a display panel of a so-called active matrix driving method constituted by a thin film transistor (hereinafter also referred to as a "TFT") over a glass substrate has been fabricated by patterning various kinds of thin films by a light exposure process using a photomask as well as a manufacturing technique of a semiconductor integrated circuit.

Production technologies by which a plurality of liquid crystal display panels is obtained from one mother glass substrate has been applied to efficient mass production. The size of a mother glass substrate used for manufacturing a display panel became larger from 300 mm×400 mm in the first generation in the early 1990s to 680 mm×880 mm or 730 mm×920 mm in the fourth generation in 2000. Thus, the production technology has developed, so that a number of display panels can be obtained from one substrate.

When the size of a glass substrate or a display panel is small, patterning treatment can be carried out relatively easily by using a light exposure apparatus. However, as the substrate size is enlarged, the entire surface of a display panel cannot be processed by carrying out a single light exposure. Consequently, such a method as the area where a photoresist is applied is divided into plural blocks, and light exposure is performed on each block; thus, the entire surface of a substrate can be exposed by repeating the light exposure process, or other methods have been developed. (Reference 1: Japanese Patent Laid-Open No. 11-326951).

A droplet discharge technology has been used for printing text and images; however, the technology has been lately applied to pattern formation in the semiconductor field. For example, a method by which a method for discharging droplets onto a predetermined area, that is, ink-jet for forming a film pattern of a conductive wiring or the like can be improved is proposed. Reference 1 discloses a method for forming a film pattern by ink-jet acquiring a film with thicker thickness and thinner width without disconnection, short circuit, or the like even in the case of forming a conductive film (Reference 2: Japanese Patent Laid-Open No. 2003-133691).

DISCLOSURE OF INVENTION

However, a glass substrate is further enlarged to a size of 1000 mm×1200 mm or 1100 mm×1300 mm in the fifth generation, a size of 1500 mm×1800 mm in the sixth generation, and a size of 2000 mm×2200 mm, and a size of 2700 mm×3600 mm or more is assumed in the seventh generation. It is difficult to manufacture a display panel with good productivity with low cost only by a conventional patterning method. In other words, when a plurality of times of light-exposure is carried out by consecutive light exposure, a processing time is increased and it is difficult to handle large substrates.

Moreover, in a method in which various kinds of films are formed over an entire surface of a substrate and the films are thereafter etched away leaving a small region thereof, there is a problem that higher material costs are spent and a large amount of liquid waste containing heavy metal or the like is required to be processed.

Further, according to the above reference 2, as a wiring becomes thick, discontinuity of a thin film covering the wiring has become a problem. Further according to the reference, the wiring width is about 50 μm, which is not thin enough for a thin film transistor used for a current high definition display device. As a wiring is miniaturized, signal delay due to wiring resistance has become a problem.

Correspondingly, it is a feature of the invention to provide a liquid crystal display device which can be manufactured improving the material efficiency and simplifying the manufacturing process, and a method for fabricating the liquid crystal display device. Further, the invention provides a means for thinning a wiring by a method different from the above Reference 2, and aims to prevent discontinuity of a thin film covering a wiring, and eliminate signal delay due to wiring resistance.

In view of the above problems, the invention provides a structure in which a conductive film is formed in a hole of an insulating film, and the surfaces of the conductive film and the insulating film are planarized. Accordingly, a conductive film is provided in contact with a side of the insulating film in a structure according to the invention. A hole may signify an area having a depression on the basis of the top surface of the insulating film and a projection on the basis of the bottom surface of the insulating film. Planarity can be obtained by truing up the heights (thicknesses) of the insulating film and the conductive film. Here, some misalignment produced during the formation is acceptable. The planarity is required as the thin film formed to cover the conductive film and the insulating film without disconnection. Consequently, the insulating film and the conductive film have an almost flat surface. Such a structure according to the invention can be expressed as that the conductive film is fitted in the insulating film.

Thus, according to the invention, discontinuity of a thin film formed to cover a conductive film and an insulating film can be avoided. A wiring can be made thin by controlling the width of the hole. Further, a wiring can be made thicker by controlling the depth of the hole.

In a specific method for manufacturing a thin film transistor includes the steps of: forming a first insulating film having a depression and a projection; forming a conductive film in the depression by spurting droplets containing a conductive material; forming a second insulating film so as to cover the first insulating film and the conductive film; and forming a semiconductor film over the second insulating film. Further, the first insulating film and the conductive film are formed so that the surfaces thereof are flat.

In the above steps, the insulating film having the depression and the projection is formed so that the width of the depression is 5 μm to 100 μm, and the depth of the depression is 1 μm to 10 μm.

For example, in the case of a bottom gate thin film transistor, in which a gate electrode is formed below a semiconductor film, the thin film transistor may be formed by forming an insulating film having a depression and a projection; forming a first and a second gate electrodes in the depression by spurting droplets containing a conductive material; forming a gate insulating film so as to cover the insulating film, and the first and the second gate electrodes; forming a first and a second semiconductor films over the gate insulating film; simultaneously patterning the gate insulating film and the first and the second semiconductor films; respectively forming first and second source electrodes and drain electrodes over the first and the second semiconductor films; and connecting the source electrode or the drain electrode which is formed over the first semiconductor film with the second gate electrode. Further, the first insulating film and the gate electrode are formed to be flat.

In the above steps, the insulating film having the depression and the projection formed in a region where the source electrode and the drain electrode are to be formed so that the width of the depression is 5 μm to 20 μm, and the depth of the depression is 1.5 μm to 2.5 μm.

In this invention, the structure of a thin film transistor is not limited to the bottom gate type. In the case of a top gate thin film transistor, in which a gate electrode is formed above a semiconductor film, the thin film transistor is formed by forming a first insulating film having a depression and a projection; forming a source electrode and a drain electrode in the depression by spurting droplets containing a conductive material; forming a second insulating film so as to cover the first insulating film, and the source electrode and the drain electrode; forming a semiconductor film over the second insulating film; and forming a gate electrode over the semiconductor film with a gate insulating film therebetween. Further, the first insulating film and the source electrode and the drain electrode are formed to be flat.

In the above steps, the insulating film having the depression and the projection is formed in a region where the source electrode and the drain electrode are to be formed so that the width of the depression is 10 μm to 40 μm, and the depth of the depression is 1.5 μm to 2.5 μm.

According to the invention, the amount of droplets containing a conductive material to be spurted is 0.1 pl to 40 pl.

A display device typified by a television system, a cellular phone, and other electronic devices can be manufactured with the use of thus formed thin film transistors. The display device also includes a light emitting device and a liquid crystal display device.

A thin film transistor formed according to the invention has a structure including: a conductive film provided so as to be fitted in a first insulating film; a second insulating film provided to cover the first insulating film and the conductive film; and a semiconductor film provided over the second insulating film. Further, the first insulating film and the conductive film have an almost flat surface.

A thin film transistor according to the invention includes: a first insulating film having a depression and a projection; a conductive film provided over the depression; a second insulating film provided to cover the first insulating film and the conductive film; and a semiconductor film provided over the second insulating film. Further, the height of the conductive film and the height of the projection are trued up.

In the above structure, when the width of the depression is 5 μm to 100 μm, the line width of the conductive film is to be 5 μm to 100 μm.

In the case of a bottom gate thin film transistor, the thin film transistor includes: a gate electrode provided so as to be fitted in an insulating film; a gate insulating film provided to cover the insulating film and the gate electrode; and a semiconductor film provided over the gate insulating film. Further, the insulating film and the gate electrode have an almost flat surface.

One feature of the present invention is an insulating film having a depression and a projection; a gate electrode provided over the depression; a gate insulating film provided to cover the insulating film and the gate electrode; and a semiconductor film provided over the gate insulating film. Further, the height of the gate electrode and the height of the projection are trued up.

In the above structure, the width of the depression in a region where the gate electrode is to be formed is 5 μm to 20 μm, and the line width of the gate electrode is to be 5 μm to 20 μm.

In the case of a top gate thin film transistor, the thin film transistor includes: a source electrode and a drain electrode provided so as to be fitted in a first insulating film; a second insulating film provided to cover the insulating film, and the source electrode and the drain electrode; and a semiconductor film provided over the second insulating film. Further, the first insulating film, and the source electrode and the drain electrode have an almost flat surface.

One feature of the invention is a first insulating film having a depression and a projection; a source electrode and a drain electrode provided over the depression; a second insulating film provided to cover the first insulating film, and the source electrode and the drain electrode; and a semiconductor film provided over the second insulating film. Further, the heights of the source electrode and the drain electrode, and the height of the projection are trued up.

In the above structure, when the width of the depression in a region where the source electrode and the drain electrode are to be formed is 10 μm to 40 μm, the source electrode and the drain electrode are to have a line width of 10 μm to 40 μm.

As to such a thin film transistor, the depth of the hole can be 1 μm to 10 μm, 1.5 μm to 2.5 μm, for example. Thus, the conductive film can be formed to be thicker.

Thus, a display device typified by a television system, a cellular phone, and other electronic devices, each of which includes a thin film transistor can be obtained. The display device also includes a light emitting device and a liquid crystal display device.

As a method for selectively forming a pattern, a droplet discharge method (including ink-jet technology) by which droplets (dots) of a composition in which a material of a conductive film or an insulating film is mixed is selectively discharged may be employed. Ink-jet is a kind of droplet discharge method.

In this occasion, the composition is discharged in the form of dots, in the form of a column with a series of dots, or the like. The ways of discharging the composition in the form of dots or a column may be merely referred to as discharging (ejecting). In other words, a plurality of dots may be serially discharged so as to form a line; however, in either case, discharging the composition is collectively expressed as "discharging (ejecting)".

As a conductor, any one of gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), and aluminum (Al); an alloy thereof; dispersed nanoparticles thereof; or silver halide particles may be used. In particular, silver or copper which has low resistance may be used.

In addition, ITO (indium tin oxide), IZO (indium zinc oxide) in which zinc oxide (ZnO) of 2% to 20% is mixed into indium oxide (usually referred to as ITO—SiOx; however, here referred to as ITSO or NITO for the convenience), a conductor in which silicon oxide (SiO$_2$) of 2% to 20% is mixed into indium oxide, organic indium, organotin, or the like can also be used for a transparent conductive film.

It is preferable to coat the surfaces of conductor particles with an organic material or with another conductor in order to disperse the conductor particles efficiently in the composition. The material coating the surfaces may have a layered structure. The material for coating the surfaces may preferably be conductive. Evren if a coating material is insulative, it may be removed by heat treatment or the like. In particular, in the case of using copper, the surface of the copper particle may be coated with a material such as nickel (Ni) or nickel boron (NiB), or the like, thereby preventing copper from spreading in a semiconductor film.

Patterns other than the conductive film formed in the hole of the insulating film may not necessarily be formed by a method by which a pattern can be selectively formed. Meanwhile, all the patterns may be formed by a method by which a pattern can be selectively formed. The good effect of the invention can be utilized when a pattern is formed in a hole of the insulating film in one step of fabricating a thin film transistor.

It is a feature of a display device according to the invention that resin is formed around at least one conductor formed on one of two substrates sandwiching liquid crystal.

Here, a conductor denotes every kind of conductor such as an active element typified by a semiconductor element such as a TFT used for a pixel area or a peripheral circuit area of an active matrix liquid crystal display device; or a gate electrode, gate wiring, a capacitor wiring, a source electrode, a drain electrode, a source wiring, a drain wiring, or a pixel electrode, which is included in a circuit.

Various materials can be selected corresponding to the use, function, area, or the like of the conductor. Typically, silver (Ag), copper (Cu), gold (Au), nickel (Ni), platinum (Pt), chrome (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), antimonial lead, tin oxide antimony, fluorine dope zinc oxide, carbon (C), graphite, glassy carbon, lithium (Li), beryllium (Be), sodium (Na), magnesium (Mg), potassium (k), calcium (Ca), scandium (Sc), manganese (Mn), zirconium (Zr), gallium (Ga), niobium (Nb), sodium-potassium alloy, a magnesium/copper mixture, a magnesium/silver mixture, a magnesium/aluminum mixture, a magnesium/indium mixture, an aluminum/aluminum oxide mixture, a lithium/aluminum mixture, particles of silver halide or dispersible nanoparticles can be used. Further, indium tin oxide (ITO), zinc oxide (ZnO), zinc oxide added with gallium (GZO), or indium zinc oxide (IZO) in which 2% to 20% of zinc oxide is mixed into indium oxide, organic indium can be used for transparent conductive film. Still further, organotin or titanium nitride can be used for the conductor.

Silicon (Si) or silicon oxide (SiOx) may be contained in the foregoing conductive material, especially when used to form the transparent conductive film. For example, a conductive material composed of ITO containing silicon oxide (ITSO) can be used. Further, a desired conductive film may be formed by stacking layers formed from these conductive materials.

Such a conductor includes a semiconductor material such as polysilicon as well as the above metal materials. In the case of a passive liquid crystal display device, an electrode arranged in grid (stripes), a wiring, and the like are given as a conductor.

As the resin, a transparent photosensitive resin such as polyimide, acrylic, or a material which has a skeleton formed with a bond of silicon and oxygen, and which includes at least hydrogen as a substituent, or at least one of fluorine, alkyl group, or aromatic hydrocarbon as a substituent is given as a typical example. Alternatively, a material which can fix the pattern of the conductor can be used without limitation to the above resin. It is desirable to use a material which highly transmits light for the resin in the case of a liquid crystal display device (a transmissive liquid crystal display device or a transflective liquid crystal display device) which is required to transmit light, such as a liquid crystal display including a backlight. However, in the case of a reflective liquid crystal display device, using external light, the material is not necessarily required to transmit light. As the resin, a material which has a function of a color filter may be used. For example, resin materials into which pigments or colorants of red (R), green (G), and blue (B) are mixed can be used.

The above material which has a skeleton formed with a bond of silicon and oxygen, and which includes at least hydrogen as a substituent, or at least one of fluorine, alkyl group, or aromatic hydrocarbon as a substituent is called siloxane, which is a kind of materials for forming a heat resistant planarizing film or a heat resistant interlayer film (HRIL). Hereinafter, a heat resistant planarizing film, a heat resistant interlayer film (HRIL), and a heat resistant resin shall contain siloxane.

In the case of an active matrix liquid crystal display device, two substrates sandwiching liquid crystal denote an element substrate which is provided with an active element such as a TFT and a counter substrate. Meanwhile, two substrates sandwiching liquid crystal denote a substrate provided with an electrode arranged in grid (stripes) and a counter substrate in the case of a passive liquid crystal display device.

In a liquid crystal display device according to the invention, resin is formed around at least one conductor formed on one of two substrates sandwiching liquid crystal. The conductor is formed in contact with a layer containing a 3d transition element or an oxide, a nitride, or an oxynitride thereof. Ti (titanium), Sc (scandium), V (vanadium), Cr (chromium), Mn (manganese), Fe (iron), Co (cobalt), Ni (nickel), Cu (copper), and Zn (zinc) are given as the examples of the 3d transition element.

Further, in a liquid crystal display device according to the invention, liquid crystal is sandwiched between a substrate having an active element and a counter substrate, and a resin is formed around at least one conductor formed on the substrate having an active element. Further, a channel protective film formed of polyimide, acrylic, or siloxane is formed on a semiconductor film which is to be a channel region of the active element.

As in a method for manufacturing a liquid crystal display device according to the invention, an active element is formed by forming a resin for forming a pattern of a gate electrode layer over a substrate; forming the gate electrode layer by discharging a composition including a first conductive material in a hole of the resin; forming a gate insulating film over the gate electrode layer; forming a semiconductor film over the gate insulating film; forming a semiconductor film containing an impurity element over the semiconductor film; and forming a source electrode layer and a drain electrode layer by discharging a composition containing a second conductive material over the semiconductor film containing the impurity element. Further, liquid crystal is sandwiched between a substrate having the active element and a counter substrate.

Here, the gate electrode layer is composed of a gate electrode and a gate wiring (also referred to as a scan line), which may be formed in one layer or may be formed in different layers. Similarly, the source/drain electrode layer is composed of a source/drain electrode and a source/drain wiring (also referred to as a second wiring or a signal line), which may be formed in one layer or may be formed in different layers. A source/drain wiring electrode or a second wiring, and a pixel electrode may be formed in one layer. Further, the source/drain electrode layer may be formed by forming a resin for forming a pattern, and thereafter discharging a composition containing the second conductive material to a hole of the resin.

As to either the gate electrode layer or the source/drain electrode layer, the resin therearound is desirably formed in advance. However, a conductive material and a resin may be applied by a droplet discharge method concurrently or at different timings appropriately. The first and the second conductive materials can each use an appropriate material of the above. The conductive materials may be the same or different. Resin (a first resin and a second resin) to be provided therearound may use the same material or different materials.

Ink-jet is given as a typical droplet discharge method used for applying the above conductive material. Alternatively, off-set printing, screen printing, or the like may be employed corresponding to the properties of the material without limitation to ink-jet.

Before applying a conductive material, a layer containing a 3d transition element or an oxide, a nitride, or an oxynitride thereof may be formed. The layer may be formed either before or after providing the resin around the conductive material as long as before applying the conductive material.

The surfaces of a conductive film and an insulating film are planarized by forming the conductive film in a hole provided in the insulating film. As a result, discontinuity of a thin film formed to cover the conductive film and the insulating film can be avoided. Further, a wiring can be made thin by controlling the width of a hole. Further, a wiring can be made thicker by controlling the depth of the wiring.

When a pattern such as a wiring or a mask is formed by a droplet discharge method, efficiency in the use of material is improved, and reductions in costs and the amount of liquid waste to treat can be achieved. In particular, in the case of forming a pattern by a droplet discharge method, the process can be simplified compared with a photolithography process. Thus, costs such as equipment costs and time of manufacture can be reduced.

In a display device according to the invention, resin is formed around at least one conductor formed on one of two substrates sandwiching liquid crystal. The conductor can be easily formed in a hole of the resin by a droplet discharge method, and the conductive material can be saved. Further, dripping of a composition containing a conductive material, which tends to occur in the case of employing a droplet discharge method, can be prevented. Thus, a preferable pattern of the conductive material can be formed, and short circuit between electrodes and wirings can be prevented. In the case of discharging the conductive material only by a droplet discharge method, it seems difficult to make the film thickness larger; however, a conductor with desirable film thickness can be formed by controlling the thickness of the resin even in the case of employing a droplet discharge method.

Since the conductor is formed in contact with a layer containing a 3d transition element or an oxide, a nitride, or an oxynitride thereof; adhesion between the conductor and a substrate provided with the layer or another thin film can be improved; thus, separation of the conductor can be prevented and a preferable conductive pattern can be formed.

Further, a channel protective film provided in a channel region of a TFT mainly used for an active matrix liquid crystal display device uses a heat resistant resin such as polyimide, acrylic, or siloxane; thus, the channel protective film can be formed easily by a droplet discharge method. Accordingly, it is not necessary to provide a resist mask in patterning in a conventional manner; thus, the process can be simplified. Further, by providing a channel protective film, the channel region can be protected from damage without fault, and accordingly, a stable active element with high mobility can be provided. In addition, it is advantageous to acquire the above advantages when the channel protective film is made to have a layered structure having two or more layers.

When a material in which a pigment or a colorant is mixed into a resin formed around the conductor, and which is made to have a function of a color filter may be used; it is not necessary to separately provide a color film on a TFT element substrate or a counter substrate. Thus, the process can be simplified.

As in a method for manufacturing a liquid crystal display device according to the invention, a resin for forming a pattern of a gate electrode layer is formed over a substrate, and the gate electrode layer is formed by discharging a composition including a first conductive material to a hole of the resin by the droplet discharge method; thus, the material can be saved. Further, dripping of a composition containing a conductive material, which tends to occur in the case of employing a droplet discharge method, can be prevented. Thus, a preferable pattern of the conductive material can be formed, and short circuit between electrodes and wirings can be prevented. In the case of discharging the conductive material only by a droplet discharge method, it seems difficult to make the film thickness larger; however, a conductor with desirable film thickness can be formed by controlling the thickness of the resin even in the case of employing a droplet discharge method. Note that similar effects can be obtained in the case of forming a source/drain electrode, a signal line, a pixel electrode, or the like with the above method.

Before or after forming the resin, a layer containing a 3d transition element or an oxide, a nitride, or an oxynitride thereof is formed. Thus, adhesion between the conductor and a substrate provided with the layer or another thin film can be improved; thus, separation of the conductor can be prevented and a preferable conductive pattern can be formed.

When a material in which a pigment or a colorant is mixed into a resin formed around the conductor, and which is made to have a function of a color filter may be used; it is not necessary to separately provide a color film on a TFT element substrate or a counter substrate. Thus, the process can be simplified.

As described above, the process can be simplified, material costs can be reduced; thus, a liquid crystal display device with high throughput and high yield can be provided. In particular, even when the size of a glass substrate becomes larger in the sixth generation (1500 mm×1800 mm), the seventh generation (2000 mm×2200 mm), or more (2700 mm×3600 mm), a display panel can be manufactured with high productivity and at low costs. Further, the invention is advantageous in view of environmental consideration since it is not necessary to treat a large amount of liquid waste containing heavy metal as a conductive material.

BRIEF DESCRIPTION OF DRAWINGS

FIGS. 1A to 1D show manufacturing steps of a thin film transistor of the invention.

FIGS. 2A and 2B show manufacturing steps of a thin film transistor of the invention.

FIGS. 11A and 11B show manufacturing steps of a display device of the invention.

FIGS. 12A to 12C show manufacturing steps of a display device of the invention.

FIGS. 13A and 13B show manufacturing steps of a thin film transistor of the invention.

FIGS. 14A and 14B show manufacturing steps of a display device of the invention.

FIGS. 33A to 33C show manufacturing steps of a liquid crystal display device according to the invention (driver circuit CMOS).

FIGS. 35A to 35B show manufacturing steps of a liquid crystal display device according to the invention (driver circuit CMOS).

FIGS. 37A to 37C show manufacturing steps of a liquid crystal display device according to the invention (laser doping).

BEST MODE FOR CARRYING OUT THE INVENTION

Figure 3A:
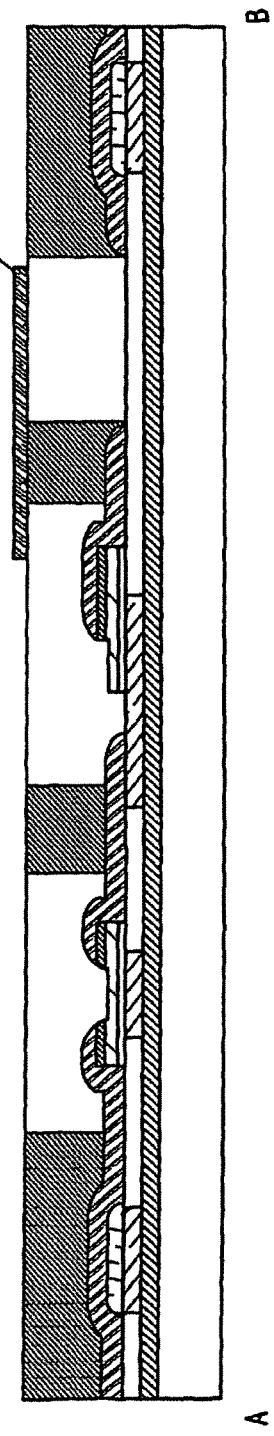
FIGS. 3A and 3B show manufacturing steps of a display device of the invention.

Embodiments of the invention will be described in detail with reference to the drawings. Note that it can be easily understood by those skilled in the art that the invention is not limited to the following descriptions and various changes may be made in forms and details without departing from the spirit and the scope of the invention. Therefore, the invention should not be limited to the descriptions of embodiment modes below. The same reference numerals are commonly given to the same components in the drawings for explaining the embodiment modes, and the description will not be repeated.

A TFT has three terminals, that is, a gate, a source, and a drain; however, a source terminal (source electrode) and a drain terminal (drain electrode) cannot be clearly distinguished because of a transistor structure. Therefore, one of a source electrode and a drain electrode is referred to as a first electrode, and the other is also referred to as a second electrode, when connection between elements is described.

Embodiment Mode 1

In this embodiment mode, an example of a method for forming a thin film transistor.

First, as shown in FIG. 1A, a substrate 100 having an insulating surface is prepared. For example, a glass substrate such as barium borosilicate glass or alumino borosilicate glass; a quartz substrate; a stainless steel substrate, a bulk semiconductor film; or the like can be used for the substrate 100. Further, a substrate formed of a flexible synthetic resin such as acrylic or plastics typified by polyethylene-terephthalate (PET), a polyethylene naphthalate (PEN), and polyethersulfone (PES) generically has low heat-resistant temperature as compared with a substrate formed of another material. However, such a substrate can be used if it can endure a processing temperature of the fabrication process. In particular, in the case of forming a thin film transistor including an amorphous semiconductor film which does not require a heating process for crystallizing a semiconductor film, a substrate made of a synthetic resin can readily be used.

It is preferable that a surface of a substrate is polished in advance by chemical mechanical polishing (CMP) in order to improve the planarity. As the polishing agent (slurry) for CMP, for example, a slurry in which fumed silica particles obtained by thermally decomposing silicon chloride gas are dispersed in a KOH-added aqueous solution can be used.

A base film 101 is formed over the substrate 100. The base film may have a single layer structure or a layered structure. The base film is formed in order, to prevent an alkaline metal such as Na or an alkaline earth metal contained in the substrate 100 from spreading in a semiconductor film and exerting an adverse effect on semiconductor element characteristics. The base film can be therefore formed by using an insulating film such as silicon oxide, silicon nitride, silicon oxynitride, titanium oxide, or titanium nitride, which is capable of suppressing the spread of an alkaline metal or an alkaline earth metal into the semiconductor film. The base film can be formed by using a conductive film of titanium or the like. In this case, the conductive film is oxidized by heat treatment or the like in a manufacturing step. Specifically, a material of the base film may be selected from materials having high adhesion with a gate electrode material. For example, a base film of titanium oxide (TiOx) is preferably formed when Ag is used for the gate electrode. Titanium oxide has both base film function and adhesion improving function. As another material of the base film, a 3d transition element (Sc, Ti, V, Cr, Mn, Fe, Co, Ni, Cu, or Zn), or an oxide, a nitride, or an oxynitride thereof may be used.

A base film is not necessarily provided, as long as it is possible to prevent impurities from diffusing into a semiconductor film. As in this embodiment mode, when a semiconductor film is formed over a gate electrode with a gate insulating film therebetween, a base film is not needed since the gate insulating film can prevent impurities from diffusing into the semiconductor film. It is effective to provide a base film in order to prevent impurities from spreading in the case of using a substrate which contains somewhat alkaline metal or an alkaline earth metal, such as a glass substrate or a plastic substrate. Meanwhile, a base film is not required to be provided necessarily when using a quartz substrate or the like, in which impurity spread does not cause much trouble.

Subsequently, insulating films 102 are formed over the base film. An organic material or an inorganic material can be used for a material of the insulating films. Polyimide, acrylic, polyamide, polyimideamide, benzocyclobutene, siloxane, polysilazane, or a resist material can be used as the organic material. Polysilazane is formed with liquid material containing polymer material having a bond of silicon (Si) and nitrogen (N) as a starting point. As an inorganic material, either silicon oxide or silicon nitride can be used. The insulating films can be formed by plasma CVD, low pressure CVD, a droplet discharge method, spin coating, or dip coating. In the case of using a high viscosity material, a droplet discharge method, spin coating, or dip coating is preferably used.

The insulating films 102 have a portion 20 which can be referred to as a depression on the basis of a top surface of the insulating films (hereinafter referred to as a depression 20) and a portion 21 which can be referred to as a projection on the basis of a bottom surface of the insulating films (hereinafter referred to as a projection 21). After the insulating films are formed, the depression and the projection can be formed by forming a desired mask, and forming a hole (groove) by dry etching or wet etching. Alternatively, the insulating films may be formed in a portion to be the projection 21. The hole is formed to have a width of 5 μm to 100 μm. In particular, in the case of forming a wiring with a width of 5 μm to 50 μm, which is difficult to be formed thinner only by a droplet discharge method, the width of the hole is made to be 5 μm to 50 μm. Then, a wiring material is dropped into the hole by a droplet discharge method, so that a thinner wiring can be formed. Therefore, the invention significantly advantageous as the width of the hole becomes thinner as 5 μm to 50 μm in order to obtain a fine wiring.

Further, the hole is formed to have a height difference between the depression and the projection, that is, a depth of 1 μm to 10 μm. In particular, in the case of making the hole deep, a wiring such as a scan line for inputting a signal from a driver circuit into each semiconductor element or a lead wiring may be formed. As compared with a wiring which is formed only by a droplet discharge method, a wiring with a thickness of 1 μm to 10 μm can be formed when a hole with a depth of 1 μm to 10 μm is formed and forming a wiring in the hole by a droplet discharge method, which can prevent wiring resistance and heat or signal delay due to the wiring resistance.

In this embodiment mode, a hole is formed in a desired region by dry etching and insulating films having a depression and a projection are formed. A hole where a gate electrode is formed to has a width of 5 μm to 20 μm, a hole where a scan line is formed has a width of 10 μm to 40 μm, and a hole where a wiring leading out to an external terminal (not shown) is formed has a width of 20 μm to 100 μm. In this case, the width of the gate electrode is 5 μm to 20 μm. Further, the hole is formed to have a depth of 1.5 μm to 2.5 μm.

In the case of forming such a wiring with a line width of 5 μm to 100 μm, the amount of the droplets is set to 0.1 pl to 40 pl, and the droplets are dropped a plurality of times separately so as to fill the depth of the hole.

As shown in FIG. 1B, conductive films serving as a scan line and a gate electrode (each referred to as a scan line and a gate electrode) are formed in a hole of the insulating films 102.

The conductive film may have either a single layer structure or a layered structure. In the case of employing a layered structure, for example, droplets containing Ag are dropped by a droplet discharge method for a first conductive layer of a lower layer, and Cu may be applied by a droplet discharge method or sputtering for a second conductive layer of an upper layer. Wiring resistance can be reduced, and heat or signal delay due to the wiring resistance can be prevented by using a low resistance material such as Cu.

Figure 49A:
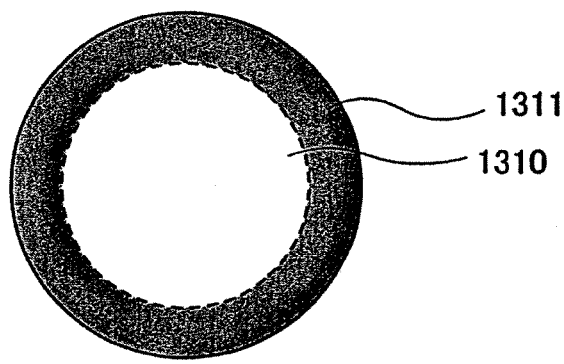
FIGS. 49A and 49B each explain a structure of a conductive particle of the invention.
Figure 49B:
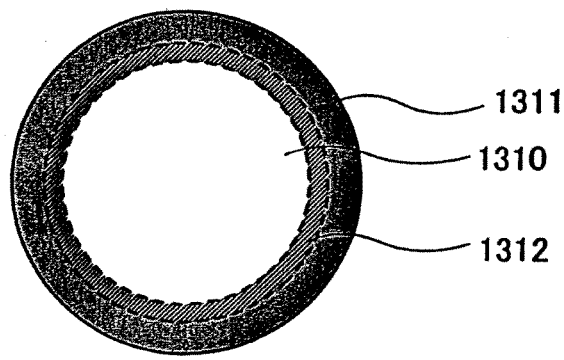

Plating may be used for forming a gate electrode having a layered structure. For example, a second conductive film may be formed by electroplating or electroless plating, around a first conductive film formed by a droplet discharge method. Specifically, Cu may be applied by electroplating, around Ag applied by a droplet discharge method. Alternatively, Cu may be applied by electroless plating in which electric current is unnecessary, around Ag applied by a droplet discharge method. For example, as shown in FIGS. 49A and 49B, a particle in which Cu 1310 is covered with Ag 1311 (FIG. 49A) may have a structure in which a buffer layer 1312 formed of Ni or NiB is formed between the Cu 1310 and the Ag 1311 (FIG. 49B). As a result of forming a low resistance material such as Cu around Ag, wiring resistance may be reduced, and heat or signal delay due to the wiring resistance can be prevented.

In this case, plating may be performed by dipping the substrate in a solution in which metal is dissolved. Further in the case of using a large mother glass substrate, plating may be performed by flowing a solution in which metal is dissolved over the substrate. Thus, an apparatus for the plating is not required to be large.

Specifically, a composition containing Ag is formed by a droplet discharge method. On this occasion, when the line width is relatively thin as several μm to several tens of μm, the composition is required to be discharged repeatedly in the case of forming a thick wiring such as a gate wiring. After Ag is formed, the line width can be made thicker by dipping a substrate where Ag is formed in a plating solution Containing Cu, or by flowing a plating solution directly on the substrate. In particular, a composition after being formed by discharging has many irregularities, so that the composition can be easily plated. In addition, since Ag is expensive, Cu plating leads to cost reduction. Note that a conductive material used for forming a wiring by a method according to this embodiment mode is not limited to the above kind.

After Cu plating, since the surface of the conductive film has many irregularities, it is desirable to smooth the surface by providing a buffer layer of NiB or the like, and to form an insulating film and the like thereafter.

When a layered structure is used as above, in the case of forming a thinner first conductive film, wiring resistance can be reduced with a second conductive film, which is preferable. Further, in the case of forming a highly diffusible conductor, it is preferable to form a barrier film so as to cover Cu thereby preventing diffusion.

In this embodiment mode, droplets containing a conductor in which a material of a scan line and a gate electrode are mixed into a solution are dropped from nozzles 104 by a droplet discharge method, thereby forming a scan line 103*a* and a gate electrode 103*b*. Note that, in this embodiment mode, the sized of the nozzle with respect to a semiconductor film or the like is schematic and may be different from reality. In FIG. 1, a side surface of the scan line and the gate electrode may be tapered. In this case, a side surface of the hole in the insulating films may be formed to be tapered.

Subsequently, droplets in which particles of $Ag_2O$ that is to be a material of the scan line and gate electrode are dispersed in a solvent of tetradecane are dropped. The $Ag_2O$ is an insulator; however, it is reduced to Ag which is a conductor by baking.

The diameter of each of nozzles 104 and the amount of droplets can be set according to the volume of the conductor, that is the volume of the depression of the insulating film, and the characteristics to the droplet material, such as viscosity.

In the case where the solvent in the droplets are required to be removed, heat treatment is carried out for baking or drying, specifically at a predetermined temperature of 200° C. to 300° C. It is preferable to carry out heat treatment in an oxygen containing atmosphere. In this case, the heating temperature is set so as not to generate irregularities on a surface of the gate electrode. In particular, when droplets containing silver (Ag) are used for the droplets as in this embodiment mode, heat treatment is preferably carried out in an atmosphere containing oxygen and nitrogen. For example, the component ratio of oxygen is set to be 10% to 25%. Correspondingly, an organic material such as a thermosetting resin of an adhesive contained in a solvent of the droplets is decomposed; thus, silver (Ag) which does not contain an organic material can be obtained. Consequently, planarity of the gate electrode surface can be improved and specific resistance value can be lowered.

The gate electrode can be made of an element selected from tantalum, tungsten, titanium, molybdenum, aluminum, and copper (Cu), or an alloy material or a compound material mainly containing the elements, other than silver (Ag). The conductive film can be formed by sputtering or plasma CVD instead of a droplet discharge method. A semiconductor film typified by a polycrystalline silicon film doped with an impurity element such as phosphorus or an AgPdCu alloy can be used as the conductive film formed by sputtering or plasma CVD.

Here, the heights of the projections of the insulating films and the conductive film are preferably trued up. In other words, the surfaces of the insulating films and the conductive film are preferably planarized. Therefore, when the height of the conductor is higher than the height of the projections of the insulating films, planarization may be preferably carried out. The surface polishing may be carried out to obtain planarity by CMP. Alternatively, the surface of the conductive film may be etched by etch back for planarization.

Alternatively, the conductive film may be planarized by using a means for spraying gas before heat treatment. For example, an air knife which is usually used for removing impurities of a substrate or the like may be used as the means for spraying gas. Atmospheric air, oxygen, or nitrogen may be used as the gas. Therefore, even minute irregularities on the surface of the conductive film can be planarized. Thereafter, heat treatment is performed.

Further, the conductive film can be planarized by applying pressure before heat treating the conductive film. For example, a heated plate is put on the substrate and is pressed with pressure applying the principle of hot press.

Meanwhile, when the height of the conductive film is lower than the height of the projections of the insulating films due to reduction in the volume of the conductive film by heat treatment, droplets may be dropped again.

The insulating films 102, the scan line 703*a*, and the gate electrode 103*b* can be formed by a droplet discharge method. The detailed manufacturing process by a droplet discharge method is shown in the embodiment mode below.

As shown in FIG. 1C, an insulating film which serves as a gate insulating film 106 covering the gate electrode is formed.

The gate insulating film may have a layered structure or a single layer structure. The gate insulating film can use an insulator of an inorganic material such as silicon oxide, silicon nitride, or silicon oxynitride; or an insulator of an organic material such as polysilazane or polyvinyl alcohol.

As in this embodiment mode, when the gate electrode is made of silver (Ag), it is preferable that a silicon nitride film is used for the insulating film in contact with Ag as the gate insulating film. This is because there is a risk that a surface of the gate electrode becomes rough since silver oxide is formed by a reaction with silver (Ag), in the case of using an insulating film containing oxygen.

The gate insulating film can be formed by plasma-CVD, low pressure CVD, a droplet discharge method, spin coating, or dip coating. In the case of using a high viscosity material, a droplet discharge method, spin coating, or dip coating is preferably used.

Here, the surface of the insulating films 102 and the surfaces of the scan line 103a and the gate electrode 103b are trued up by planarization; thus, the gate insulating film can be formed without discontinuity. Particularly in the case of forming the gate insulating film by spin coating or dip coating, this embodiment mode is preferable since the surfaces are planarized.

As shown in FIG. 1D, a semiconductor film 108 is formed over the gate insulating film. The semiconductor film can be formed by plasma CVD, sputtering, a droplet discharge method, or the like. The thickness of the semiconductor film may preferably be 25 nm to 200 nm (preferably, 30 nm to 60 nm). Silicon germanium instead of silicon can be used for the material of the semiconductor film. In the case of using silicon germanium, the concentration of germanium shall be about 0.01 atomic % to 4.5 atomic %.

The semiconductor film may have an amorphous semiconductor, a semiamorphous semiconductor (SAS) in which amorphous state and crystalline state are mixed, a microcrystalline semiconductor in which crystal grains of 0.5 nm to 20 nm can be seen in an amorphous semiconductor, an organic semiconductor, or a crystalline semiconductor. A state of a micro crystalline state in which crystal grains of 0.5 nm to 20 nm can be seen is referred to as a microcrystal (μc).

SAS has a structure between an amorphous structure and a crystalline structure (including a single crystalline structure, and a polycrystalline structure), the semiamorphous semiconductor has a third state that is stable with respect to free energy, and includes a crystalline region having short range order and lattice distortion. Crystal grains of 0.5 nm to 20.0 nm in size are contained in at least a part of a semiamorphous semiconductor film, and in the Raman spectrum, the peak specific to silicon shifts to the lower side of a wave number of 520 $cm^{-1}$, and a diffraction peak of (111) and (220) derived from a silicon crystal lattice is observed in x-ray diffraction. Further, the semiamorphous semiconductor film contains hydrogen or halogen of at least 1 atom % as a terminator for a dangling bond.

SAS can be obtained by glow discharge decomposition of a silicide gas. As a typical silicide gas, $SiH_4$ is cited, besides, $Si_2H_6$, $SiH_2Cl_2$, $SiHCl_3$, $SiCl_4$, $SiF_4$ and the like can be used. SAS can be formed easily by a silicide gas diluted with hydrogen, or hydrogen and one or more rare gas elements selected from helium, argon, krypton, and neon. The silicide gas is preferably diluted so that the dilution rate is in the range of 10 times to 1000 times. SAS can be also formed with $Si_2H_6$ and $GeF_4$ by a method of diluting them with a helium gas. The reactive formation of a film by grow discharge decomposition is preferably conducted under low pressure, and the pressure may be about 0.1 Pa to 133 Pa. The power for grow discharge may be 1 MHz to 120 MHz, preferably, a high frequency power of 13 MHz to 60 MHz. The substrate heating temperature is preferably 300° C. or less, and more preferably, substrate heating temperature of 100° C. to 250° C. is recommended.

A crystalline semiconductor film can be formed by crystallizing an amorphous semiconductor film by heating or laser light irradiation. Alternatively, a crystalline semiconductor film itself may be formed. In this case, a crystalline semiconductor film itself can be formed with the use of heat or plasma using a fluorine-based gas such as $GeF_4$ or $F_2$, and silane-based gas such as $SiH_4$ or $Si_2H_6$.

In this embodiment mode, an amorphous semiconductor film containing silicon as a main component (an amorphous silicon film) is formed for the semiconductor film 108 by plasma CVD.

Next, a semiconductor film having one conductivity type is formed. It is preferable to provide the semiconductor film having one conductivity type since the contact resistance between the semiconductor film and the electrode is reduced, and the semiconductor film may be formed as necessarily. The semiconductor film having one conductivity type may be formed by plasma CVD, sputtering, a droplet discharge method, or the like. In this embodiment mode, an n-type semiconductor film 107 which has n-type conductivity is formed by plasma CVD.

In the case of forming the semiconductor film 108 and the n-type semiconductor film 107 by plasma CVD as above, a semiconductor film, the n-type semiconductor film, and the gate insulating film can be formed consecutively. Specifically, the films can be formed consecutively without being exposed to the atmosphere by changing the supply of the material gas into a treatment chamber in a plasma CVD system. Consequently, each surface of the semiconductor film, the n-type semiconductor film, and the gate insulating film can be protected from impurities.

Subsequently, although not shown, the semiconductor film 108, the n-type semiconductor film 107, and the gate insulating film 106 are patterned to the desired shape with the use of a mask. A mask is formed in a desired place, and patterning is carried out by dry etching or wet etching using the mask. The mask can be formed by a droplet discharge method or photolithography. It is preferable to form the mask by a droplet discharge method in order to improve efficiency in the use of material and to reduce costs and the amount of liquid waste. Further, in the case of forming the mask by a droplet discharge method, photolithography process can be simplified. For example, steps of the formation of a photomask and exposure are redundant, and reduction in costs of equipment and time of manufacture can be achieved.

As the mask material, an inorganic material (such as silicon oxide, silicon nitride, or silicon oxynitride), a photosensitive or non-photosensitive organic material (such as polyimide, acrylic, polyamide, polyimideamide, polyvinyl alcohol, benzocyclobutene, or a resist material) can be used. For example, in the case of forming the mask by a droplet discharge method using polyimide; preferably, polyimide may be applied to the desired portions by a droplet discharge method and may be thereafter heat treated at 150° C. to 300° C. for baking.

After patterning, plasma treatment is carried out in order to remove the mask. Note that the mask may not necessarily be removed, so that the mask may serve as an insulating film.

Ends of the semiconductor film 108, the n-type semiconductor film 107, and the gate insulating film 106 are aligned with each other by being patterned simultaneously as above.

In other words, each end of the semiconductor film 108, the n-type semiconductor film 107, and the gate insulating film 106 is provided so as not to protrude from the others.

As shown in FIG. 2A, conductive films serving as a signal line and a power line 109a, and a source electrode and a drain electrode 109b are formed. The signal line and the power line 109a, and the source and drain electrode 109b are each formed to have a line width of 5 μm to 100 μm. The conductive film may have either a single layer structure or a layered structure. The description on the gate electrode may be consulted about the layered structure.

A film containing an element of gold, silver, copper, aluminum, titanium, molybdenum, tungsten, or silicon, or an alloy film containing the elements above can be used for the conductive film. The conductive film may be formed by a droplet discharge method.

The conductive film can be made from an element selected from tantalum, tungsten, titanium, molybdenum, aluminum, and copper (Cu), or an alloy material or a compound material mainly containing the elements, other than silver (Ag). The conductive film can be formed by sputtering or plasma CVD instead of a droplet discharge method. A semiconductor film typified by a polycrystalline silicon film doped with an impurity element such as phosphorus, or an AgPdCu alloy can be used as the conductive film formed by sputtering or plasma CVD.

In this embodiment mode, the conductive film is formed by a droplet discharge method using droplets containing silver (Ag). Specifically, a signal line, a power line, a source electrode and a drain electrode may be formed of the material from the nozzles 104 as the gate electrode shown in FIG. 1B. Here, the source electrode and the drain electrode are formed to have a line width of 10 μm to 40 μm; the signal line or the power line is formed to have a line width of 5 μm to 40 μm; and a wiring for leading out to an external terminal is formed to have a line width of 5 μm to 100 μm. In the case of thus forming a wiring with a line width of 5 μm to 100 μm by a droplet discharge method, the amount of the droplets shall be 0.1 pl to 40 pl. The amount of the droplets can be controlled by a control signal (for example, pulse voltage application) sent to the nozzle. For example, in the case of the line width of 5 μm, the amount of the droplets from the nozzles 104 may be adjusted to 0.1 pl. Note that the wiring width can be controlled even by controlling the contact angle of the droplets and the surface to be provided with the wiring.

In this embodiment mode, even in the case of forming a signal line, a power line, a source electrode and a drain electrode; a hole may be formed in an insulating film, and a signal line, a power line, a source electrode and a drain electrode may be formed in the hole as with the gate electrode and the like.

Here, a scan line 103a is formed under the signal line and the power line 109a; short circuit would occur in directly forming the signal line and the power line 109a. Therefore, an insulating film 112 is formed at the intersection of the signal line and the power line 109a, and the scan line in order to prevent short circuit. The insulating film can be formed in a similar manner to the above insulating films 102. In this embodiment mode, the insulating film is formed by dropping polyimide by a droplet discharge method.

If the solvent in the droplets is required to be removed, heat treatment is carried out for baking or drying.

Further, liquid-repellent treatment may be carried out to improve the liquid repellency of the surface where the signal line, the power line, and the source electrode and the drain electrode. For example, a fluorine-based silane coupling agent or the like may be applied for the liquid-repellent treatment. As another example, plasma treatment using mixture of $CHF_3$ and $O_2$, or the like may be performed.

Subsequently, an n-type semiconductor film 107 which has n-type conductivity is etched by using the source electrode and the drain electrode as masks. That prevents the n-type conductor film from shorting with the source electrode and the drain electrode. On this occasion, the semiconductor film 108 would be etched in a measure.

As above, thin film transistors 110 and 111, in each of which up to a source electrode and a drain electrode have been provided are completed. Here, in the thin film transistors 110 and 111, the source or drain electrode 109b of the thin film transistor 110 and the gate electrode of the thin film transistor 111 are directly connected without using a connection wiring.

A thin film transistor according to this embodiment mode is what is called a bottom gate thin film transistor whose gate electrode is provided below a semiconductor film. Specifically, the thin film transistor is called a channel etch type in which a semiconductor film is etched in a measure.

Thus, a conductive film and the like are formed by a droplet discharge method in a hole of an insulating film so as to obtain planarity. As a result, discontinuity of a thin film formed to cover the conductive film and the insulating film can be avoided. Further, a wiring can be made thinner by controlling the width of a hole. Further, a wiring can be made thicker by controlling the depth of the wiring.

As to a thin film transistor shown in this embodiment mode, at least a conductive film or masks other than the conductive film are formed by a droplet discharge method. Accordingly, as long as a droplet discharge method is employed in a step for forming a conductive film or masks other than the conductive film, other conductive films may be formed by a method other than a droplet discharge method. When a droplet discharge method is employed for one step, efficiency in the use of material is improved and reductions in costs and the amount of liquid waste to be processed may be achieved. Especially, when a mask is formed by a droplet discharge method, the process can be simplified in comparison with photolithography. Consequently, costs such as equipment costs, and time of manufacture can be reduced.

Embodiment Mode 2

In this embodiment, the case where the above thin film transistor is used for a pixel area of a display device, a light emitting device, for example will be described.

The thin film transistor 110 functions as a switch, and the thin film transistor functions as a driver for controlling the luminance intensity of an electroluminescent layer. The source electrode or the drain electrode of the thin film transistor functioning as a switch (a switching TFT) is connected with the gate electrode of the thin film transistor functioning as a driver (a driving TFT).

The thin film transistors according to this embodiment mode are channel etch type. A substrate mounted with a plurality of such thin film transistors is referred to as a TFT substrate.

As shown in FIG. 2B, an insulating film serving as an interlayer insulating film 113, an auxiliary wiring, and a conductive film 114 serving as a connection wiring are formed. The conductive film serving as an auxiliary wiring is formed over the signal line, the power line, and the source electrode or the drain electrode. As a result, the wiring resistance may be reduced, and heating or signal delay due to the wiring resistance can be prevented. In particular, as the signal line, the power line, and the source electrode or the drain electrode are made thinner, problems of wiring resistance and the like become significant. Therefore, the auxiliary wiring is preferably provided. The connection wiring establishes a connection between the source electrode or the drain electrode of the thin film transistor 111, and a pixel electrode. Especially, discontinuity of the pixel electrode can be prevented since the surface is planarized by the interlayer insulating film 113. Consequently, uniform voltage can be applied to the electroluminescent layer.

The interlayer insulating film 113 can be formed from a similar material to the insulating films 102. The conductive film 114 can be formed from a similar material to the scan line and the gate electrode. Further, the interlayer insulating film 113 and the conductive film 114 may be formed in a similar manner to the scan line and the gate electrode. For example, after forming the interlayer insulating film, a desired mask is formed, and a hole (groove) is formed by dry etching or wet etching; thus, the conductive film can be formed in the hole of the conductive film 114.

The interlayer insulating film 113 and the conductive film 114 may be formed by a droplet discharge method. For example, the conductive film 114 is formed in a columnar shape, and the interlayer insulating film 113 can be formed thereafter by a droplet discharge method. Alternatively, the interlayer insulating film can be formed by spin coating or the like. Subsequent steps in the case of employing a droplet discharge method will be shown in the embodiment mode below in details.

As shown in FIG. 3A, a pixel electrode 115 is formed so as to connect to the source electrode or the drain electrode of the thin film transistor 111.

The pixel electrode is formed from a light-transmitting or non light-transmitting material. For example, in the case of using a light-transmitting material, ITO or the like can be used, and a metal film can be used in the case of using a non light-transmitting material. ITO (indium tin oxide), IZO (indium zinc oxide) in which zinc oxide (ZnO) of 2% to 20% is mixed into indium oxide, ITSO in which silicon oxide ($SiO_2$) of 2% to 20% is mixed into indium oxide, organic indium, organotin, or the like can be used as the light-transmitting material. An element selected from tantalum, tungsten, titanium, molybdenum, aluminum, and copper, or an alloy material or a compound material mainly containing the elements, other than silver (Ag) can be used as the non-light transmitting material. In this embodiment mode, the pixel electrode is formed from ITSO.

The pixel electrode can be formed by sputtering or a droplet discharge method. In the case of using sputtering, the pixel electrode can be formed selectively using a metal mask. Meanwhile, in the case of a droplet discharge method, the pixel electrode can be formed selectively by setting an area for making a pattern. Accordingly, a metal mask is not necessary.

A TFT substrate mounted with up to the thus formed pixel electrode is referred to as a Module TFT substrate.

In this embodiment mode, the structure in which the pixel electrode 115 is formed on the interlayer insulating film 113 is described. However, another structure may be used. For example, a structure without an interlayer insulating film may be used. Specifically, after the thin film transistors 110 and 111 are formed, the pixel electrode may be formed on the source electrode or the drain electrode of the thin film transistor 111. Alternatively, the thin film transistors 110 and 111 may be formed after the pixel electrode is formed on the insulating films 102. Such a structure in which an interlayer insulating film is not formed can provide a thinner semiconductor element. Further, the faulty process and malfunction due to the interlayer insulating film can be reduced.

Figure 3B:
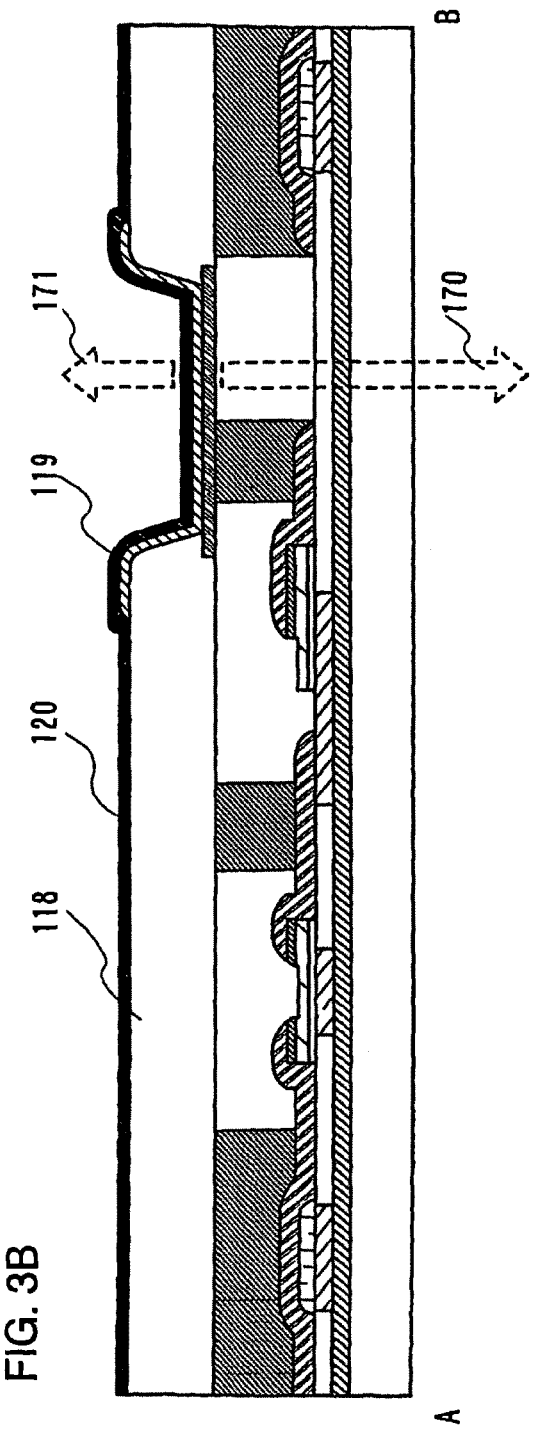
Figure 4:
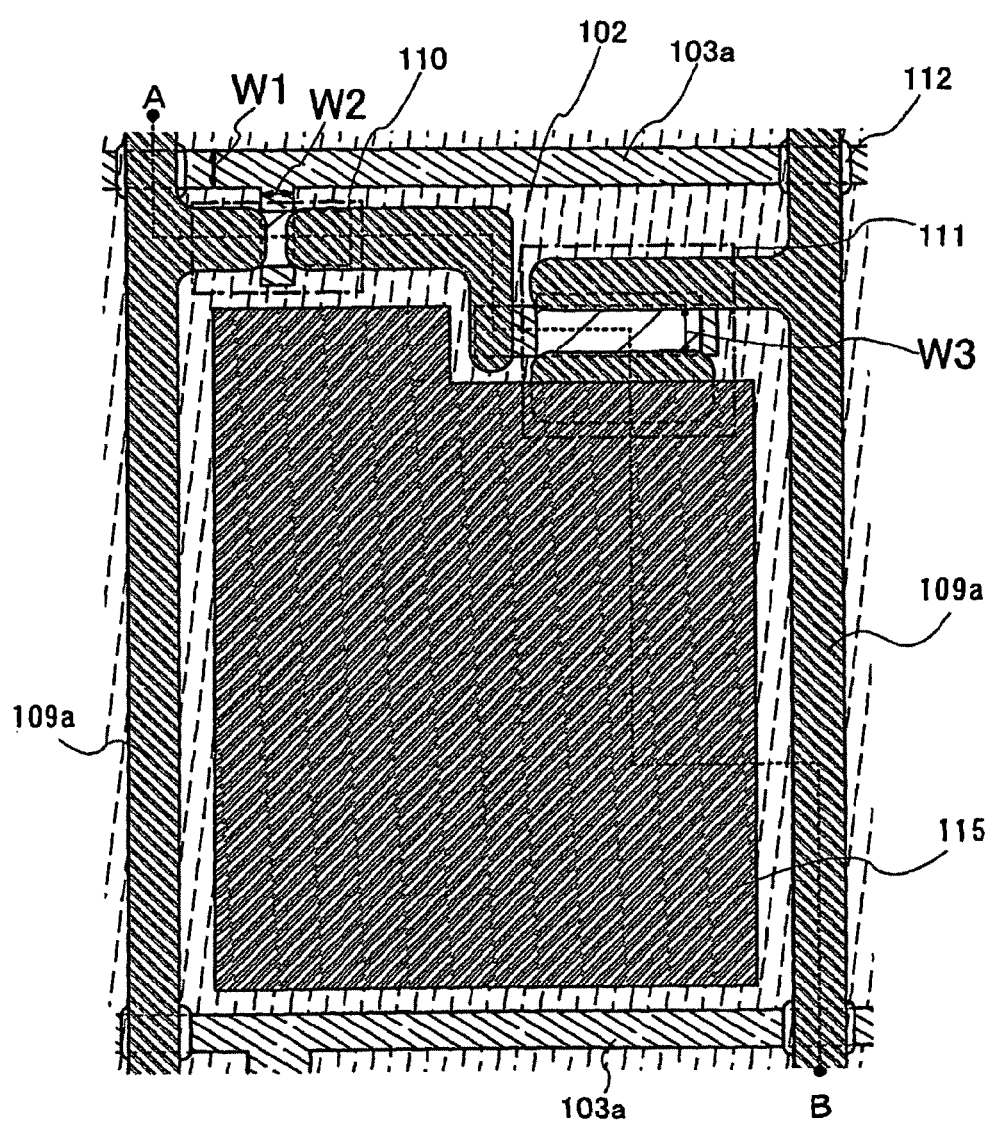
FIG. 4 is a top view of a thin film transistor of the invention.

FIG. 4 shows a top view of a structure in which up to the pixel electrode is formed. A cross-sectional view in FIGS. 1 to 3 corresponds to the cross section of A-B in FIG. 4. A scan line 103a and a gate electrode are formed in a layer where the insulating films 102 are provided. The scan line 103a is preferably formed to have a line width W1 larger than the line width W2 of the gate electrode of the switching TFT. When the line width of the gate electrode W2 of the gate electrode is 5 μm to 20 μm, the line width W1 of the scan line is twice the W2 about 10 μm to 40 μm. Therefore, it is preferable to change the diameter of a nozzle or the pulse waveform. Further, in the case of using one nozzle with a certain pulse waveform, application may be performed a plurality of times, thereby making the line width W1 of the scan line larger.

A semiconductor film and the like are provided with a gate insulating film in between. An insulating film 112 is provided at the intersection of the scan line, the signal line, and the power line 109a. The source electrode and the drain electrode, and the signal line and the power line are provided in the same layer. The source electrode and the drain electrode are provided so as to cover the semiconductor film. Ends of the source electrode and the drain electrode are provided so as to be overlapped with an end of the gate electrode. Thus, the thin film transistors 110 and 111, that is, the switching TFT 110 and the driving TFT 111, each of which has the gate electrode, the semiconductor film, and the source electrode and the drain electrode are completed. The pixel electrode 115 is provided so as to connect to the source electrode of the thin film transistor 111. Thus, light is emitted from the electroluminescent layer provided on the pixel electrode.

In this embodiment mode, the driving TFT is preferably designed to have a larger channel width (W3), since the driving TFT has an amorphous semiconductor film.

In such a pixel structure, a video signal is input from the signal line, and current is supplied to the electroluminescent layer through the thin film transistors 110 and 111. The electroluminescent layer emits light with luminance in accordance with the current.

In FIG. 4, a capacitor for storing the video signal is not provided; however, gate capacitance of the thin film transistor can be used instead. In particular, the thin film transistor is formed with an amorphous semiconductor; thus, gate capacitance of the thin film transistor can serve as a capacitor.

Since the driving TFT is a current drive element, variations in characteristics, especially the characteristics of Vth, of the TFTs in a pixel is less, analog driving may be carried out. In this embodiment mode, the variations in the characteristics of the TFT having an amorphous semiconductor film is less; therefore, it is preferable to employ analog driving. Even in the case of digital driving, current with stable value can be supplied to the light emitting element when the driving TFT is operated in a saturation region (where |Vgs−Vth|<|Vds| is satisfied).

As shown in FIG. 3B, an insulating film 118 serving as a partition or a bank is formed so as to cover an end of the pixel electrode 115. An inorganic material (such as silicon oxide, silicon nitride, or silicon oxynitride), a photosensitive or non-photosensitive organic material (such as polyimide, acrylic, polyamide, polyimide amide, benzocyclobutene, or a resist material), siloxane, polysilazane, or a layered structure thereof can be used for the insulating film 118. As the organic material, positive photosensitive organic resin or negative photosensitive organic resin can be used. For example, in the case of using positive photosensitive acrylic as the organic material, a hole with a curvature in the upper end portion is formed by etching the photosensitive organic resin by light exposure. This can avoid discontinuity of an electroluminescent layer to be formed later or the like.

It is preferable to perform heat treatment under atmospheric pressure or reduced pressure after forming the insulating film 118. The heat treatment may be performed at a temperature of 100° C. to 450° C., preferably, 250° C. to 350° C. Accordingly, moisture absorbed inside or on the surface of the insulating film 118 can be removed.

In the case of using ITSO for the pixel electrode, it is preferable that the pixel electrode 115 be formed after a silicon nitride film (not shown) is formed on the interlayer insulating film. Here, ITSO is applied so as to be in contact with the silicon nitride film. The amount of light which is emitted from the electroluminescent layer is increased by using ITSO and a silicon nitride film.

An electroluminescent layer 119 is formed in the hole of the insulating film 118. After the heat treatment for the insulating film 118, it is preferable to form the electroluminescent layer by vacuum deposition or by a droplet discharge method. The steps of heat treatment of the insulating film to the formation of the electroluminescent layer are preferably carried out without exposure to the atmosphere. Further, it is preferable to perform the steps under reduced pressure. Particularly in the case of forming the electroluminescent layer by a droplet discharge method, before forming the electroluminescent layer, the insulating film 118, particularly the hole of the insulating film may be treated with plasma. As a result of the plasma treatment, liquid repellency or lyophilicity can be controlled; thus, the electroluminescent layer can be formed first in the hole of the insulating film by selecting the solvent.

An organic material (including a low molecular weight material and a high molecular weight material), or a composite material of an organic material and an inorganic material may be used as materials of the electroluminescent layer. The electroluminescent layer can be formed by ink-jet, coating, or deposition. A high molecular weight material may preferably be applied by ink jet or coating. A low molecular weight material may preferably be applied by deposition, especially vacuum deposition. In this embodiment mode, a low molecular weight material is used forming the electroluminescent layer by vacuum deposition.

A singlet excited state and a triplet excited state may be used for a kind of the molecular exciton formed in an electroluminescent layer. A ground state is generally a singlet excited state, and light emission from a singlet excited state is referred to as fluorescence. Light emission from a triplet excited state is referred to as phosphorescence. Light-emission from an electroluminescent layer includes light emission by the both excited states. Further, fluorescence and phosphorescence may be combined, and either of them can be selected depending on luminescence property (such as light emitting luminance or the lifetime) of respective RGB.

Generally, the electroluminescent layer is formed by laminating HIL (hole injecting layer), HTL (hole transporting layer), EML (light emitting layer), ETL (electron transporting layer), EIL (electron injecting layer) sequentially from the side of the pixel electrode 115. Note that the electroluminescent layer can employ a single layer structure or a combined structure other than a laminated structure.

Specifically, CuPc or PEDOT for HIL, α-NPD for HTL, BCP or $Alq_3$ for ETL and BCP: Li or $CaF_2$ for EIL are used respectively. $Alq_3$ doped with a dopant corresponding to each light emission of RGB (DCM or the like for R, DMQD or the like for G) may be used for EML, for example.

Note that the electroluminescent layer is not limited to the above material. For example, hole injection characteristics can be enhanced by co-evaporating oxide such as molybdenum oxide (MoOx: x=2 to 3) and α-NPD or rubrene instead of using CuPc or PEDOT. Alternatively, benzoxazoles (BzOs) may be used for the electron injection layer.

In this embodiment mode, materials for light emission of red (R) green (G) and blue (B) are each selectively formed by vapor deposition using a vapor-deposition mask or the like for the electroluminescent layer 119. In the case of performing ink-jet, the materials emitting light of red (R) green (G) and blue (B) can be applied without using a mask.

In the case of forming the electroluminescent layer of each RGB, high-definition display can be performed by using a color filter. This is because broad peak can be corrected to be sharp in light emitting spectrum of each RGB by the color filter.

The case of forming the electroluminescent layer of each RGB is described above; however, an electroluminescent layer of monochrome light emission may be formed. In this case, a color filter or a color conversion layer is combined to display with full color. For example, when an electroluminescent layer for light emission of white or orange is formed, a color filter, or a color filter combined with a color conversion layer may be provided to obtain a full color display. A color filter or a color conversion layer may be formed on a second substrate (sealing substrate), for example, and attached to a substrate. Both color filter and color conversion layer can be formed by ink-jet.

A display of monochrome light emission may be performed by forming an EL layer of monochrome light emission. For example, an area color display device may be formed by using monochrome light emission. A passive matrix structure is suitable for the area color type, which can mainly display characters and symbols.

As shown in FIG. 3B, a second electrode 120 of the light emitting element is formed thereafter so as to cover the electroluminescent layer 119 and the insulating film 118.

It is necessary to select materials of the pixel electrode (also referred to as a first electrode) 115 and the second electrode 120 in consideration of the work function. The first electrode and the second electrode can be an anode or a cathode depending on a pixel structure. It is preferable that the first electrode is a cathode and the second electrode is an anode in this embodiment mode, since the polarity of the thin film transistor 111 is n-channel type. On the contrary, it is preferable that the first electrode is an anode and the second electrode is a cathode when the polarity of the thin film transistor 111 is p-channel type.

Hereinafter, electrode materials used for the anode and the cathode will be described.

It is preferable to use a metal, an alloy, a conductive compound, a mixture thereof, or the like having a high work function (work function: 4.0 eV or more) as an electrode material used for the anode. ITO, IZO (indium zinc oxide) in which zinc oxide (ZnO) of 2% to 20% is mixed into indium oxide, ITSO, gold, platinum, nickel, tungsten, chromium, molybdenum, iron, cobalt, copper, palladium, or a nitride of a metal material (such as titanium nitride) can be cited as a specific material.

Meanwhile, it is preferable to use a metal, an alloy, a conductive compound, a mixture thereof, or the like having a low work function (work function: 3.8 eV or less) as an electrode material used for the cathode. An element belonging to Group 1 or 2 in the periodic table, that is, an alkaline metal such as lithium or cesium; magnesium, calcium, or strontium, an alloy (Mg:Ag or Al:Li) or a compound (LiF, CsF, or $CaF_2$) including them, or a transition metal including a rare-earth metal can be cited as the specific material.

The cathode can be formed by extremely thinly forming such a metal or an alloy including such a metal and by laminating ITO, IZO, ITSO, or a transparent conductive film (including an alloy) thereover, in the case where the cathode is required to transmit light in this embodiment mode.

The direction of light emitted from the electroluminescent layer can be selected by using a light transmitting or a non-light transmitting anode material or cathode material for the first electrode or the second electrode. For example, in the case of forming the first electrode and the second electrode with a light transmitting material, dual emission display in which light from the electroluminescent layer is emitted to the side of the substrate 170 and to the side of the sealing substrate 171 can be performed. On this occasion, light can be efficiently utilized by using a highly reflective conductive film for the non-light transmitting electrode provided on a side which is not a light emitting direction.

The first electrode and the second electrode can be formed by vapor deposition, sputtering, a droplet discharge method, or the like.

In the case of forming the second electrode with ITO or ITSO, or a stack thereof by sputtering, the electroluminescent layer may be damaged due to sputtering. In order to reduce damages due to the sputtering, an oxide such as molybdenum oxide (MoOx: x=2 to 3) is preferably formed on the top surface of the electroluminescent layer. Therefore, oxide such as molybdenum oxide (MoOx: x=2 to 3) or titanium oxide (TiOx) which functions as HIL or the like is formed on the top surface of the electroluminescent layer. An EIL (electron injecting layer), an ETL (electron transporting layer), an EML (light emitting layer), an HTL (hole transporting layer), an HIL (hole injecting layer), and the second electrode may preferably be laminated in this order from the side of the first electrode. In other words, an electroluminescent layer including both organic material and inorganic material may be formed.

Since the conductivity type of the thin film transistor 111 is an n-channel type in this embodiment mode, it is preferable to employ a structure of the first electrode that is a cathode, EIL (electron injecting layer), ETL (electron transporting layer), EML (light emitting layer), HTL (hole transporting layer), HIL (hole injecting layer), and the second electrode that is an anode in consideration of a moving direction of an electron.

In this embodiment mode, high planarity is achieved due to the interlayer insulating film, and preferably, uniform voltage can be applied to the electroluminescent layer.

Thereafter, an insulating film containing nitrogen, a carbon film containing nitrogen (CNx), a DLC film, or the like may be formed by sputtering or CVD as a protective film over the second electrode. In particular, when NITO is used for the second electrode, a silicon nitride film may preferably be formed and used as a protective film. Further, a protective film formed of an organic material such as styrene polymer may be formed over the film containing the above inorganic material. Thus, oxygen and moisture can be prevented from entering.

Thus, a conductive film and the like are formed by a droplet discharge method in a hole of an insulating film so as to obtain planarity. As a result, discontinuity of a thin film formed to cover the conductive film and the insulating film can be avoided. Further, a wiring can be made thinner by controlling the width of a hole. Further, a wiring can be made thicker by controlling the depth of the wiring.

As to a thin film transistor of the pixel area of the display device shown in this embodiment mode, at least a conductive film or masks other than the conductive film are formed by a droplet discharge method. Accordingly, as long as a droplet discharge method is employed in a step for forming a conductive film or masks other than the conductive film, other conductive films or masks may be formed by a method other than a droplet discharge method. When a droplet discharge method is employed for one step, efficiency in the use of material is improved and reductions in costs and the amount of liquid waste to be processed may be achieved. Especially, when a mask is formed by a droplet discharge method, the process can be simplified in comparison with photolithography. Consequently, costs such as equipment costs, and time of manufacture can be reduced.

Embodiment Mode 3

In this embodiment mode, an example of forming a thin film transistor by a method different from the above embodiment mode will be described. Specifically, an insulating film is formed on a semiconductor region to be a channel region here. The other structure of a thin film transistor is similar to the above embodiment mode; accordingly, the description will be omitted.

Figure 10:
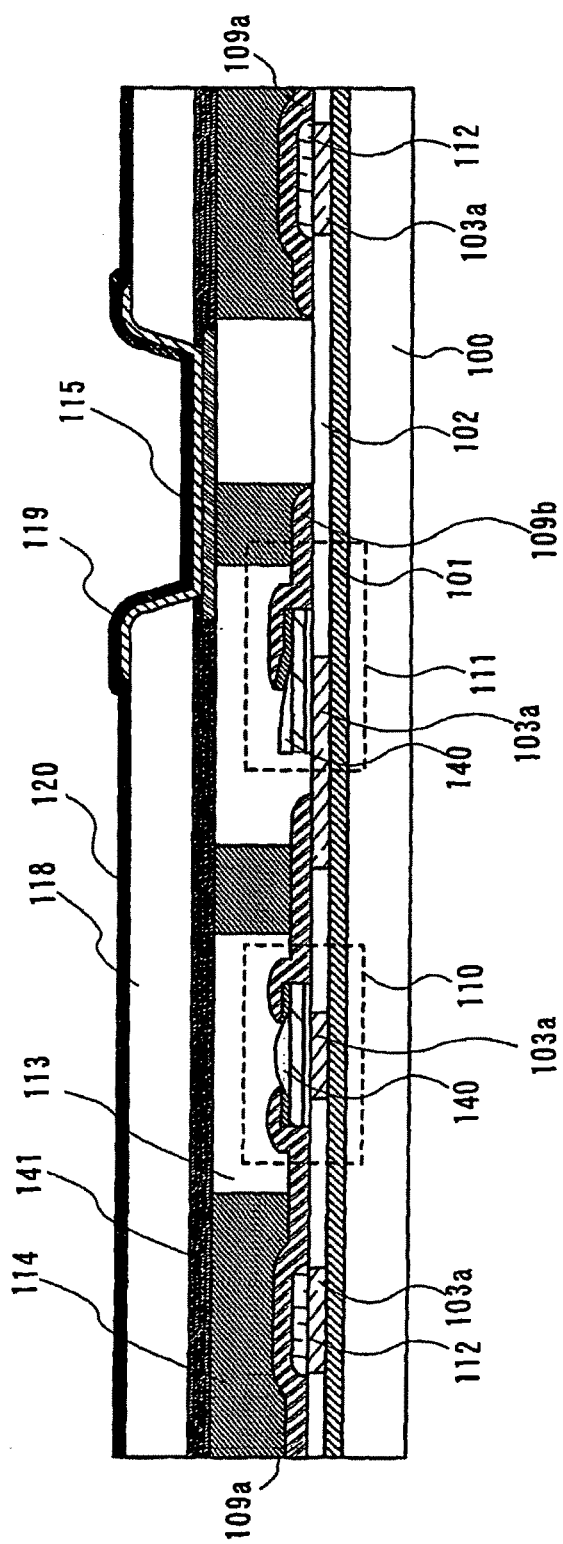
FIG. 10 shows a manufacturing step of a display device of the invention.

As shown in FIG. 10, as in the above embodiment mode, a base film 101 is formed; insulating films 102, a scan line 103a, and a gate electrode are formed over a substrate 100; and a gate insulating film is formed so as to cover the insulating film, the scan line, and the gate electrode. Thereafter, a semiconductor film is formed on the gate insulating film. On this occasion, the surfaces of the insulating films 102, the scan line 103a, and the gate electrode 103b are trued up and planarized; thus, the gate insulating film can be formed without discontinuity.

Subsequently, an insulating film 140 serving as a protective film is formed on the semiconductor film to be a channel region. The insulating film 140 can use an insulating film of silicon oxide, silicon nitride, silicon nitride oxide, or the like. The insulating film 140 can be formed by a droplet discharge method, plasma CVD, sputtering, or the like. In the case of forming the insulating film over the entire surface by plasma CVD, or the like the insulating film is patterned to the desired shape by photolithography. For example, a mask material such as a resist is applied; the mask is formed to the desired shape by light exposure from back side using the gate electrode as a mask; and the insulating film can be patterned with the use of the mask in the photolithography process. Thus, in the case where the insulating film 140 is formed by plasma CVD, the semiconductor film, the insulating film serving as a protective film, and besides, the gate insulating film can be formed consecutively.

It is preferable to from the insulating film 140 by a droplet discharge method since efficiency in the use of material is improved, and reductions in costs and the amount of liquid waste to treat can be achieved. Further, in the case of forming the insulating film by a droplet discharge method, a photolithography process can be skipped. Thus, since a photo mask is unnecessary, costs such as equipment costs can be reduced. Further, time of manufacture can be reduced since the photolithography steps can be skipped. Therefore, in this embodiment mode, the gate insulating film 140 are formed of polyimide, polyvinyl alcohol, or the like by a droplet discharge method.

After that, a semiconductor film having one conductivity type is formed over the semiconductor film. As in the above embodiment mode, an n-type semiconductor film having n-type conductivity.

As in the above embodiment mode, a signal line and a power line 109a are formed in a layer where the source electrode and the drain electrode are provided. An insulating film 112 is formed at the intersection of the signal line and the power line 109*a*, and the scan line in order to prevent short circuit. The insulating film can be formed in a similar manner to the above insulating films 102. In this embodiment mode, the insulating film is formed by dropping polyimide by a droplet discharge method.

Subsequently, an n-type semiconductor film which has n-type conductivity is etched by using the source and the drain electrode as masks. That prevents the n-type semiconductor film from shorting with the source electrode and the drain electrode. On this occasion, the semiconductor film is prevented from being etched with the use of the insulating film 140.

Thus, thin film transistors 110 and 111, in each of which up to a source electrode and a drain electrode have been provided are completed. Here, in the thin film transistors 110 and 111, the source or drain electrode 109*b* of the thin film transistor 110 and the gate electrode of the thin film transistor 111 are directly connected to each other without using a connection wiring as in the above embodiment mode. Particularly in the case of forming the thin film transistors in a pixel area of a display device, the thin film transistor 110 functions as a switch, and the thin film transistor 111 functions as a driver for controlling the luminance intensity of an electroluminescent layer.

A thin film transistor in this embodiment mode is what is called a bottom gate thin film transistor whose gate is provided below a semiconductor film. Specifically, the thin film transistor is called a channel protective type in which a channel protective film is provided over a semiconductor film. A substrate provided with a plurality of such thin film transistors is referred to as a TFT substrate.

Thereafter, as in the above embodiment mode, an interlayer insulating film 113, a conductive film 114, and a pixel electrode 115 are formed. Thus, a Module TFT substrate in which the pixel electrode have been formed is completed.

Next, alike the above embodiment mode, a resin 141 is formed so as to cover an end of the pixel electrode. The resin 141 is made to serve as a black matrix, accordingly, the resin is formed from a black resin containing chromium, for example. The resin 141 can be patterned and formed by photolithography or formed by a droplet discharge method. In this embodiment mode, the resin 141 is formed by discharging a material containing mixed resin materials by a droplet discharge method. Here, the resin can be formed using the periphery of the pixel electrode as a marker.

Subsequently, an insulating film 118 which serves as a bank or a partition is formed on the resin 141. The above embodiment mode can be consulted about the material or the manufacturing steps of the insulating film 118. In the case of forming the insulating film 118 by a droplet discharge method, the insulating film can be formed using the resin 141 as a marker.

Next, an electroluminescent layer 119 and a second electrode 120 are formed as in the above embodiment mode.

In the case where the resin 141 is formed to be high enough to serve as a bank or a partition, the insulating film 118 is not necessary.

Instead of a channel protective thin film transistor, a channel etch thin film transistor shown in the above embodiment mode may be used. The insulating film 118, the electroluminescent layer 119, and the second electrode 120 may be formed without forming the resin 141 as in the above embodiment modes. Accordingly, this embodiment mode can be freely combined with another embodiment mode above.

Thus, a conductive film and the like are formed by a droplet discharge method in a hole of an insulating film so as to obtain planarity. As a result, discontinuity of a thin film formed to cover the conductive film and the insulating film can be avoided. Further, a wiring can be made thinner by controlling the width of a hole. Further, a wiring can be made thicker by controlling the depth of the wiring.

As to a thin film transistor shown in this embodiment mode, at least a conductive film or masks other than the conductive film are formed by a droplet discharge method. Accordingly, as long as a droplet discharge method is employed in a step for forming a conductive film or masks other than the conductive film, other conductive films may be formed by a method other than a droplet discharge method. When a droplet discharge method is employed for one step, efficiency in the use of material is improved and reductions in costs and the amount of liquid waste to be processed may be achieved. Especially, when a mask is formed by a droplet discharge method, the process can be simplified in comparison with photolithography. Consequently, costs such as equipment costs, and time of manufacture can be reduced.

Embodiment Mode 4

In this embodiment mode, an example of forming a thin film transistor with a method different from the above embodiment mode will be described. Specifically, a thin film transistor is formed without simultaneously patterning a semiconductor film and a gate insulating film here. Other structures and fabrication steps of the thin film transistor are similar to the above embodiment mode; accordingly, the description will be omitted.

As shown in FIG. 11A, on a substrate 100, a base film 101 is formed; insulating films 102 and a scan line 103*a*, and a gate electrode are formed; a gate insulating film is formed to cover the insulating film, and the scan line and the gate electrode as in the above embodiment mode. On this occasion, the surfaces of the insulating films 102, the scan line 103*a*, and the gate electrode 103*b* are trued up and planarized; thus, the gate insulating film can be formed without discontinuity. A semiconductor film and an n-type semiconductor film are formed over the gate insulating film. The semiconductor film and the n-type semiconductor film are thereafter patterned to the desired shape. Here, patterning is performed so as not to etch the gate insulating film.

The signal line and the power line 109*a*, and the source electrode and the drain electrode are formed in one layer. In this embodiment mode, the gate insulating film is not etched simultaneously with the semiconductor film and the n-type semiconductor film unlike the above embodiment modes. Therefore, a gate insulating film is formed at the intersection of the scan line, and the signal line or the power line. Consequently, an insulating film 112 is not necessary.

Thereafter, the n-type semiconductor film is etched by using the source electrode and the drain electrode as masks. The n-type semiconductor film is etched so as not to short circuit the source electrode and the drain electrode. At this point, the semiconductor film 108 is occasionally etched in a measure.

As descried above, thin film transistors 110 and 111, in each of which up to a source electrode and a drain electrode have been provided are completed. Particularly in the case of forming the thin film transistors in a pixel area of a display device, the thin film transistor 110 functions as a switch, and the thin film transistor functions as a driver for controlling the luminance intensity of an electroluminescent layer.

As described above, a thin film transistor in which a source electrode and a drain electrode have been provided is completed. A thin film transistor in this embodiment mode is what is called a bottom gate thin film transistor whose gate is provided below a semiconductor film. Specifically, the thin film transistor is called a channel etch type in which a semiconductor film is etched in a measure. A substrate provided with a plurality of such thin film transistors is referred to as a TFT substrate.

Instead of the channel etch thin film transistor, a channel protective thin film transistor shown in the above embodiment mode can be used. Accordingly, this embodiment mode can be freely combined with another embodiment mode above.

As shown in FIG. 11B, an interlayer insulating film 113 and a conductive film 114 are formed as in the above embodiment mode. A hole is formed in a gate insulating film in each of the thin film transistors 110 and 111 to connect a source electrode or a drain electrode 109b of the thin film transistor 110 and a gate electrode of the thin film transistor 111. A conductive film 114 is formed in the hole for a connection wiring to connect the source electrode or the drain electrode 109b of the thin film transistor 110 and the gate electrode of the thin film transistor 111. The source electrode or the drain electrode may be formed; thus, the source electrode or the drain electrode 109b of the thin film transistor 110 is connected to the gate electrode of the thin film transistor 111 without the use of a connection wiring.

A pixel electrode 115 is formed as in the above embodiment mode. Thus, a module TFT substrate in which up to a pixel electrode has been provided is completed.

Thereafter, an insulating film 118 serving as a partition or a bank, an electroluminescent layer 119, and a second electrode 120 are formed. The above embodiment mode can be consulted about the materials or the manufacturing steps of the insulating film, the electroluminescent layer, and the second electrode Further, as shown in the above embodiment mode, a resin functioning as a black matrix may be formed. Accordingly, this embodiment mode can be freely combined with another embodiment mode above.

Thus, a conductive film and the like are formed by a droplet discharge method in a hole of an insulating film so as to obtain planarity. As a result, discontinuity of a thin film formed to cover the conductive film and the insulating film can be avoided. Further, a wiring can be made thinner by controlling the width of a hole. Further, a wiring can be made thicker by controlling the depth of the wiring.

As to a thin film transistor shown in this embodiment mode, at least a conductive film or masks other than the conductive film are formed by a droplet discharge method. Accordingly, as long as a droplet discharge method is employed in a step for forming a conductive film or masks other than the conductive film, other conductive films may be formed by a method other than a droplet discharge method. When a droplet discharge method is employed for one step, efficiency in the use of material is improved and reductions in costs and the amount of liquid waste to be processed may be achieved. Especially, when a mask is formed by a droplet discharge method, the process can be simplified in comparison with photolithography. Consequently, costs such as equipment costs, and time of manufacture can be reduced.

Embodiment Mode 5

In this embodiment mode, an example of forming a thin film transistor with a method different from the above embodiment modes will be described. Specifically, a gate electrode, and a source electrode and a drain electrode are formed below a semiconductor film here. The other structure and manufacturing steps are similar to the above embodiment mode; accordingly, the description will be omitted.

As shown in FIG. 12A, as in the above embodiment mode, a base film 101 is formed and insulating films 102 are formed over the substrate 100. Unlike in the above embodiment mode, a signal line and power line 109a and a conductive film 109 serving as a source electrode and a drain electrode 109b are formed between the insulating films 102.

In this embodiment mode, a hole is formed in a desired region by dry etching and insulating films having a depression and a projection are formed. Holes where a source electrode and a drain electrode are formed are formed to have widths of 10 μm to 40 μm, holes where a signal line and a power line are formed are formed to have widths of 5 μm to 40 μm, and a hole where a wiring leading out to an external terminal (not shown) is formed to have a width of 20 μm to 100 μm. Further, the holes are formed to have a depth of 1.5 μm to 2.5 μm.

In the case of forming such a wiring with a line width of 5 μm to 100 μm, 0.1 pl to 40 pl of the droplets may be dropped a plurality of times to fill the depth of the hole.

As in the above embodiment mode, the height of the conductive film 109 and the height of the projection of the insulating film are preferably trued up. In the case where the height of the conductive film 109 is higher than the height of the projection of the insulating film, planarization may be performed.

Meanwhile, the volume of the conductive film is reduced and the height of the conductive film 109 is lower than the height of the projection of the insulating film by heat treatment, droplets may be dropped again.

Thereafter, an insulating film 136 is preferably formed to cover the insulating films 102 and the conductive film 109. The insulating film 136 can be formed from silicon oxide or silicon nitride. When silver (Ag) is used for the conductive film 109, in the case of using an insulating film containing oxygen, the oxygen reacts with the Ag and silver oxide is formed, which may cause roughness on the surface of the gate electrode. Therefore, the insulating film 136 is preferably formed of silicon nitride.

Subsequently, a semiconductor film 108 is formed and patterned to the desired shape, and a gate insulating film 106 is thereafter formed to cover the semiconductor film. The above embodiment mode can be consulted about the material or the manufacturing steps of the insulating film and the gate insulating film.

As shown in FIG. 12B, the insulating film 136 and the gate insulating film 106 are etched to form a hole. A conductive film serving as a gate electrode 103b is formed in the hole. The conductive film serving as a scan line 103a is formed in the layer where the gate electrode is formed. The above embodiment mode can be consulted about the formation of the conductive films 103.

The gate electrode is formed to have a line width of 5 μm to 20 μm, the scan line is formed to have a line width of 10 μm to 40 μm, and the wiring leading out to an external terminal (not shown) is formed to have a line width of 20 μm to 100 μm. In the case of forming a wiring with a line width of 5 μm to 100 μm by a droplet discharge method, the amount of the droplets is set to 0.1 pl to 40 pl. The amount of the droplets can be controlled by a control signal (for example, pulse voltage application), which is sent to the nozzle. For example, in the case of the line width of 5 μm, the amount of the droplets from the nozzles 104 may be adjusted to 0.1 pl. Note that the wiring width can be controlled even by controlling the contact angle of the droplets and the surface to be provided with the wiring.

In this embodiment mode, even in the case where the gate electrode and the scan line are formed, holes may be formed in the insulating film and the gate electrode and the scan line may be formed in the holes as with the source electrode and the drain electrode, or the like.

Thus, thin film transistors 110 and 111, in each of which up to a gate electrode has been provided are completed. Here, in the thin film transistors 110 and 111, the source or drain electrode 109*b* of the thin film transistor 110 and the gate electrode of the thin film transistor 111 are connected through the gate electrode of the thin film transistor 111 without using a connection wiring. Particularly in the case of forming the thin film transistors in a pixel area of a display device, the thin film transistor 110 functions as a switch, and the thin film transistor 111 functions as a driver for controlling the luminance intensity of an electroluminescent layer.

A thin film transistor in this embodiment mode is what is called a top gate thin film transistor whose gate is provided above a semiconductor film. A substrate provided with a plurality of such thin film transistors is referred to as a TFT substrate.

Further, a pixel electrode 115 is formed in another hole. The pixel electrode 115 can be formed according to the above embodiment mode. In this embodiment mode, the interlayer insulating film 113 and the conductive film 114 are not formed unlike in the above embodiment mode. Thus, a semiconductor element can be made thinner.

Figure 21:
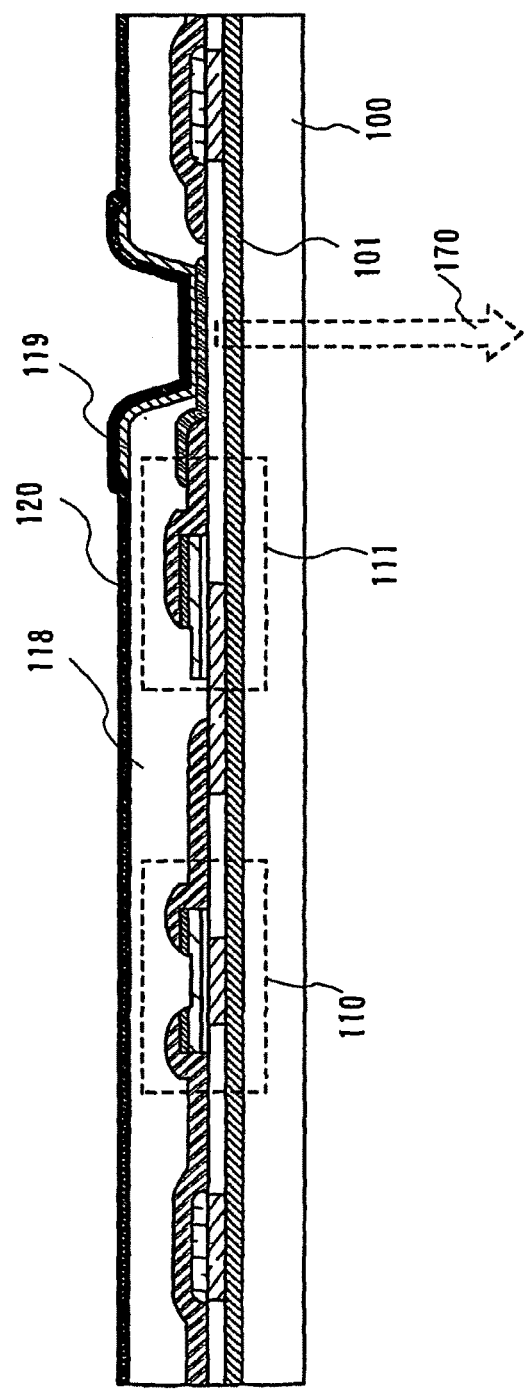
FIG. 21 shows a manufacturing step of a display device of the invention.

As shown in FIG. 21, a bottom gate thin film transistor shown in the above embodiment mode may be used instead of the top gate thin film transistor. In FIG. 21, a TFT substrate is formed with the use of a channel etch thin film transistor. Accordingly, this embodiment mode can be freely combined with another embodiment mode above.

Thus, a module TFT substrate in which up to a pixel electrode is provided is completed.

As shown in FIG. 12C, an insulating film 118 serving as a partition or a bank, an electroluminescent layer 119, and a second electrode 120 are formed. The materials or the manufacturing steps of the insulating film, the electroluminescent layer, and the second electrode can be formed according to the above embodiment mode. When silver (Ag) is used for the gate electrode, it is preferable that an insulating film containing silicon nitride is preferably formed so as to cover the gate electrode. If an insulating film containing oxygen touches a gate electrode containing silver (Ag), silver oxide is formed by the reaction of silver (Ag) and oxygen, which may cause roughness on the surface of the gate electrode.

As in the above embodiment mode, a resin serving as a black matrix may be formed below the insulating film 118. Accordingly, this embodiment mode can be freely combined with another embodiment mode above.

Thus, a conductive film and the like are formed by a droplet discharge method in a hole of an insulating film so as to obtain planarity. As a result, discontinuity of a thin film formed to cover the conductive film and the insulating film can be avoided. Further, a wiring can be made thinner by controlling the width of a hole. Further, a wiring can be made thicker by controlling the depth of the wiring.

As to a thin film transistor shown in this embodiment mode, at least a conductive film or masks other than the conductive film are formed by a droplet discharge method. Accordingly, as long as a droplet discharge method is employed in a step for forming a conductive film or masks other than the conductive film, other conductive films may be formed by a method other than a droplet discharge method. When a droplet discharge method is employed for one step, efficiency in the use of material is improved and reductions in costs and the amount of liquid waste to be processed may be achieved. Especially, when a mask is formed by a droplet discharge method, the process can be simplified in comparison with photolithogaphy. Consequently, costs such as equipment costs, and time of manufacture can be reduced.

Embodiment Mode 6

In this embodiment mode, a module TFT substrate provided with a color filter will be described.

As shown in FIG. 13A, thin film transistors 110 and 111 are formed, for example according to Embodiment Mode 1. A substrate mounted with a plurality of such thin film transistors is referred to as a TFT substrate.

In this embodiment mode, a color filter 135 is formed in a hole of insulating films 102 below an electroluminescent layer. The color filter is formed with organic materials respectively giving RGB colors. Further, the color filter can be formed by a droplet discharge method or photolithography. In this embodiment mode, when the conductive film 103 is formed by a droplet discharge method, droplets containing materials of the color filter are discharged to form the color filter.

In the case of forming the electroluminescent layer of each RGB, the broad peak can be corrected to be sharp in light emission spectrum of each RGB by using the color filter.

Thereafter, a pixel electrode 115 is formed as in the above embodiment mode, and a module TFT substrate is completed. An electroluminescent layer and a second electrode can be formed according to the above embodiment mode.

A color filter 135 is formed in a hole of the interlayer insulating film 113 in FIG. 13B, unlike in FIG. 13A. Further, a conductive film 114 serving as an auxiliary wiring is formed so as to connect the source electrode or the drain electrode of the thin film transistor 110 to the gate electrode of the thin film transistor 111, unlike in FIG. 13A. Contact defect can be reduced by forming a conductive film 114 on the connection area.

A channel protective thin film transistor or a top gate thin film transistor shown in the above embodiment modes 3 to 5 may be used instead of the channel etch thin film transistor. As in the above embodiment, a resin serving as a black matrix may be formed below an insulating film serving as a partition or a bank. Further, the insulating film serving as a partition or a bank may be formed without forming the interlayer insulating film 113 and the conductive film 114. As a result, the semiconductor element can be made thinner.

As described above, this embodiment mode can be freely combined with another embodiment mode above.

Embodiment Mode 7

In this embodiment mode, an example of a structure in which a module substrate shown in the above embodiment mode is sealed will be described.

FIG. 14A shows a cross-sectional view of a sealed module substrate. A substrate 100 and a counter substrate 151 are pasted with a sealant 153. The sealant is formed of thermosetting resin or ultraviolet curable resin. The substrate and the counter substrate are adhered and fixed by heating the sealant while pressuring or by ultraviolet irradiation. For example, epoxy resin can be used as the sealant. The sealant contains a spacer to keep the gap, that is the distance between the substrate 100 and the counter substrate 151. The spacer may be spherical or column-like. In this embodiment mode, a cylindrical spacer is used and thus, the gap is equivalent to a diameter of the circle. The counter substrate may be provided with a desiccant 152. With the desiccant agent, entrance of water or oxygen can be prevented. The counter substrate may be provided with a color filter. A broad peak can be corrected to be sharp in light emission spectrum of each RGB by using the color filter. In the case of dual emission display in which light from an electroluminescent layer is emitted to a substrate side 170 and to a sealing substrate side 171 is performed, each substrate may be provided with a color filter.

When the counter substrate 151 is used for sealing, a space is formed between the counter substrate 151 and the second electrode 120. The space may be filled with inert gas, for example, nitrogen gas. Alternatively, a highly hygroscopic material may be formed in the space. Thus, protection against water or oxygen can be enhanced. A light transmitting and highly hygroscopic material may be formed alternatively. Even in the case where light from a light emitting element is emitted to the counter substrate side, the light transmitting resin can be employed without reducing the amount of the transmitted light.

In this embodiment mode, as shown in the above embodiment mode, a thin film transistor is formed of an amorphous semiconductor film. A signal line driver circuit or a scan line driver circuit is formed with an IC chip 162 considering the operating speed. Such a driver circuit may be mounted by TAB or be mounted around a pixel area by COG. In the case of forming a thin film transistor using SAS, only a scan line driver circuit is integrally formed on the substrate and a signal line driver circuit may be separately mounted as a driver IC.

Next, mounting of a signal line driver circuit 605 and a scan line driver circuits 604a and 604b will be described concretely with reference to FIG. 22.

Figure 22A:
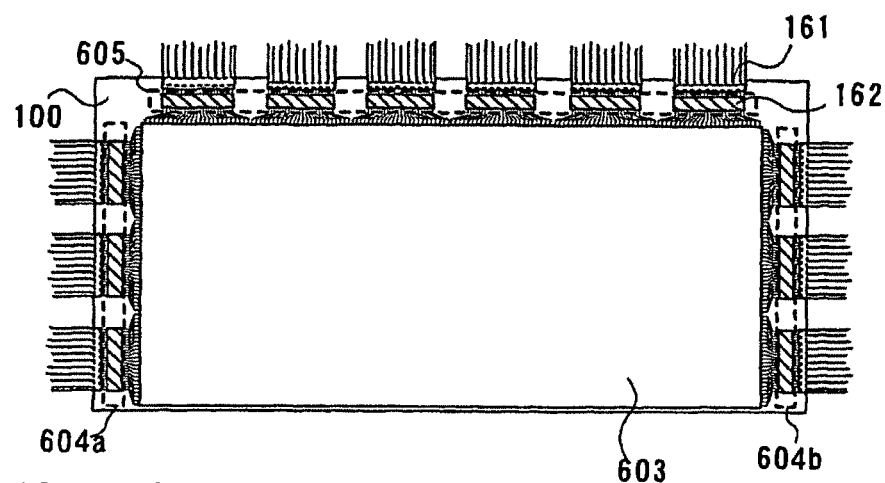
FIGS. 22A to 22C show mounting steps of a driver circuit in the invention.

As shown in FIG. 22A, the signal line driver circuit 605 and the scan line driver circuits 604a and 604b are mounted around the pixel area 603. In FIG. 22A, IC chips 162 are mounted on the substrate 100 as the signal line driver circuit 605 and the scan line driver circuits 604a and 604b, or the like by COG. The IC chips and the external circuit are connected through an FPC (a flexible print circuit) 161.

Figure 22B:
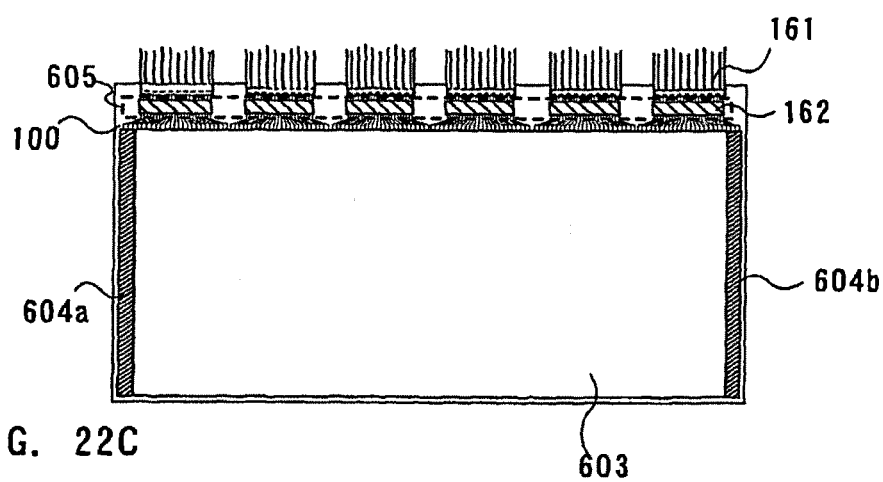

As shown in FIG. 22B, in the case of forming a TFT with SAS or a crystalline semiconductor, the pixel area 603, the scan line driver circuit the 604, and the like may be integrally formed on the substrate, and the signal line driver circuit 605 and the like are separately mounted as IC chips. In FIG. 22B, IC chips 162 are mounted on the substrate 100 as the signal line driver circuit 605 by COG. The IC chips and the external circuit are connected through an FPC 161.

Figure 22C:
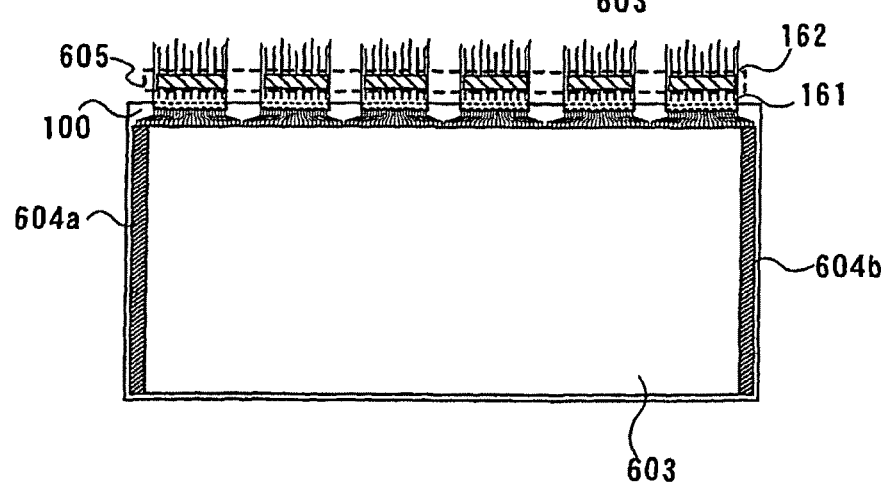

As shown in FIG. 22C, the signal line driver circuit 605 and the like may be mounted by TAB instead of COG. The IC chips and the external circuit are connected through the FPC (a flexible print circuit) 161. In FIG. 22C, the signal line driver circuit is mounted by TAB; however, the scan line driver circuit may be mounted by TAB.

When IC chips are mounted by TAB, a pixel area which is large against the substrate can be provided. Thus, reduction in the circuit area around the pixel area can be achieved.

An IC chip is formed with the use of a silicon wafer; alternatively, an IC which is formed on a glass substrate (hereinafter referred to as a driver IC) may be used instead of an IC chip. Since an IC chip is formed using a circular silicon wafer, the shape of a mother substrate is limited. Meanwhile, since a mother substrate of a driver IC is glass, the shape is not limited; thus, productivity can be improved. Therefore, the shape and the size of the driver IC can be set freely. For example, when a driver IC is formed to have a longer side with a length of 15 mm to 80 mm, the number of required driver ICs can be reduced as compared with the case of mounting IC chips. As a result, the number of the connection terminals can be reduced; thus, the manufacturing yield can be improved.

A driver IC can be formed using a crystalline semiconductor formed on a substrate. The crystalline semiconductor can be formed by the irradiation of continuous-wave laser light. A semiconductor film which can be obtained by the irradiation of continuous wave laser light has less crystal defects, and has crystal grains with large diameters. As a result, the mobility or the response speed of a transistor having such a semiconductor film is improved, high speed drive is enabled, which is preferable for a driver IC.

In this embodiment mode, the signal line driver circuit formed of IC chips 162 is formed by TAB on the FPC 161, and is connected to the thin film transistors 110 and 111 through an anisotropic conductive film 160. Note that, in adhering the anisotropic conductive film by heating or pressuring, a crack due to the flexibility of a substrate or softening by heat should be avoided. A clock signal or a video signal is received from the thus connected IC chip.

Figure 50A:
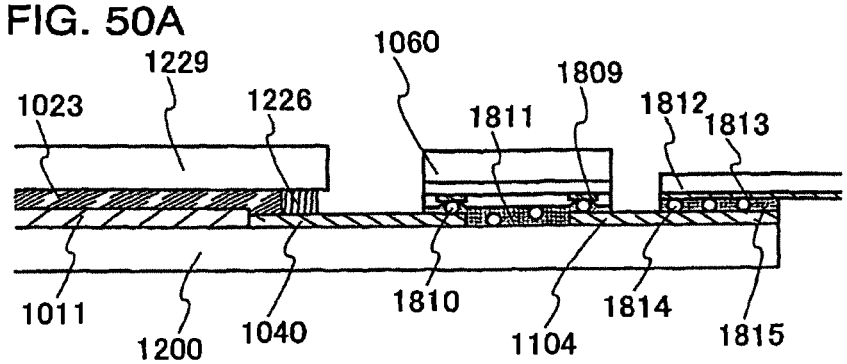
FIGS. 50A and 50B explain a mounting method of a driver circuit area of a liquid crystal display panel according to the invention.
Figure 50B:
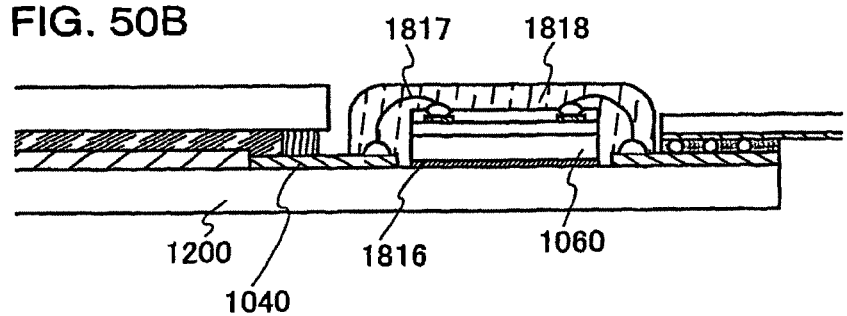

FIGS. 50A and 50B each show a cross-sectional structure in which a driver IC is mounted by COG. FIG. 50A shows a structure in which a driver IC 1060 is mounted on a TFT substrate 1200 with the use of an anisotropic conductive material. A pixel area 1010, a signal line input terminal 1040 (same in the case of a scan line driver circuit 1103) are provided over the TFT substrate 1200. A counter substrate 1229 is pasted to the TFT substrate 1200 with a sealant 1226. A liquid crystal layer 1023 is formed between the substrates. In the case of a light emitting device, an electroluminescent layer is formed.

An FPC 1812 is attached to the signal line input terminal 1040 with the use of an anisotropic conductive material. The anisotropic conductive material includes a resin 1815 and conductive particles 1814 each of whose surfaces is plated with Au or the like and of which diameter is tens to hundreds of μm. With the conductive particles 1814, the signal line input terminal 1040 is electrically connected to a wiring 1813 formed in the FPC 1812. The driver IC 1060 is also attached to the substrate 1200 with an anisotropic conductive material. With conductive particles 1810 included in a resin 1811, an input-output terminal 1809 provided in the driver IC 1060 is electrically connected to the signal line input terminal 1040.

As shown in FIG. 50B, the driver IC 1060 may be fixed to the TFT substrate 1200 with an adhesive 1816, and the input-output terminal 1809 of the driver IC may be connected to the signal line input terminal 1040 with an Au wire 1817. Then, a sealing resin 1818 is used here for sealing. There is no limitation on a mounting method of the driver IC, and a known method such as COG, wire bonding, or TAB may be used.

The driver IC is formed to have the same thickness as that of the counter substrate. Accordingly, they can have almost the same height, which results in a thin display device as a hole. In addition, each substrate is formed of one material; therefore, thermal stress is not generated even when the temperature in the display device is changed, and thus, properties of the circuit made up of TFTs are not damaged. Moreover, as shown in this embodiment, a driver circuit is mounted with a driver IC that is longer than an IC chip so that less number of driver ICs to be mounted on a pixel area are required.

As described above, a driver circuit can be mounted on a panel provided with a pixel area of a display device.

FIG. 14B shows the case where sealing is performed without the use of a counter substrate unlike in FIG. 14A. Other structures are similar; thus, the description will be omitted.

In FIG. 14B, a protective film 155 is provided to cover a second electrode 120. An organic material such as epoxy resin, urethane resin, or silicone resin can be used for the second protective film. The second protective film may be formed by dropping a polymeric (high-molecular-weight)

material by a droplet discharge method. Epoxy resin is discharged from a dispenser and dried in this embodiment mode. Further, a counter substrate may be provided over the protective film Sealing is thus carried out without the use of a counter substrate, which can contributes to reductions in weight, size, and thickness of a display device.

Figure 18A:
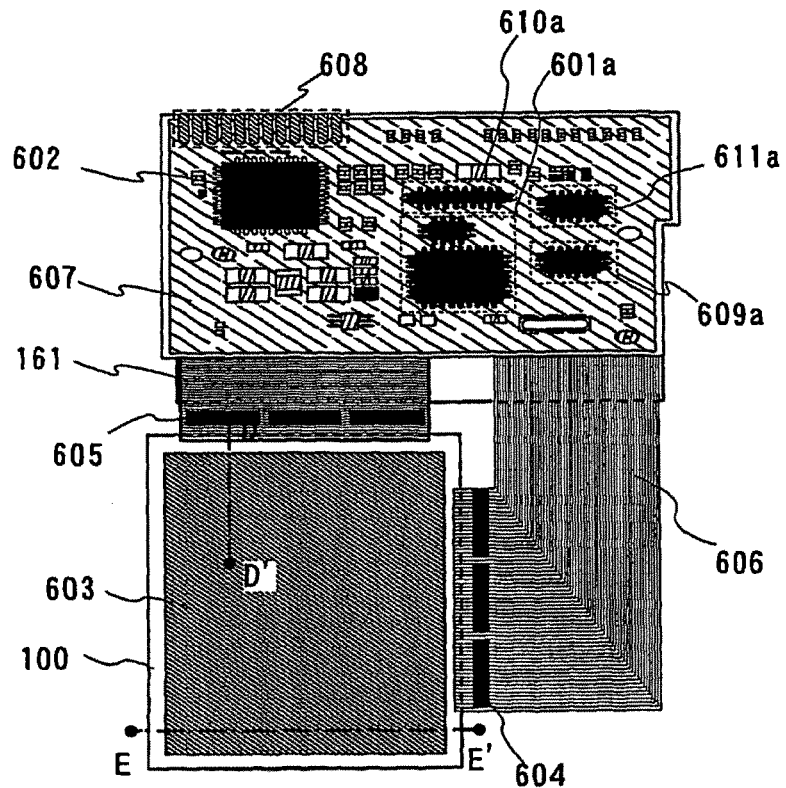
FIGS. 18A and 18B each show a module provided with a power supply circuit of the invention.

FIG. 18A shows a top view of the appearance of a sealed light emitting device shown in FIG. 14. A control circuit 601a and a power supply circuit 602 are mounted through an FPC. The cross section D-D' in FIG. 18A corresponds to a cross-sectional view of FIG. 14. As shown in the above embodiment mode, a pixel area 603 where a light emitting element is provided in each pixel is provided on the substrate 100. A liquid crystal element may be provided instead of a light emitting element. A thin film transistor provided for the pixel area 603 may be formed as in the above embodiment mode.

In FIG. 18, a scan line driver circuit 604 for selecting a pixel of the pixel area 603 and a signal line driver circuit 605 for supplying a video signal to the selected pixel are formed with IC chips and mounted by TAB. Widths of long and short sides of the ICs to be mounted or the number thereof is not limited to those described in this embodiment mode. The scan line driver circuit or the signal line driver circuit may be integrally formed with the pixel area depending on the degree of the crystallinity of the thin film transistor. For example, a buffer circuit included in the scan line driver circuit can be integrally formed on the same substrate.

The control circuit 601a, the power supply circuit 602, an image signal processing circuit 609a, a video RAM 610a, an audio circuit 611a are provided for a printed wiring board 607. A power supply voltage outputted from the power supply circuit 602, or various signals from the control circuit 601a, the image signal processing circuit 609a, the video RAM 610a, and the audio circuit 611a are supplied into the scan line driver circuit 604 and the signal line driver circuit 605 through an FPC 616, and further, are supplied to the pixel area 603.

The power supply voltage of the printed wiring board 607 and various signals are supplied through an interface (I/F) portion 608 in which plural input terminals are arranged. A signal is inputted into the image signal processing circuit 609a from the interface (I/F) portion 608. A signal is sent and received between the image signal processing circuit 609a and the video RAM 610a.

Note that the printed wiring board 607 is mounted by using the FPC 161 in this embodiment mode; however, the present invention is not necessarily limited to this structure. The control circuit 601a and the power supply circuit 602 may be mounted directly on the substrate by COG (Chip On Glass). In addition, a mounting method of an IC chip such as a signal line driver circuit or a scan line driver circuit is not limited to this embodiment mode, and an IC chip formed on the substrate may be connected to a wiring in the pixel area by wire bonding.

Further, in the printed wiring board 607, noise may be caused in the power supply voltage or signals, or the rise of the signal may become slow due to capacitance formed between leading wirings, resistance of the wiring itself, and the like. Thus, various kinds of elements such as a capacitor and a buffer may be provided on the printed wiring board 607, thereby preventing noise from being caused in the power supply voltage or signals, or preventing the rise of the signal from being slow.

Figure 18B:
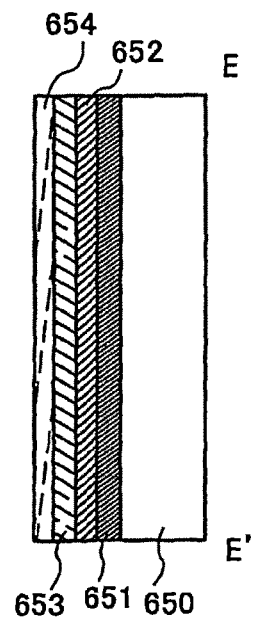

At least a pixel area of a module may preferably be provided with a polarizing plate or a circularly polarizing plate so as to improve contrast. For example, as shown in FIG. 18B equivalent to a cross section of E-E', in the case of recognizing display from the sealing substrate side, a quarter wave plate 651, a half wave plate 652, a polarizing plate 653 may preferably be provided sequentially from a sealing substrate 650. Further, an anti-reflective film 654 may be provided on the polarizing plate.

Such a module is incorporated in a chassis of an electronic device; thus, a commodity can be completed. A heat sink or the like may preferably be provided inside the chassis to prevent heating of the module.

Embodiment Mode 8

In this embodiment mode, the formation methods of an insulating film, a conductive film, and the like will be described. Note that the drawings referred in this embodiment mode are schematic views; accordingly, the actual size of a nozzle against a semiconductor film or the like may vary.

Figure 5A:
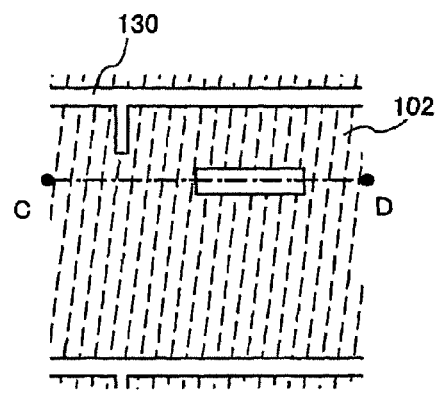
FIGS. 5A to 5D show manufacturing steps of a thin film transistor of the invention.

As shown in FIG. 5A, a hole is formed in a desired region after forming insulating films 102. A hole where a gate electrode is formed to have a width of 5 µm to 20 µm, a hole where a scan line is formed to have a width of 10 µm to 40 µm, and a hole where a wiring leading out to an external terminal (not shown) is formed to have a width of 20 µm to 100 µm. In this case, the width of the gate electrode is 5 µm to 20 µm. Further, the hole is formed to have a depth of 1.5 µm to 2.5 µm.

Figure 5B:
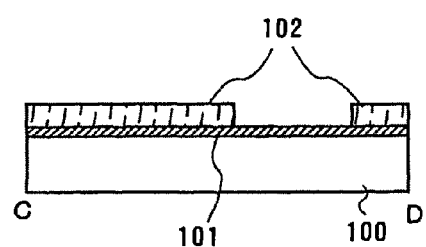

FIG. 5B shows a cross-sectional view taken along C-D in FIG. 5A. A base film 101 is formed on the substrate 100, and an insulating film 102 is formed on the base film. A hole 130 is formed in the insulating film 102 by dry etching method or wet etching.

Figure 5C:
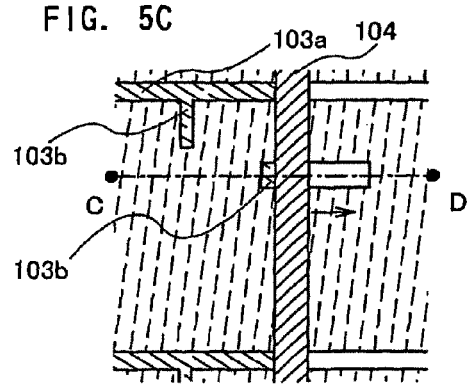

As shown in FIG. 5C, droplets containing a conductive material is discharged from nozzles 104 while moving the nozzles, thereby forming a scan line 103a and a gate electrode 103b.

Figure 5D:
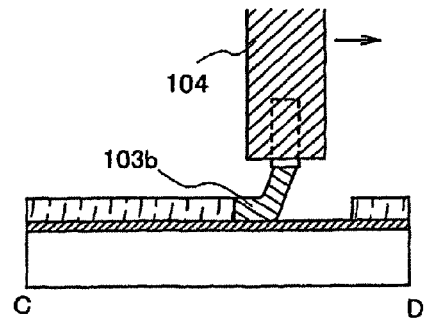

As shown in FIG. 5D, when the nozzles 104 come over the hole, a control signal is set ON to make the nozzles discharge. Thus, when the nozzles come over a desired position like this, the control signal is set ON, thereby selectively making a pattern.

In other words, in FIG. 5, after a hole is formed in the insulating film, a conductive film serving as a scan line, a gate electrode of and the like are formed by a droplet discharge method.

In FIG. 5, the description is focused on the gate electrode and the gate wiring 103b; however, the manufacturing steps may be applied to the formation of a lead wiring or a scan line.

Next, unlike in FIG. 5, the case where an insulating film and a conductive film are simultaneously formed by a droplet discharge method will be described.

Figure 6A:
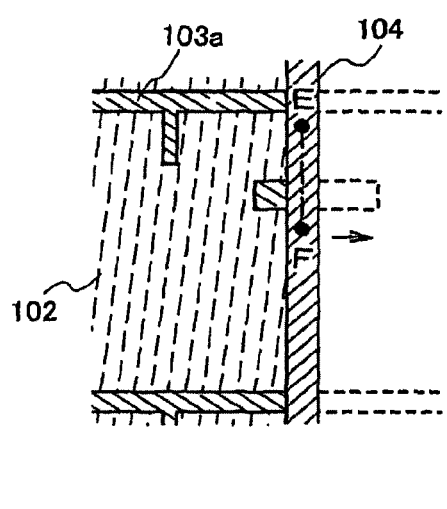
FIGS. 6A and 6B show manufacturing steps of a thin film transistor of the invention.
Figure 6B:
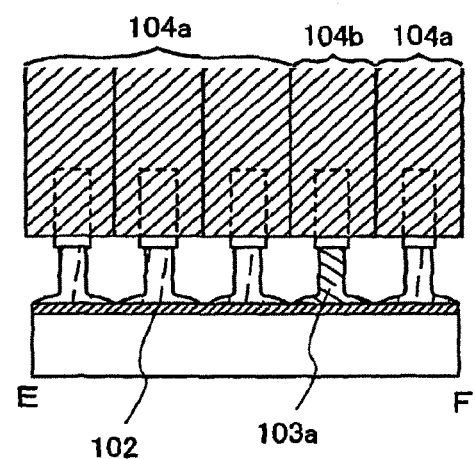

As shown in FIG. 6A, droplets containing an insulating material and droplets containing a conductive material are simultaneously discharged from nozzles 104. Therefore, the nozzles 104 are designed to discharge droplets containing an insulating material and a conductive material. Here, each control signal is set to be ON when the nozzles come over a desired position, thereby selectively making each pattern. For example, as to a plurality of nozzles provided for one head, as shown in FIG. 6B, a nozzle 104a containing an insulating material and a nozzle 104b containing a conductive material are provided. Each control signal is set to be ON when the nozzles come over a desired position. FIG. 6B shows a cross-sectional view taken along E-F in FIG. 6A.

Figure 7A:
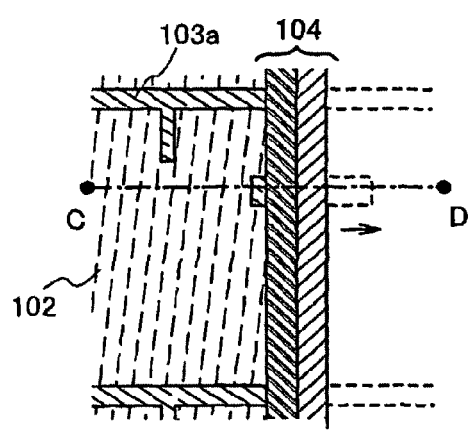
FIGS. 7A and 7B show manufacturing steps of a thin film transistor of the invention.
Figure 7B:
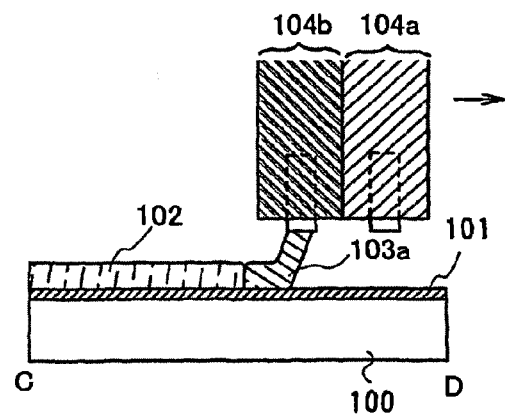

As shown in FIGS. 7A and 7B, two heads respectively having a nozzle 104a and a nozzle 104b are provided. The nozzle 104a is only for containing an insulating material and the nozzle 104b is only for containing a conductive material.

FIG. 7B shows a cross-sectional view taken along C-D in FIG. 7A. Even in this case, each control signal is set to be ON when the nozzles come over a desired position.

Thus, dedicated nozzles are provided; thus, a region to be provided with each material can be set freely.

In order to form different kind of patterns next to each other simultaneously, the patterns support each other; accordingly, the patterns can be prevented from collapsing. Consequently, as to the formation of a wiring, a wiring can be easily formed thicker compared with the case of forming a wiring only by a droplet discharge method.

In FIG. 6 and FIG. 7, description is focused on the gate electrode; however, the manufacturing steps may be applied to the formation of a lead wiring or a scan line. A lead wiring or a scan line has wider wiring width compared with a gate electrode; therefore, when the amount of droplets discharged from the nozzles is increased, the throughput can be improved.

Next, unlike FIGS. 5 to 7, the case of separately forming an insulating film and a conductive film by a droplet discharge method will be described. In this case, whichever one of the insulating film and the conductive film may be formed first. In this embodiment mode, the insulating film is formed first. Accordingly, a pattern can be prevented from collapsing compared with the case of first forming a fine conductive film.

Figure 8A:
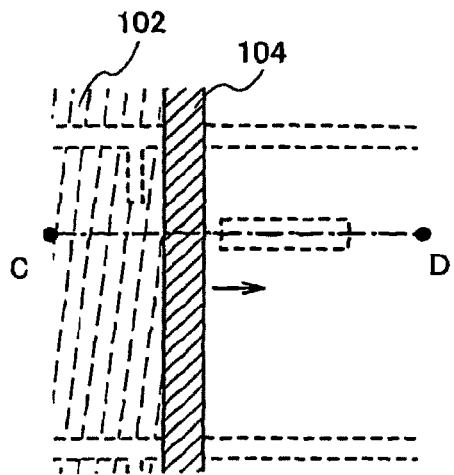
FIGS. 8A to 8D show manufacturing steps of a thin film transistor of the invention.
Figure 8B:
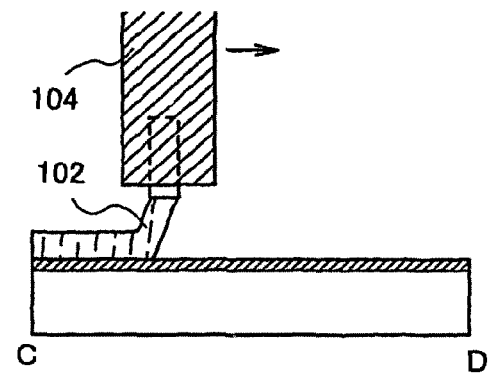

As shown in FIG. 8A, droplets containing an insulating material is selectively discharged from the nozzles 104 on the substrate where a base film 101 is formed. Here, each control signal is set to be ON when the nozzles come over a desired position. FIG. 8B shows a cross-sectional view taken along C-D in FIG. 8A.

After the insulating film is formed, heat treatment is performed as baking for removing solvent in the droplets. Specifically, the heat treatment is carried out at a temperature of 200° C. to 300° C. This treatment is referred to as full bake. In the heat treatment, solvent is removed to some extent, so that the shape of the insulating film can be kept compared with right after the application of the droplets; accordingly, the heat treatment may be carried out at a low temperature as 100° C. to 200° C. This treatment is referred to as temporary bake. Alternatively, the insulating film may be left untouched and only dried. In this case, full bake may be carried out concurrently with the heating of a conductive film to be formed later.

Figure 8C:
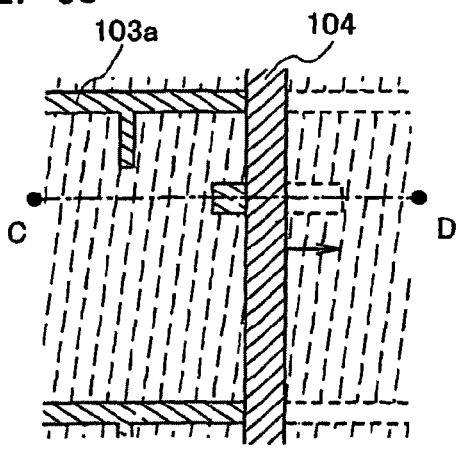
Figure 8D:
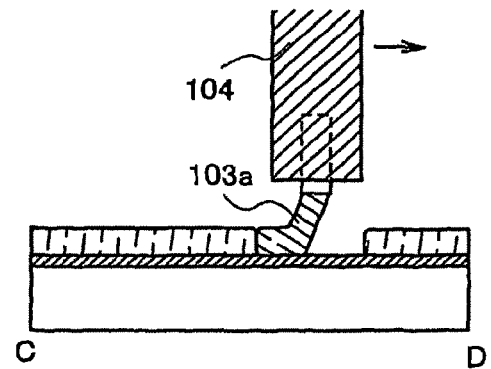

Thereafter, as shown in FIG. 8C, droplets containing a conductive material are discharged from the nozzles 104. Here, each control signal is set to be ON when the nozzles come over a desired position. FIG. 8D shows a cross-sectional view taken along C-D in FIG. 8C.

After the conductive film is formed, heat treatment is performed as baking for removing solvent in the droplets. Specifically, the heat treatment is carried out at a temperature of 200° C. to 300° C. This treatment is referred to as full bake. The insulating film can be fully baked concurrently with the full bake of the conductive film. The heat treatment against the conductive film is preferably carried out under an oxygen containing atmosphere. Particularly in the case of using droplets containing silver (Ag), it is preferable to perform heat treatment under oxygen or nitrogen containing atmosphere, as already described. Accordingly, the planarity of surface of the gate electrode is improved, and the resistivity can be reduced.

Before forming an insulating film or a conductive film, treatment for obtaining liquid repellency or lyophilicity can be carried out in order to improve the accuracy of droplet application or to simplify the selective formation of a pattern. For example, the treatment for obtaining liquid repellency or lyophilicity can be performed by plasma treatment using atmospheric air, oxygen, or nitrogen as a process gas.

Whichever of the treatment for obtaining liquid repellency and the treatment for obtaining lyophilicity is carried out can be determined depending on the solvent of the droplets. In particular, in the case where the conductive film is formed in a hole and the solvent of the droplets containing a conductive material is alcoholic, it is preferable that the surface of the insulating film is made liquid repellent, and a hole (including a side of the hole) is made lyophilic. As a result, the conductive film can be formed accurately and simply by a droplet discharge method.

The conductive film is formed to be thin by using droplets which are repellent to the droplets containing an insulating material; thus, the accuracy of the application is improved and selective formation of a pattern can be simplified. Specifically, droplets which are repellent to the droplets containing an insulating material are applied thinly to an area where the conductive film is to be formed, thereby forming a liquid repellent region. Alternatively, the liquid repellent region may be selectively formed only at the start point of the pattern of the conductive film. The droplets which are repellent to the droplets containing an insulating material may be the droplets containing a conductive material.

Thereafter, when droplets containing an insulating material are discharged, the insulating film is formed except in the liquid repellent region. The insulating film is formed so as to have a hole in an area where the conductive film is to be formed; thus, the selective formation of the insulating film is made easier. Further, even in the case where the droplets containing an insulating material are applied with some misalignment, the droplets are hardly applied to the liquid repellent region and the droplets are aggregated except in the liquid repellent region. As a result, the some misalignment can be corrected and the accuracy of the application can be improved. Thereafter, droplets containing a conductive material are discharged into the hole; thus, the conductive film can be formed. As described above, heating may be performed between the formations of the insulating film and the conductive film.

Such a liquid repellent region may be formed in a region to be provided with the insulating film instead of a region to be provided with the conductive film. In particular, the pattern may be formed to be thin in a region to be later provided with the pattern. Further, the above plasma treatment may be combined.

In FIG. 8, description is focused on the gate electrode; however, the manufacturing steps may be applied to the formation of a lead wiring or a scan line.

Next, the case of forming an interlayer insulating film 113 and a conductive film 114 by a droplet discharge method will be described.

Figure 9A:
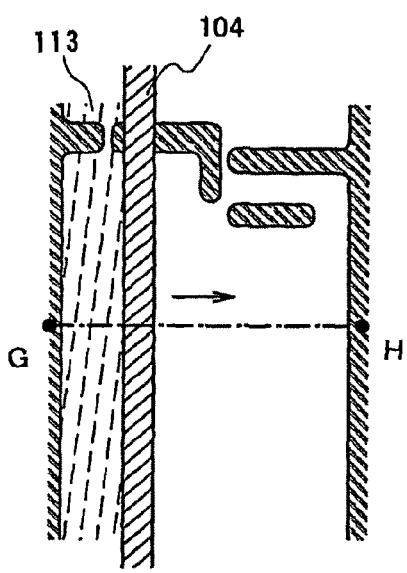
FIGS. 9A to 9D show manufacturing steps of a thin film transistor of the invention.
Figure 9B:
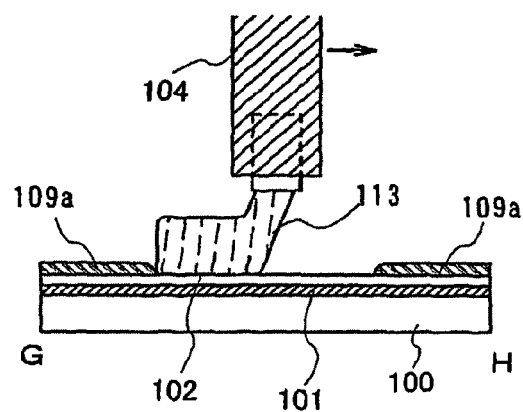

As shown in FIG. 9A, droplets containing a material of an interlayer insulating film are selectively discharged from nozzles 104 in a state where a signal line and a power line 109a is formed. Here, each control signal is set to be ON when the nozzles come over a desired position. FIG. 9B shows a cross-sectional view taken along G-H in FIG. 9A.

After the interlayer insulating film is formed, heat treatment is performed as baking for removing solvent in the droplets. Specifically, full bake is carried out at a temperature of 200° C. to 300° C. In the heat treatment, solvent is removed to some extent, so that the shape of the insulating film can be kept compared with before the application of the droplets; accordingly, only temporary bake may be carried out at a low temperature as 100° C. to 200° C. This treatment is referred to as temporary bake. Alternatively, the insulating film may be left untouched and only dried. In this case, full bake may be carried out concurrently with the beating of a conductive film to be formed later.

Figure 9C:
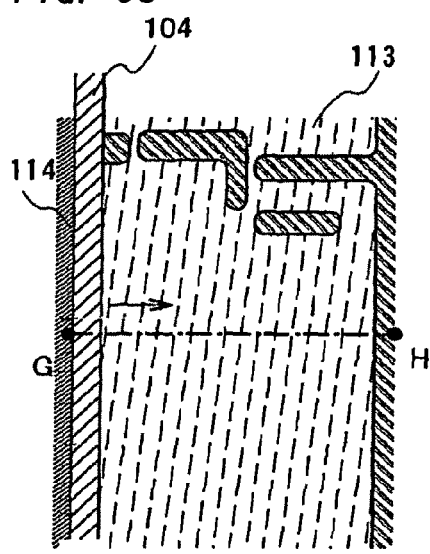
Figure 9D:
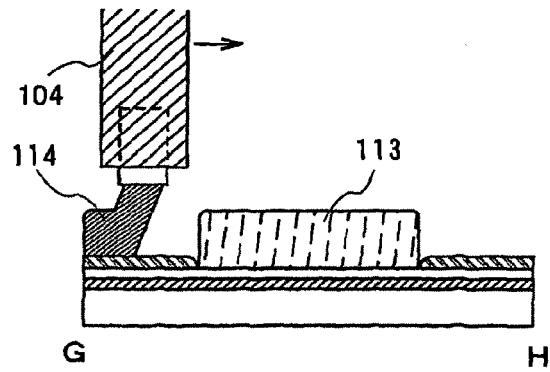

Thereafter, as shown in FIG. 9C, droplets containing a conductive material are discharged from the nozzles 104. Here, each control signal is set to be ON when the nozzles come over a desired position. FIG. 9D shows a cross-sectional view taken along G-H in FIG. 9C.

After the conductive film 114 is formed, heat treatment is performed as baking for removing solvent in the droplets. Specifically, the heat treatment is carried out at a temperature of 200° C. to 300° C. This treatment is referred to as full bake. The insulating film can be fully baked concurrently with the full bake of the conductive film. The heat treatment against the conductive film is preferably carried out under an oxygen containing atmosphere. Particularly in the case of using droplets containing silver (Ag), it is preferable to perform heat treatment under oxygen or nitrogen containing atmosphere, as already described. Accordingly, the planarity of a surface of the gate electrode is improved, and the resistivity can be reduced.

In FIG. 9, a hole is formed in the interlayer insulating film by dry etching or wet etching, and droplets containing a conductive material may be discharged by a droplet discharge method as shown in FIG. 5.

In FIG. 9, the interlayer insulating film 113 and the conductive film 114 may be simultaneously formed by a droplet discharge method as shown in FIG. 6 and FIG. 7.

In FIGS. 5 to 9, For example, in the case of forming a wiring in a hole with a width of 5 μm to 100 μm by a droplet discharge method, 0.1 pl to 40 pl of the droplets may be dropped a plurality of times to fill the depth of the hole. Here, the amount of the droplets can be controlled by a control signal (for example, pulse voltage application), which is sent to the nozzle.

Next, the case of forming a black matrix and an insulating film 118 will be described. Embodiment Mode 2 may be consulted about the structure of a thin film transistor.

Figure 15A:
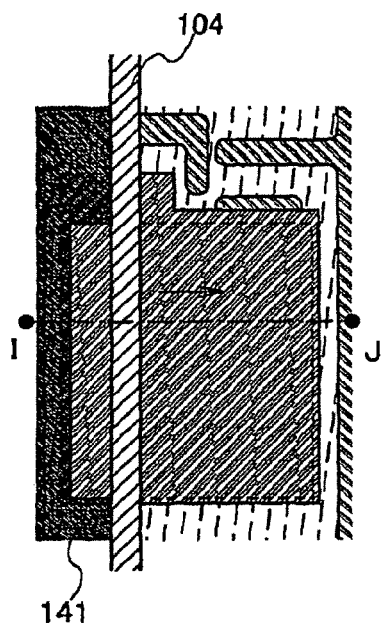
FIGS. 15A to 15D show manufacturing steps of a thin film transistor of the invention.
Figure 15B:
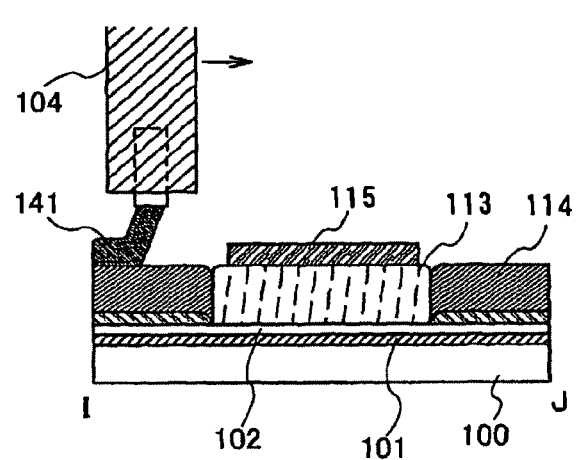

As shown in FIG. 15A, droplets containing a material of a black matrix are discharged from the nozzles 104 in a state where a pixel electrode is formed. Here, the black matrix is formed so as to surround the pixel area. Each control signal is set to be ON when the nozzles come over a desired position. FIG. 15B shows a cross-sectional view taken along I-J in FIG. 15A.

After the black matrix is formed, heat treatment is performed as baking for removing solvent in the droplets. In the heat treatment, solvent is removed to some extent, so that the shape of the insulating film can be kept compared with right after the application of the droplets; accordingly, only temporary bake may be carried out at a low temperature. Alternatively, the insulating film may be left untouched and only dried. In this case, full bake may be carried out concurrently with the heating of an insulating film to be formed later.

Figure 15C:
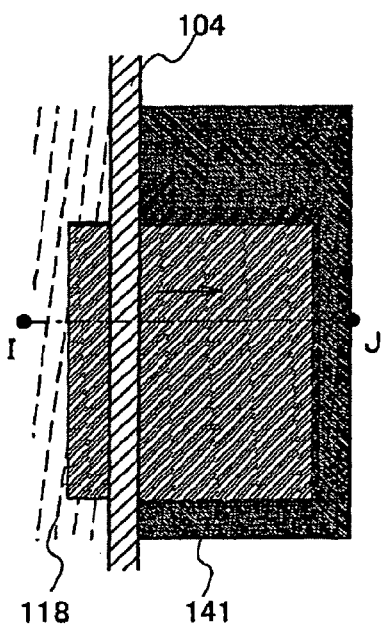
Figure 15D:
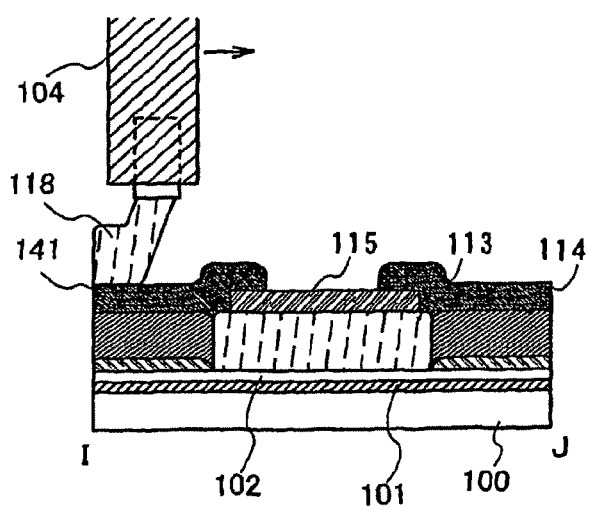

As shown in FIG. 15C, droplets containing an insulating material are discharged from the nozzles 104. In the case of forming the insulating film by a droplet discharge method, the insulating film can be formed by using the resin 141 as a marker. Each control signal is set to be ON when the nozzles come over a desired position. FIG. 15D shows a cross-sectional view taken along I-J in FIG. 15C.

After the insulating film 118 is formed, heat treatment is performed as baking for removing solvent in the droplets. Concurrently, the black matrix can be heat treated.

As above, in a step of forming a thin film transistor, a droplet discharge method can be used. When a pattern of a wiring or the like is formed by a droplet discharge method, efficiency in the use of material is improved and reductions in costs and the amount of liquid waste to be processed may be achieved. Especially when a pattern is formed by a droplet discharge method, the process can be simplified in comparison with photolithography. Consequently, costs such as equipment costs, and time of manufacture can be reduced.

Embodiment Mode 9

In this embodiment mode, a pixel circuit of a light emitting device, which has a thin film transistor shown in the above embodiment mode, and the behavior thereof will be described.

Figure 16A:
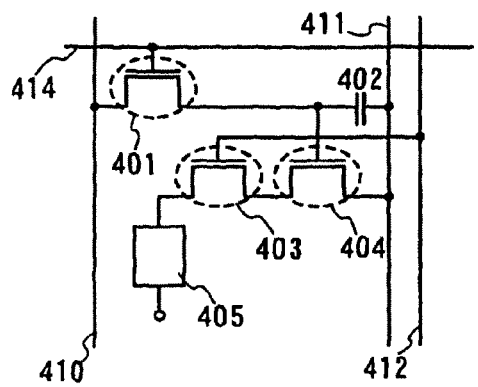
FIGS. 16A to 16F each show a pixel circuit of a display device of the invention.

In a pixel shown in FIG. 16A, a signal line 410 and power supply lines 411 and 412 are arranged in columns, and a scan line 414 is arranged in a row. The pixel further includes a switching TFT 401, a driving TFT 403, a current control TFT 404, a capacitor 402, and a light emitting element 405.

Figure 16B:
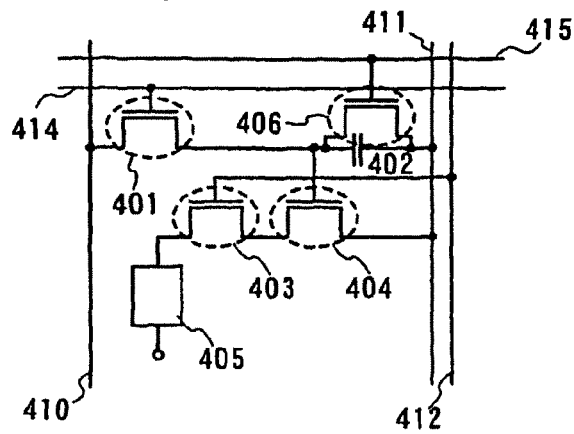
Figure 16C:
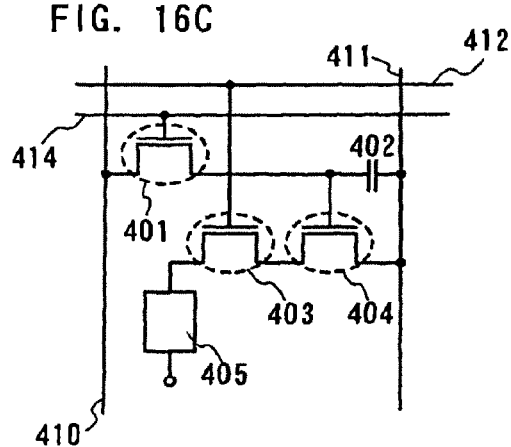
Figure 16D:
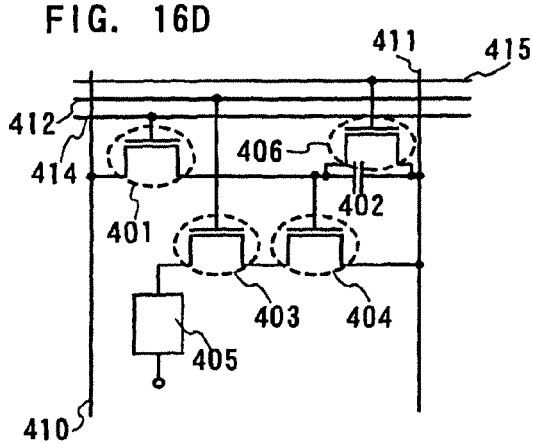

A pixel shown in FIG. 16C has the same configuration as the one shown in FIG. 16A, except that a gate electrode of a TFT 403 is connected to a power supply line 412 arranged in a column. That is, FIGS. 16A and 16C show equivalent circuit diagrams. However, the power supply lines are formed on different conductive layers between the cases where the power supply line 412 is arranged in a column (FIG. 16A) and where the power supply line 412 is arranged in a row (FIG. 16C). The two pixels are each shown in FIGS. 16A and 16C in order to make a clear distinction that wirings connected to the gate electrodes of the driving TFTs 403 in FIG. 16A and FIG. 16C are in different layers.

In each FIGS. 16A and 16C, the TFTs 403 and 404 are connected in series in the pixel, and the ratio of the channel length L (403)/the channel width W (403) of the 403 to the channel length L (404)/the channel width W (404) of the TFT 404 may be set as L (403)/W (403): L (404)/W (404)=5000 to 6000:1.

The TFT 403 is operated in a saturation region and controls the amount of current flowing in the light emitting element 405, whereas the TFT 404 is operated in a linear region and controls whether a current is supplied to the light emitting element 405 or not. The TFT 403 and the TFT 404 preferably have the same conductivity type in view of the manufacturing step. The transistors are n-channel type in this embodiment mode. For the TFT 403, a depletion mode transistor may be used instead of an enhancement mode transistor. According to the invention having the aforementioned configuration, slight variation in Vgs of the TFT 404 does not affect the amount of current flowing in the light emitting element 405, since the TFT 404 is operated in a linear region. Accordingly, the amount of current flowing in the light emitting element 405 can be determined by the TFT 403 operated in a saturation region. With the above structure, it is possible to provide a display device in which variations in luminance due to variations in characteristics of TFTs are reduced and image quality is improved.

The TFT 401 in FIGS. 16A to 16D controls a video signal input to the pixel. When switching TFT 401 is turned ON, a video signal is inputted to the pixel. The voltage of the video signal is held in the capacitor 402. Although the pixel includes the capacitor 402 in FIGS. 16A and 16C, the invention is not limited to this. When a gate capacitance or the like can replace the capacitor in holding a video signal, the capacitor 402 is not necessarily provided.

A pixel shown in FIG. 16B has a similar configuration as the one shown in FIG. 16A, except that an erase TFT 406 and a scan line 415 are added. Similarly, a pixel shown in FIG.

16D has the same configuration as the one shown in FIG. 16C, except that the TFT 406 and the scan line 415 are added.

The TFT 406 is controlled to be ON/OFF by the added scan line 415. When the erase TFT 406 is turned ON, charges held in the capacitor 402 are discharged, thereby turning the current control TFT 404 OFF. Accordingly, supply of current to the light emitting element 405 can be forcibly stopped by disposing the transistor 406. That is the reason why the TFT 406 is called an erase TFT. Thus, by adopting the configurations shown in FIGS. 16B and 16D, a lighting period can start simultaneously with or immediately after a writing period before signals are written to all the pixels; thus, the duty ratio can be improved.

Figure 16E:
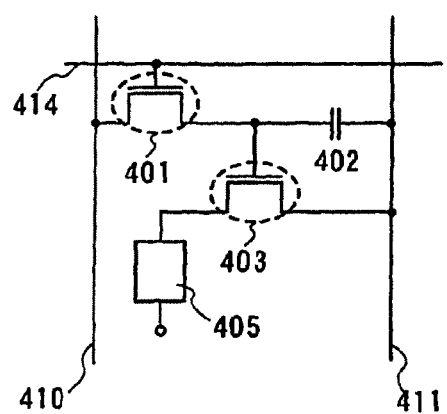

A pixel shown in FIG. 16E is equivalent to the equivalent circuit of the pixel having a thin film transistor shown in the above embodiment mode, and is provided with a signal line 410 and a power supply line 411 which are arranged in columns. Further, a scan line 414 is arranged in a row. The pixel further includes a switching TFT 401, a driving TFT 403, a capacitor 402, and a light emitting element 405. A pixel shown in FIG. 16F has a similar configuration as the one shown in FIG. 16E, except that a TFT 406 and a scan line 415 are added. It is to be noted that the configuration of FIG. 16F also allows the duty ratio to be increased by providing the transistor 406.

Figure 16F:
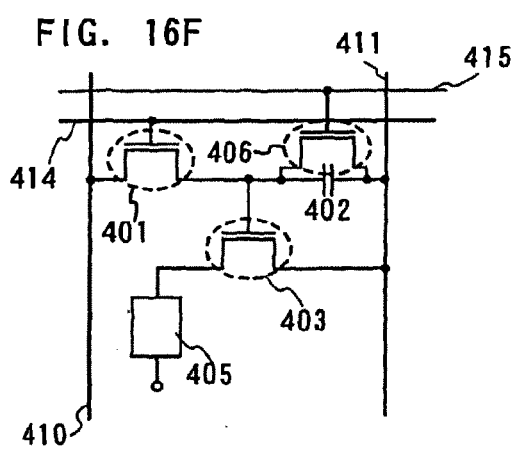

In particular, in the case where a thin film transistor is formed with an amorphous semiconductor film or the like as in the above embodiment mode, it is preferable to use a large semiconductor film for the driving TFT. Thus, the numerical aperture is reduced. Consequently, a structure in which the number of TFTs is small may preferably be used as shown in FIG. 16E or FIG. 16F.

In the case where pixel density is increased, such an active matrix light emitting device is considered to have an advantage over low voltage driving since each pixel is provided with a TFT. Meanwhile, a passive matrix light emitting device in which a TFT is provided every line can also be formed. The passive matrix light emitting device has a high aperture ratio since each pixel is not provided with a TFT.

As above, various pixel circuits can be used.

Embodiment Mode 10

Figure 17:
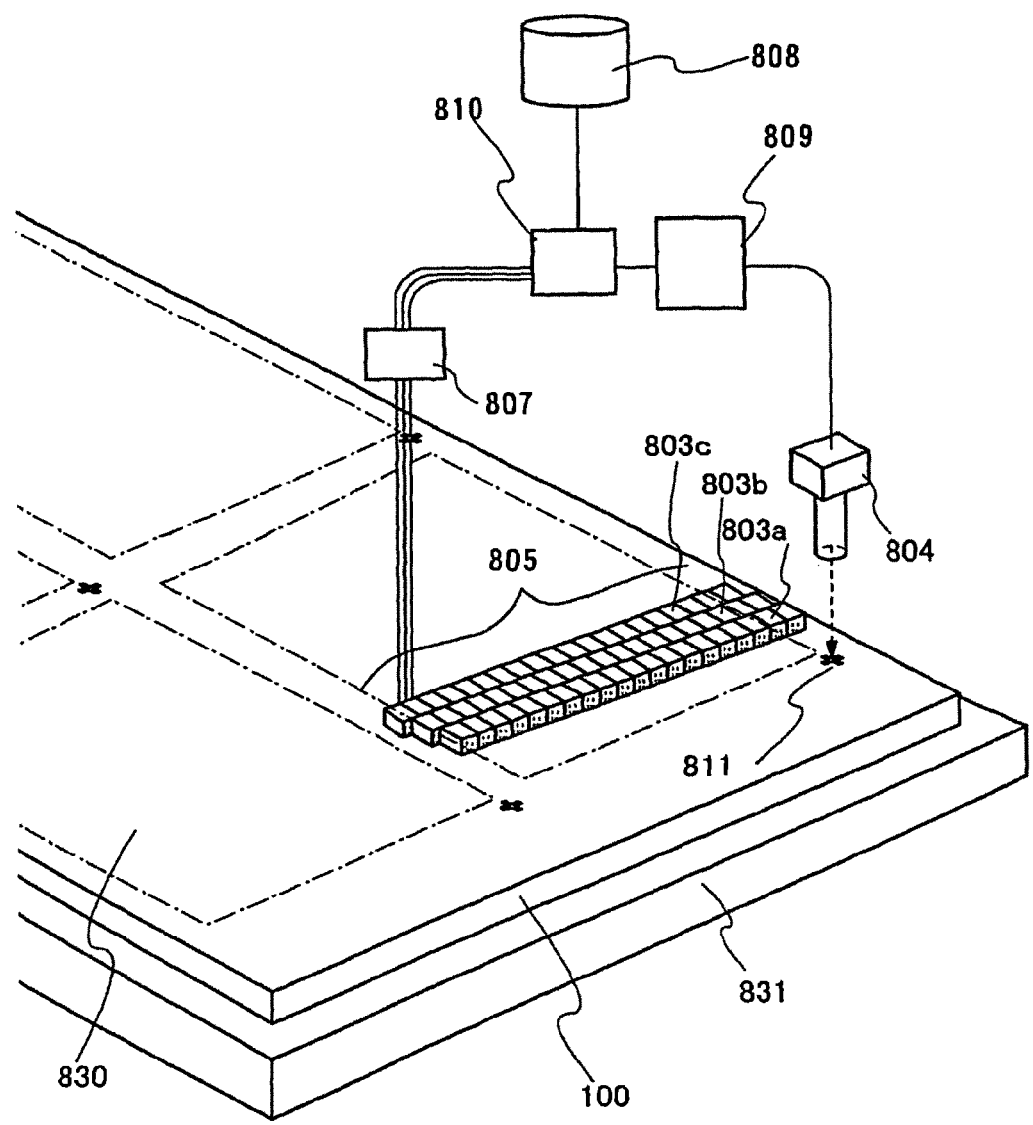
FIG. 17 shows a droplet discharge system of the invention.

In this embodiment mode, a droplet discharge system which can be used for forming a pattern in the above embodiment mode will be described. In FIG. 17, an area 830 on a large substrate 100 to be provided with a panel is shown by dotted lines.

In FIG. 17, a mode of a droplet discharge system used for forming patterns of such as a wiring is shown. A droplet discharge means 805 has a head 803, and the head 803 has a plurality of nozzles 204. In this embodiment mode, the case of using a droplet discharge means provided with three heads (803a, 803b, and 803c) each having 10 nozzles will be described. The number of nozzles or the number of heads can be determined depending on the area to be treated or the steps.

The head 803 is connected to a control means 807, and the control means is controlled by a computer 810; thus, a predetermined pattern can be formed. The patterning may be carried out from a starting point, for example, from a marker 811 formed over a substrate 100 secured on a stage 831 or the like. Alternatively, the patterning may be carried out from using the edge of the substrate 100 as a starting point. The starting point is detected with an imaging means 804 such as a CCD, and the information is converted into a digital signal by an image processing means 809. The converted digital signal is recognized by the computer 810, and a control signal is generated and transmitted to the control means 807. When a pattern is thus applied, the distance between the end of the nozzles and the surface where a pattern is to be formed may be 0.1 cm to 5 cm, preferably 0.1 cm to 2 cm, more preferably around 1 mm. As thus the distance is reduced, the accuracy of droplet application can be improved.

Hereupon, the information of the pattern formed over the substrate 100 is stored in a storage medium 808. A control signal is sent to the control means 827 based on the information; thus, each head of 803a, 803b, and 803c can be controlled individually. Accordingly, droplets containing different materials can be discharged from each nozzle included in the head of 803a, 803b, and 803c. For example, nozzles of heads 803a and 803b may discharge droplets containing an insulating material, and nozzles of the head 803c may discharge droplets containing a conductive material.

Further, each nozzle of the head 803a can be controlled individually. Since nozzles can be controlled individually, droplets containing different materials can be discharged from respective nozzles. For example, the one head 803a can be provided with both nozzles for discharging a conductive material and nozzles for discharging an insulating material.

Further, in the case of discharging droplets on a large area of such as an interlayer insulating film, droplets containing a material of the interlayer insulating film may be discharged from all the nozzles. Further, the material of the interlayer insulating film may preferably be discharged from all the nozzles of the plurality of heads. Thus, the throughput can be improved. Naturally, in the step of forming interlayer insulating film, the droplets containing a material of the interlayer insulating film may be discharged from one nozzle, and the movement of discharge may be repeated in order to perform a droplet discharge treatment over a large area.

A pattern is formed on a large mother glass by zigzagging or reciprocating the droplet discharge means 803. Here, the head and the substrate may be relatively moved more than once. In the case of moving the head over the substrate, the head may preferably be inclined against the moving direction.

In the case of obtaining a plurality of panels from a large mother glass substrate, the width of the head 803 may preferably be almost equal to the width of one panel. The area 830 where the one panel is formed can be provided with a pattern by a single movement; thus, high throughput can be expected.

The width of the head may be less than the width of one panel. In this case, a plurality of small heads is arranged in series to have a width almost equal to the one panel. When a plurality of small heads is arranged in series instead of using a wider head, the deflection of the head can be prevented. Naturally, the pattern can be formed by moving a plurality of small heads a plurality of times.

Such a process of discharging droplets of a composition by a droplet discharge method may be preferably performed under reduced pressure. After the composition is discharged and before the composition reaches a subject, the solvent of the composition is evaporated; thus, steps of drying and baking the composition can be skipped. If the process is performed under reduced pressure, an oxide film or the like is not formed on the surface of the conductor, which is preferable. The process of applying the composition may be performed in a nitrogen atmosphere or an organic gas atmosphere.

As a droplet discharge method, a piezo system may be employed. The piezo system is also used in ink-jet printers since controllability of droplets is high and kinds of ink can be selected freely. The piezo system has two types: a MLP (Multi Layer Piezo) type and a ML Chip (Multi Layer Ceramic Hyper Integrated Piezo Segments) type. Alternatively, a droplet discharge method using what is called a thermal method in which a heating element is heated to generate bubbles thereby extruding a solution may be used depending on the solvent of the composition.

Embodiment Mode 11

Figure 42:
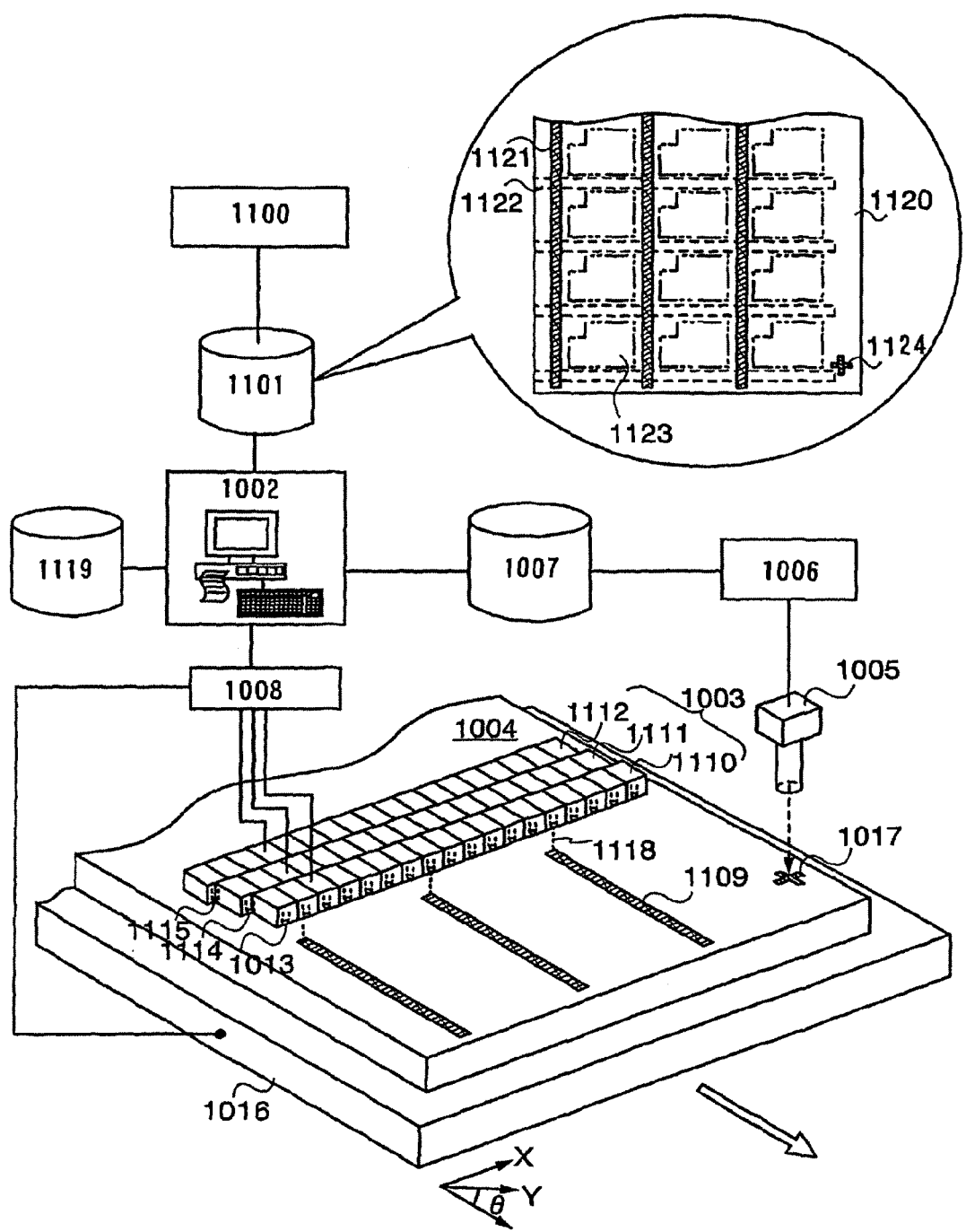
FIG. 42 explains a droplet discharge system of the invention.

A thin film transistor or a display device having the thin film transistor according to the present invention is preferably formed with a droplet discharge system shown in FIG. 42. Firstly, a circuit is designed with a circuit design tool 1100 such as CAD, CAM, CAE, or the like, and desired layout of a thin film and an alignment marker is determined.

Data 1101 of a thin film pattern including designed layout of a thin film and an alignment marker is inputted into a computer 1002 for controlling a droplet discharge system via an information network such as a memory medium or a LAN (Local Area Network). Based on the data 1101 of a thin film pattern, a nozzle having a discharge opening with an optimum diameter, which stores a composition including a material for forming the thin film, or which is connected to a tank for storing the composition, is selected from the nozzles (devices for spraying liquids or gasses from a fine-ended opening) of a droplet discharge means 1003; then, a moving path of the droplet discharge means 1003 is determined. In the case where the optimum nozzle has been determined in advance, only a moving path of the nozzle may be determined.

An alignment marker 1017 is formed over a substrate 1004 to be provided with the thin film by photolithography or with the use of laser light. The substrate provided with an alignment marker is disposed on a stage 1016 in the droplet discharge system, and the position of the alignment marker is detected by an imaging means 1005 installed in the device, then, it is inputted as location information 1007 into the computer 1002 via an image processing device 1006. The computer 1002 verifies the data 1101 of the thin film pattern designed by CAD or the like and the location information 1007 obtained by the imaging means 1005 to conduct alignment of the substrate 1004 and the droplet discharge means 1003.

Thereafter, the droplet discharge means 1003 or an XYθ stage 1016 controlled by a controller 1008 is moved along with a determined moving path (in the direction indicated by an arrow) to discharge a composition; thus, a desired thin film pattern 1109 is formed. The discharge quantity of the composition to be discharged can be appropriately controlled by selecting the diameter of the discharge opening. Note that the discharge quantity is slightly varied by several conditions such as the moving speed of the discharge opening, the distance between the discharge opening and the substrate, the discharging speed of a composition, the atmosphere of the discharging space, the temperature or the humidity of the discharging space. Hence, it is also desired to control these conditions. Optimum conditions are preferably identified in advance by experiments or evaluations, and these results are preferably databased (1119) per materials of the composition.

As a thin film pattern data, a circuit diagram or the like of a module TFT substrate used for such as a liquid crystal display device, a light-emitting device, or the like can be nominated. A circuit diagram in a circle in FIG. 42 is a schematic view, for showing a conductive film used for such the module TFT substrate. Reference numeral 1121 denotes a so-called gate wiring; 1122, a source signal line (second wiring); 1123, a pixel electrode, or a hole injecting electrode or an electron injecting electrode; 1120, a substrate; and 1124, an alignment marker. Of course, a thin film pattern 1109 corresponds to the gate wiring 1121 in thin film pattern information.

Further, the droplet discharge means 1003 has, but not exclusively, an integrated combination of nozzles 1110, 1111, and 1112. Each nozzle has a plurality of discharge openings 1013, 1114, and 1115. The foregoing thin film pattern 1109 is formed by selecting a predetermined discharge opening 1013 in the nozzle 1110.

The droplet discharge means 1003 is preferably provided with a plurality of nozzles having different discharge opening diameters, discharge quantity, or nozzle pitches to be able to manufacture thin film patterns having various line widths and to improve tact time. The distances between the discharge openings are preferably small as possible. Further, a nozzle having a length of 1 m or more is preferably provided in the droplet discharge means 1003 to conduct high throughput discharging over a substrate having a size of from 1 m×1 m or more, or a twice or three times as large as that. The droplet discharge means 1003 may be retractable to freely control the distance between the discharge openings. To obtain high resolution, that is, to depict a smooth pattern, the nozzle or a head is preferably inclined. Accordingly, the drawing on a large area such as a rectangular area becomes possible.

Nozzles having different nozzle pitches of the head may be provided in one head in parallel. In this instance, discharge opening diameters may be the same or different.

In the case of the droplet discharge system having a plurality of nozzles as above, it is required to provide a waiting position for a nozzle not in use. The waiting position can be provided with a gas supply means and a showerhead to substitute the atmosphere in the waiting position for the atmosphere that is the same as the gas of a solvent of the composition. Accordingly, the desiccation can be prevented in a measure. Moreover, a clean unit or the like that supplies clean air to reduce dust in a work place may be provided.

In the case where the distances between discharge openings can not be narrowed due to the specifications of the nozzles, the nozzles may be designed to have a pitch of integral multiple of a pixel in a display device. Therefore, the composition can be discharged over the substrate by moving the nozzle.

As the imaging means 1005, a camera using an active element such as a CCD (charge coupled device) that converts the intensity of light to an electric signal can be used.

The foregoing method is to scan the substrate 1004 on a fixed stage 1016 by the droplet discharge means 1003 along with the determined path in order to form the thin film pattern 1109. Meanwhile, the thin film pattern 1109 may be formed in the procedure, in which the droplet discharge means 1003 is fixed, and the stage 1109 is transported in XYθ directions along with the path determined by the data 1101 of a thin film pattern. In the case where the droplet discharge means 1003 has a plurality of nozzles, it is required to select a nozzle having a discharge opening with an optimum diameter, which stores a composition containing a material for forming the thin film or which is connected to a tank for storing the composition.

In the foregoing method, the thin film pattern 1109 is formed by a droplet discharge method using only one predetermined discharge opening of the nozzle 1110. Alternatively, the composition may be discharged by using a plurality of discharge openings depending on the line width or the thickness of a film to be formed.

Further, extra nozzles may be used. For example, while the nozzle 1012 (or 1111) discharges a composition firstly, discharge conditions may be controlled so that the nozzle 1110 discharges the same composition as the nozzle 1012 (or 1111). Accordingly, the composition can be discharged from the back nozzle 1110 in case that the front nozzle 1012 has some troubles such as clogging in the discharge openings; thus, it becomes possible at least to prevent wirings from breaking or the like.

By controlling the discharge conditions in such a way that a composition is discharged from a plurality of nozzles having different discharge opening diameters, a flat thin film can be formed in a shorter tact time. The method is suitable for forming a thin film, which is formed by discharging a composition over a large area, and which is required to be planarized, such as a pixel electrode especially in an LCD.

Further, of the discharge conditions are controlled so that a composition is discharged from a plurality of nozzles having different discharge opening diameters; thus, wiring patterns with different line widths can be formed at once.

Further, in this case, an opening having a high aspect ratio provided in a part of an insulating film can be filled with the composition. According to this method, a flat wiring can be formed without creating voids (like insect holes created between the insulating film and the wiring).

As above mentioned, a droplet discharge system used for forming a thin film or a wiring includes an input means for inputting data for showing a thin film pattern; a setting means for setting a moving path of a nozzle for discharging a composition containing a material for forming the thin film; an imaging means for detecting an alignment marker formed over a substrate; and a control means for controlling the moving path of the nozzle. A moving path of a nozzle on a substrate in droplet discharging is required to be accurately controlled. By installing a program for controlling conditions of discharging of a composition to a computer for controlling the droplet discharge system, conditions such as a moving speed of a substrate or a nozzle, discharge quantity, a spray distance, spray speed, a discharge atmosphere, discharge temperature, discharge humidity, temperature for heating a substrate, and the like can be accurately controlled depending on a composition to be discharged and its pattern.

Accordingly, high throughput manufacture in a short tact time of a thin film or a wiring having a desired width, thickness, and form can be precisely realized at a desired portion. Moreover, manufacturing yields of a semiconductor element such as a TFT manufactured by using the thin film or the wiring; a light-emitting device such as a liquid crystal display (LCD) or an organic electroluminescent display manufactured by using the semiconductor element; an LSI; or the like can be improved. Especially, according to the present invention, a thin film pattern or a wiring pattern can be formed at any portion; and the width, thickness, and form of the pattern can be controlled. Therefore, an active element substrate having large area can be manufactured at low costs in high yields.

Embodiment Mode 12

In this embodiment mode, an embodiment mode using the foregoing droplet discharge system will be explained with reference to FIGS. 43A to 48D.

Figure 43A:
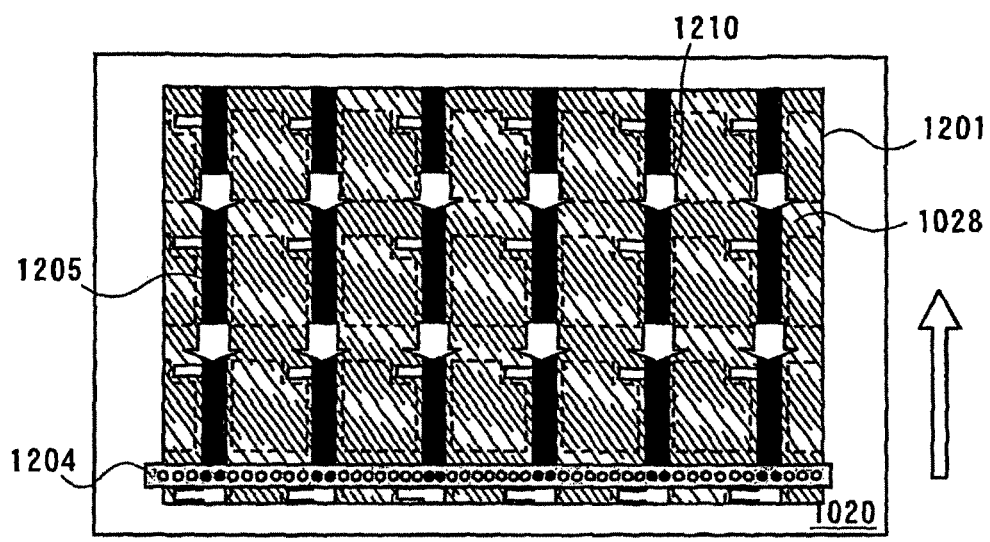
FIGS. 43A and 43B each explain a discharge method of a material which is discharged by the combination of continuous discharging and intermittent discharging.
Figure 43B:
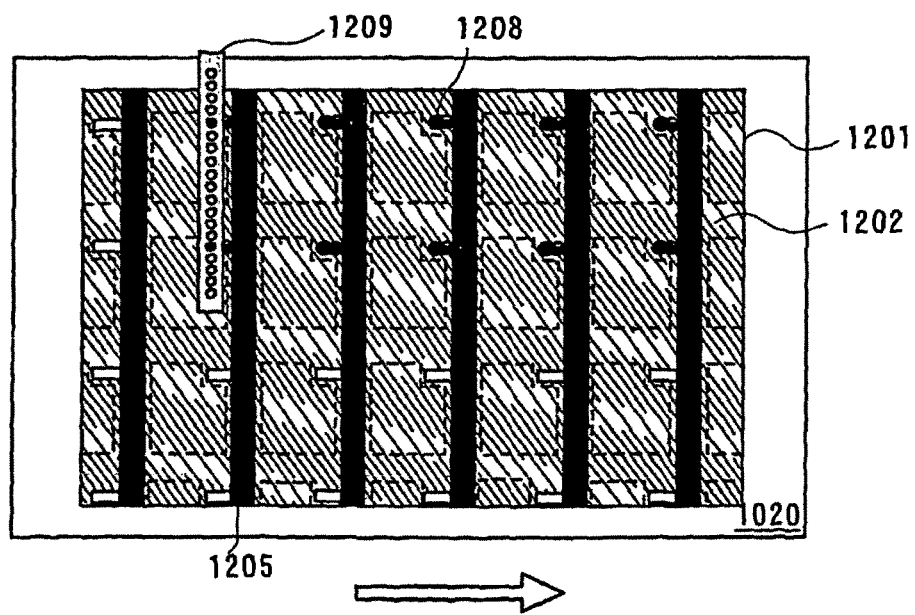

FIGS. 43A and 43B show a method for manufacturing a gate electrode layer by using a continuous discharge nozzle 1204 and an intermittent discharge nozzle 1209. Relatively thick wirings such as a gate wiring or a capacitor wiring are firstly formed by using the continuous discharge nozzle 1204. Since a first insulating layer 1028 is formed over a substrate 1201, a moving path of a stage 1020 carrying the substrate or nozzles is controlled to discharge a composition containing a conductive material over a gap in the first insulating layer 1202. For example, the stage 1020 is controlled to move in the arrow direction. By using the continuous discharge nozzle 1204, a wiring 1205 can be formed into a noodle shape, and the tact time can be reduced. Further, a conductive material discharged from the both nozzles may be the same or different.

As shown in FIG. 43B, after forming the wiring 1205, an electrode portion 1208 is formed by using the intermittent discharge nozzle 1209. In this instance, the stage 1020 is controlled to move in the arrow direction. Further, a cross line (electrode portion) can easily be formed by discharging when to the wiring 1205 is irradiated with UV light 1210 before forming the electrode portion 1208.

Figure 44:
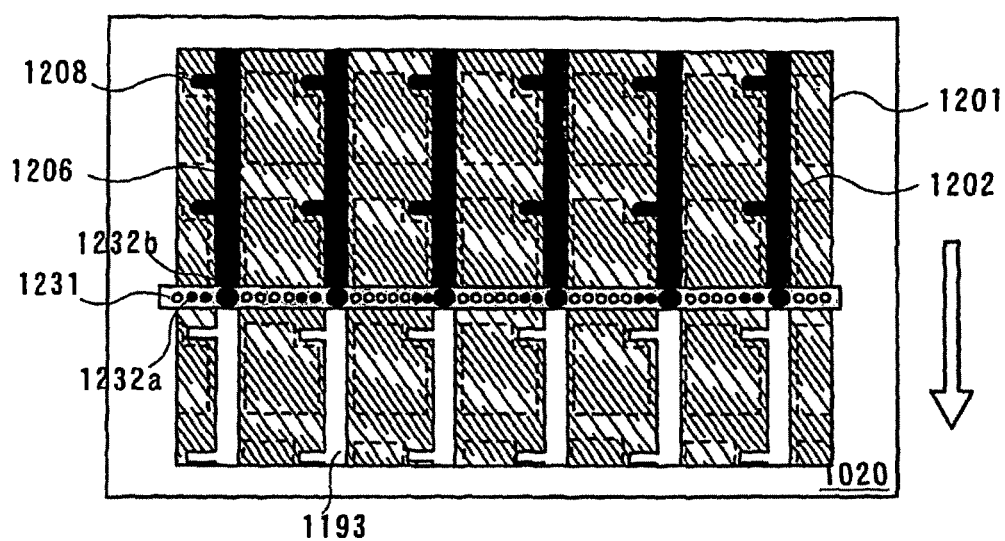
FIG. 44 explains a discharge method with the use of conjugated nozzles according to the invention.

FIG. 44 shows a method for simultaneously forming the wiring 1206 and the electrode portion 1208 by a nozzle 1231 that is formed by combining the intermittent discharging opening 1232a and the continuously discharging opening 1232b. Here, FIG. 44 shows that a nozzle 1231 that is movable is moved in the arrow direction; alternatively, the stage 1200 may be moved.

Figure 45:
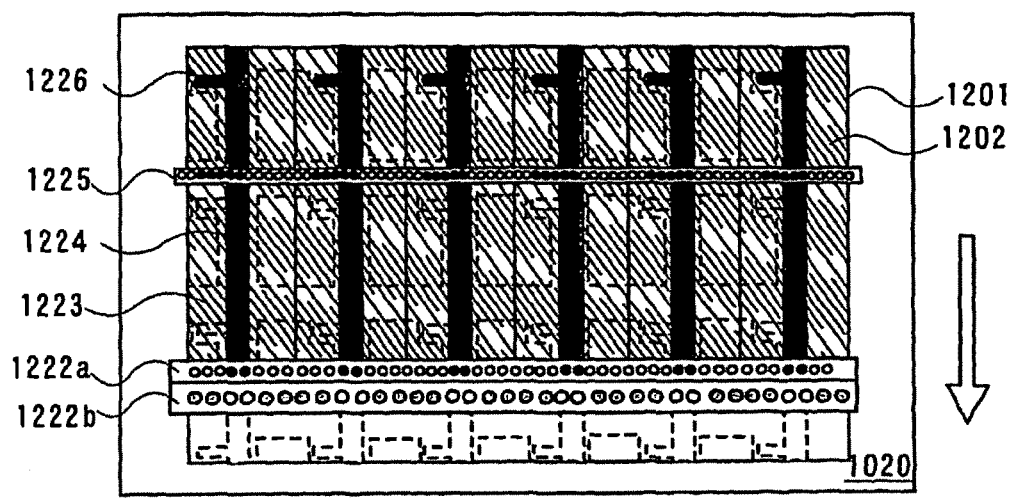
FIG. 45 explains a method for consecutively discharging different materials according to the invention.

FIG. 45 shows that a method for forming simultaneously a gate electrode layer and a first insulating film using a nozzle that is formed by combining the continuously discharging nozzles 1222 and the intermittent discharging nozzle 1225. In this instance, a composition containing a conductive material for composing a wiring is discharged from a nozzle 1222a, and resin for composing the first insulating film is discharged from a nozzle 1222b. A composition containing a conductive material that is the same or different from that for composing a wiring is discharged from the intermittent discharging nozzle 1225 to form an electrode portion. Further, Here, FIG. 45 shows that the nozzles 1222 and 1225 that are movable are moved in the arrow direction; alternatively, the stage 1200 may be moved.

Figure 46A:
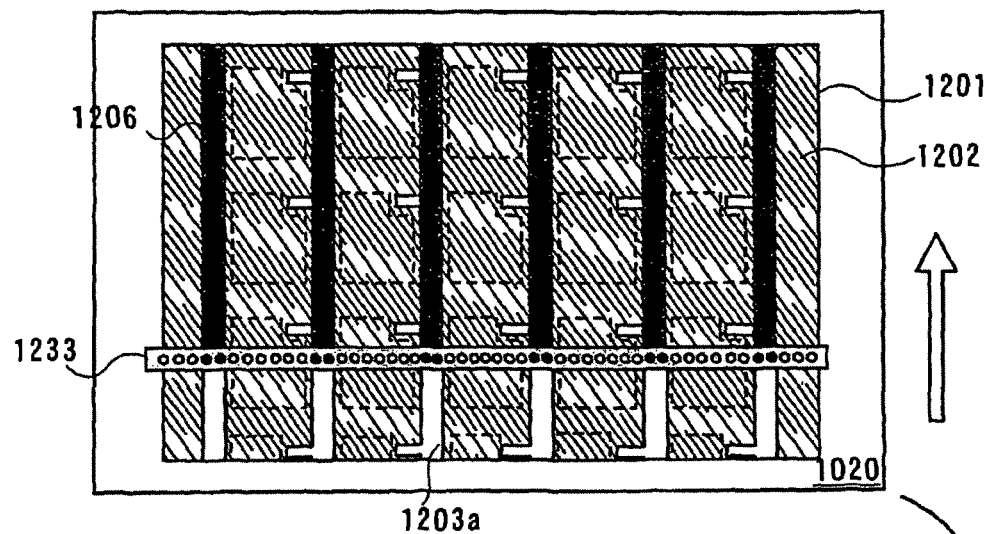
FIGS. 46A and 46B explain embodiments in which, after a substrate stage is rotated, a conductive material is discharged to form a conductive film according to the invention.
Figure 46B:
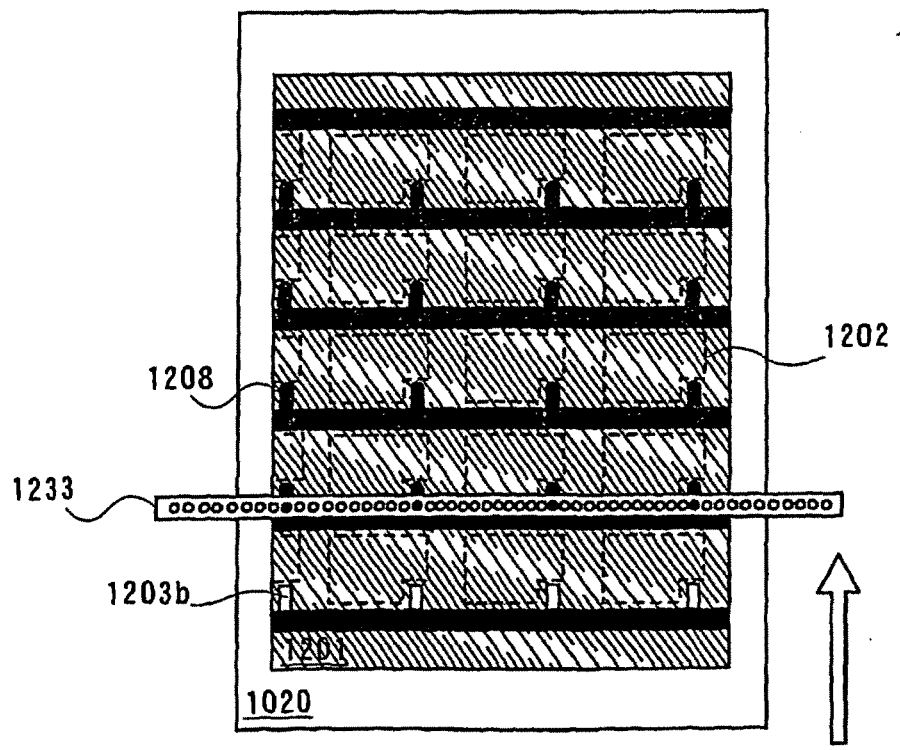

FIGS. 46A and 46B show a method for forming the wiring 1206 and the electrode portion 1208 by using a single fixed nozzle 1233. Firstly, a stage is transported in a definite direction (arrow direction) to form the wiring 1206 by continuous droplet discharging. Secondly, as shown in FIG. 46B, the stage is rotated as indicated by an arrow, and the stage is transported in a definite direction (arrow direction) to form the electrode portion 1208 by intermittent discharging. Hence, the fixed nozzle 1233 is required to be designed to be capable of continuously discharging and intermittently discharging.

Figure 47A:
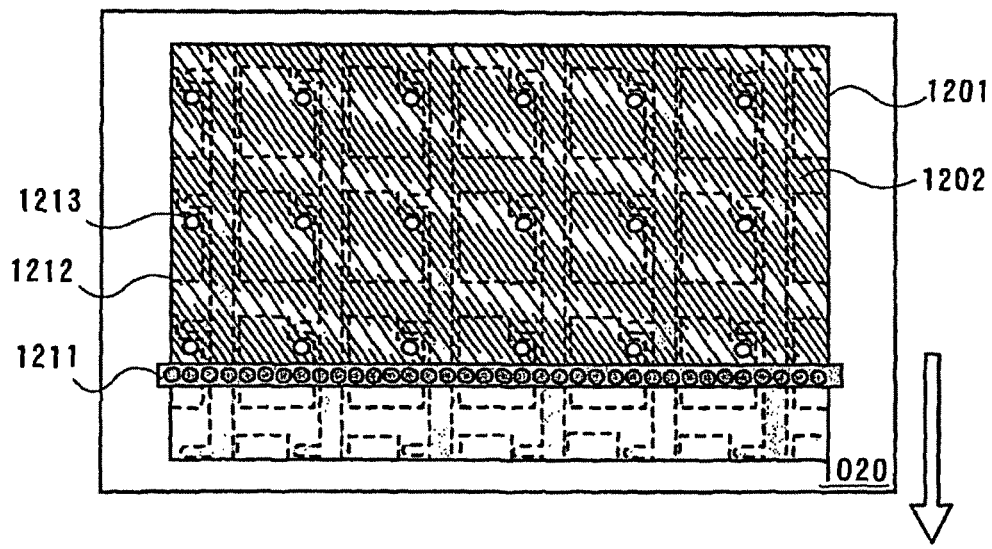
FIGS. 47A and 47B explain a method for discharging different materials by the combination of continuous discharging and intermittent discharging.
Figure 47B:
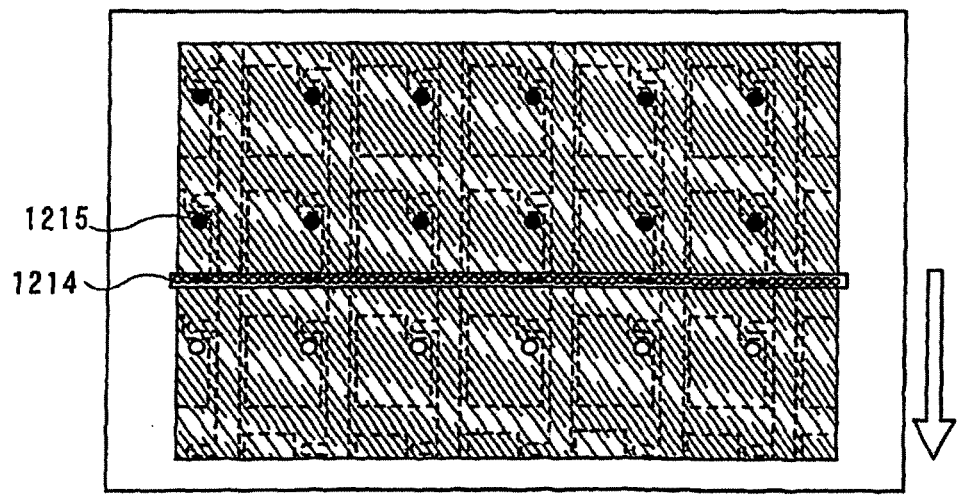

FIGS. 47A and 47B show a method for forming a conductor at a contact hole with an intermittent discharge nozzle 1214 while forming an interlayer insulating film or a planarizing film (third insulating layer) in a region except the contact hole with a continuous discharge nozzle 1211. In the case of forming the insulating layer with the use of the continuous discharge nozzle 1211 in a region except the contact hole, it is required to control a discharge opening over the contact portion to close. Further, FIGS. 47A and 47B show that nozzles 1211 and 1214 that are movable are moved in the arrow direction; alternatively, the stage 1200 may be moved.

Figure 48A:
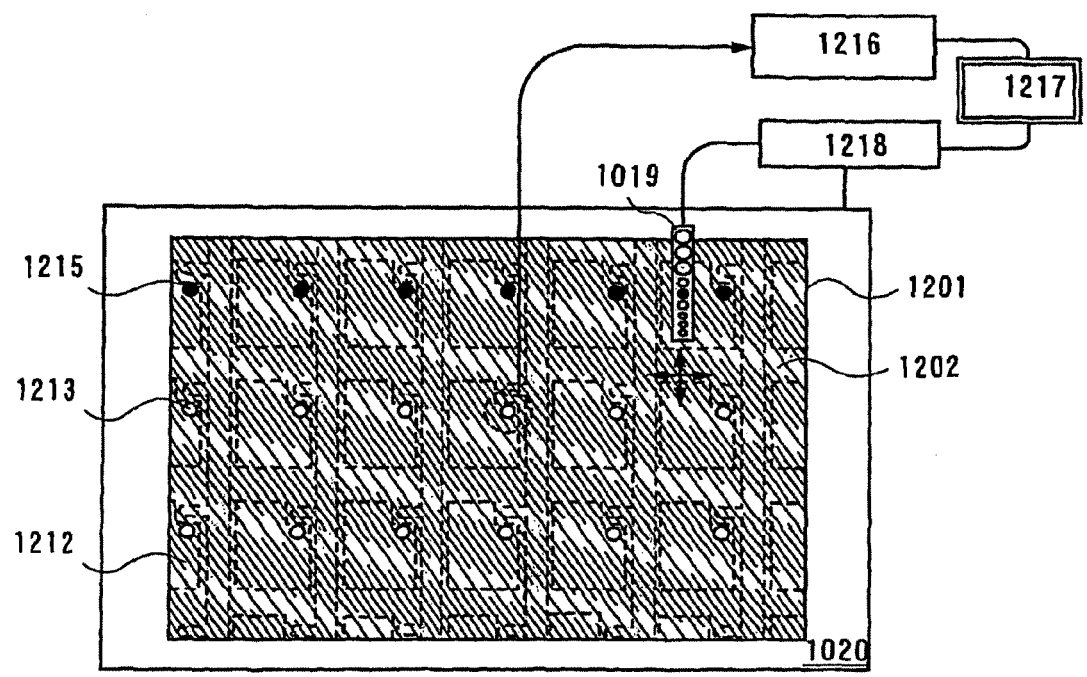
FIGS. 48A and 48B explain a method for discharging different materials by the combination of continuous discharging and intermittent discharging.

As another method for forming a conductor in the contact hole, as shown in FIG. 48A, a contact hole is detected by using a hole detection means 1216, a CPU 1217, and a controller 1218; and a nozzle 1019 is controlled based on the location information; then, a composition is discharged. Alternatively, the breaking of the wiring or the electrode portion may be repaired using the same principle.

Figure 48B:
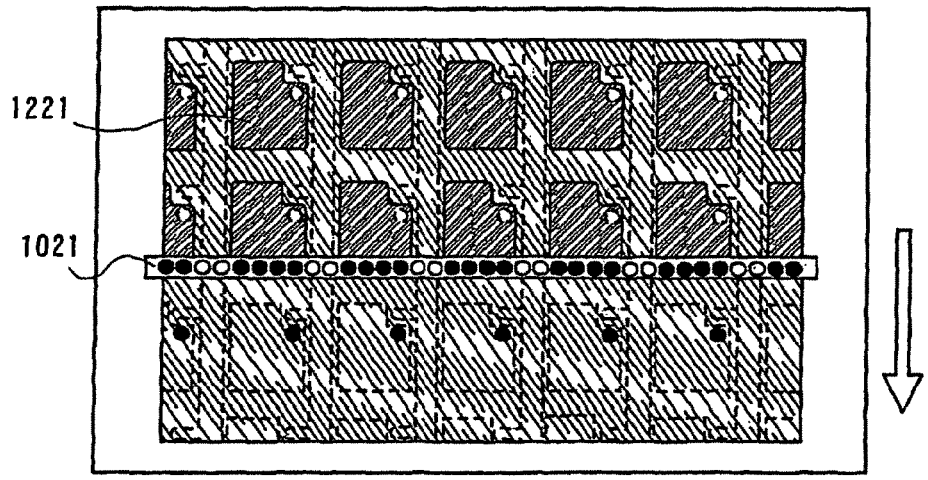

After forming the conductor at the contact hole, a pixel electrode is formed by continuous discharging or intermittent discharging (FIG. 48B). Further, FIG. 48B shows that a nozzle 1021 that is movable is moved in the arrow direction; alternatively, the stage 1020 may be moved.

By using and controlling a nozzle that can continuously discharge or intermittently discharge, or a nozzle using the combination of both continuously discharge and intermittent discharge, a desired pattern can be formed in a shorter tact time irrespective of the discharge composition or the discharge timing. In the case of using a large substrate, a desired pattern can be formed in a shorter tact time by designing a nozzle so as to move over a plurality of spots on the substrate. Further, this embodiment mode can be freely combined with another embodiment mode.

Embodiment Mode 13

Figure 39:
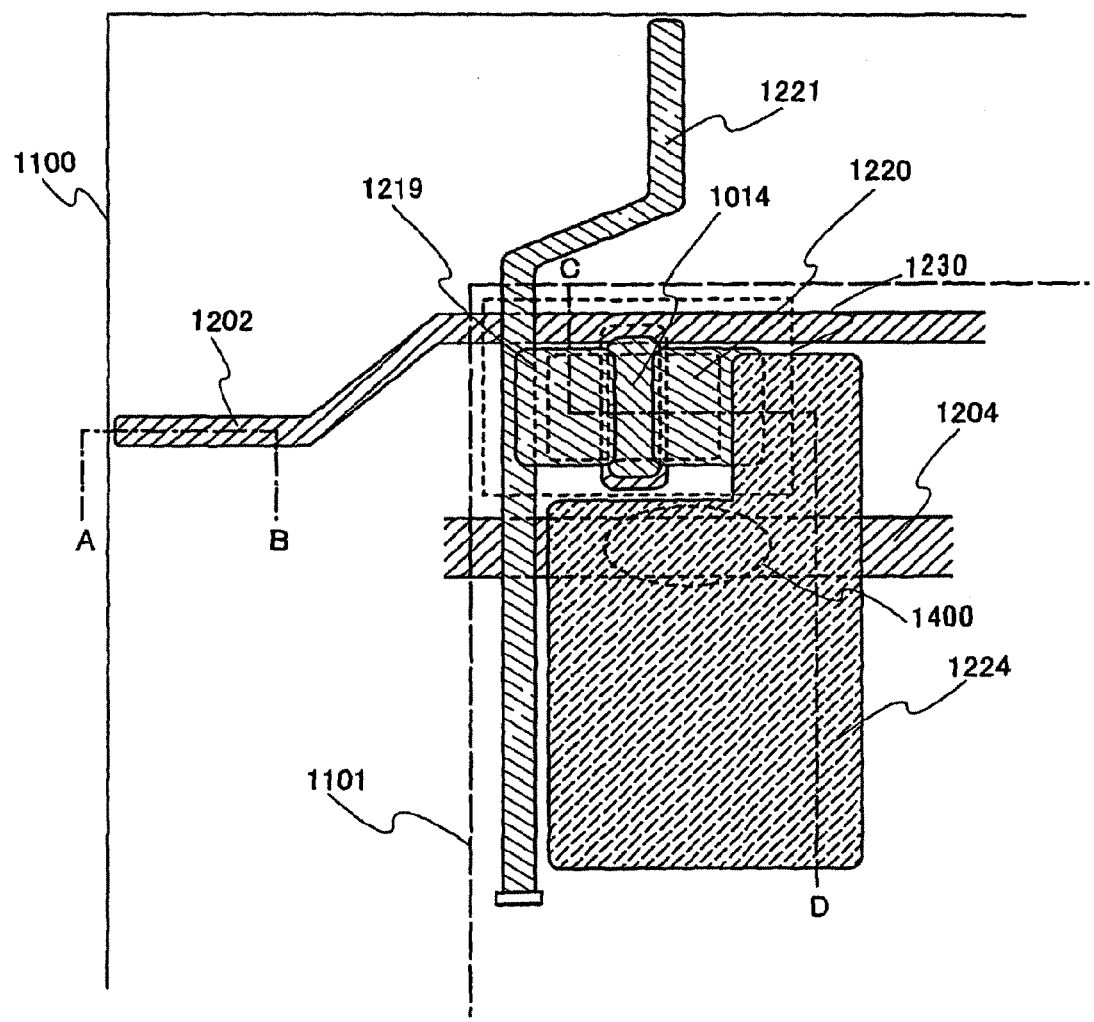
FIG. 39 is a top view of a pixel area of the invention.

FIG. 39 is a top view of a pixel area of an active matrix liquid crystal display device according to the present invention. A gate electrode 1014 of a thin film transistor 1230 is connected to a scan line 1202, a source electrode 1219 is connected to a signal line 1221, and a drain electrode 1220 is connected to a pixel electrode 1224. FIGS. 23 to 24 are process drawings of FIG. 39 taken along line C-D for showing the case where a channel protective TFT is used as the thin film transistor 1230.

Figure 23A:
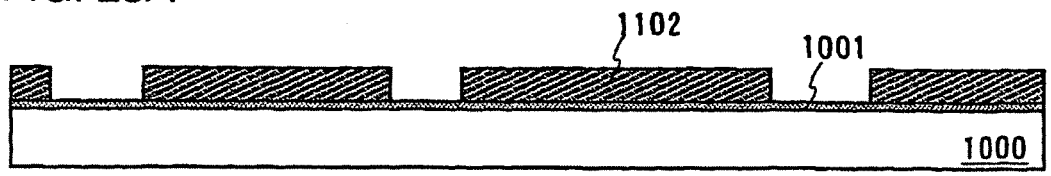
FIGS. 23A to 23E show manufacturing steps of an active element (channel protective type) according to the invention.

A portion of a substrate 1000 over which at least a gate electrode layer is formed is pretreated. Here, a titanium (Ti) film is formed to have a thickness of 1 nm to 5 nm, and the film is baked at 230° C. in the presence of nitrogen to obtain a titanium oxide film 1001 (FIG. 23A). Further, the thickness and the baking conditions are not limited thereto. Instead of Ti, a so-called 3d transition element such as Sc (scandium), V (vanadium), Cr (chromium), Mn (manganese), Fe (iron), Co (cobalt), Ni (nickel), Cu (copper), or Zn (zinc); or an oxide, a nitride, or an oxynitride of W (tungsten), Al (aluminum), Ta (tantalum), Zr (zirconium), Hf (hafnium), Ir (iridium), Nb (niobium), Pd (palladium), or Pt (platinum) may be used. In the case of directly forming the foregoing metals, it is required that a region except the portion provided with the gate electrode layer is insulated by being removed, being oxidized, being nitrided, or being oxynitrided. Alternatively, for example, the oxidized, nitrided, or oxynitrided foregoing metals may be formed selectively or directly all over a substrate by spraying or the like. A titanium oxide is known as a photocatalytic substance. Further, a photocatalytic substance such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), ferric oxide ($Fe_2O_3$), or tungsten oxide ($WO_3$) can be used. Moreover, besides a material containing these metals as main components, heat resistant resin such as polyimide, acrylic, or siloxane may be formed; or plasma treatment (preferably, with atmospheric plasma) may be carried out. By such the base pretreatment, the adhesion between the substrate 1000 and the gate electrode layer can be improved. Especially in the case of forming a titanium oxide, light transmittance can be increased. The foregoing base pretreatment can be skipped; however, the foregoing base pretreatment is carried out as much as possible to improve the adhesion between the substrate and the conductive film.

Then, in the case of carrying out the foregoing base pretreatment, a first insulating layer (resin pattern) 1102 for forming patterns of a gate wiring 1103, a gate electrode 1104, and a capacitor wiring 1105 over the substrate 1000 or above the portion that is pretreated (FIG. 23A). The insulating layer 1102 is formed in accordance with the procedure, in which photosensitive resin such as photosensitive polyimide, photosensitive acrylic, or photosensitive siloxane is coated all over the substrate by spin coating, dip coating, spraying, or the like; and the coated resin is solidified by baking; then, the solidified resin is exposed and developed. Further, the transparent photosensitive resin is not limited thereto; it is preferable that the transparent photosensitive resin has heat resistance capable of resisting the temperature in drying and baking processes carried out after forming the conductive material.

In the case of using transparent resin that is not photosensitive, the first insulating layer 1102 may be formed in accordance with the procedure in which the transparent resin is coated preliminarily all over a substrate; a photoresist is formed; and the formed layer is exposed and developed. Further, in the case where the first insulating layer 1102 does not transmit light, for example, in the case of a reflective liquid crystal display device utilizing light entered from the top of a TFT, the resin is not required to be transparent. For example, the first insulating layer 1102 may be formed in accordance with the procedure in which a photoresist is formed all over a substrate, and the formed photoresist is exposed and developed. As the photoresist, either a negative type (an exposed portion is left as a pattern after development) photoresist, or a positive type (a non exposed portion is left as a pattern after development) can be used. Instead of the insulating layer 1102, a transparent or an opaque inorganic film, each of which can be formed into a pattern, can be used.

Figure 23B:
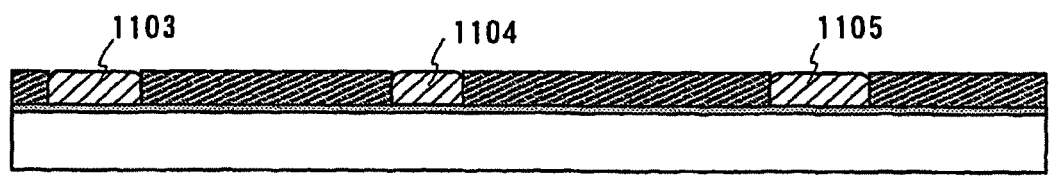

By discharging a composition containing a first conductive material over a gap in the first insulating layer 1102, the gate wiring 1103, the gate electrode 1104, and the capacitor wiring 1105 (hereinafter, they may be referred to as a gate electrode layer as its generic term) are formed (FIG. 23B). The gate electrode layer is formed by discharging the composition; and drying the composition at 100° C.; then, baking the composition under nitride or oxide atmosphere at 200° C. to 350° C. for 15 to 30 minutes. However, it is not limited to the foregoing conditions.

As the first conductive material, various materials can be selected depending on the function of the conductive film. As typical examples, silver (Ag), copper (Cu), gold (Au), nickel (Ni), platinum (Pt), chrome (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), antimonial lead, antimony tin oxide, fluorine doped zinc oxide, carbon (C), graphite, glassy carbon, lithium (Li), beryllium (Be), sodium (Na), magnesium (Mg), potassium (k), calcium (Ca), scandium (Sc), manganese (Mn), zirconium (Zr), gallium (Ga), niobium (Nb), sodium, sodium-potassium alloy, a magnesium/copper mixture, a magnesium/silver mixture, a magnesium/aluminum mixture, a magnesium/indium mixture, an aluminum/aluminum oxide mixture, a lithium/aluminum mixture, particles of silver halide or dispersible nanoparticles can be used. Further, indium tin oxide (ITO), zinc oxide (ZnO), zinc oxide added with gallium (GZO), or indium zinc oxide (IZO) in which 2% to 20% of zinc oxide is mixed into indium oxide, organic indium can be used for transparent conductive film. Still further, organotin or titanium nitride can be used for the conductor.

Here, the gate wiring 1103, the gate electrode 1104, and the capacitor wiring 1105 are formed from the same material. Alternatively, different material may be appropriately used depending on line widths or lengths of the gate wiring 1103, the gate electrode 1104, and the capacitor wiring 1105. For example, an inexpensive material such as copper (Cu) or aluminum (Al) is used for the gate wiring 1103 or the capacitor wiring 1105 (each of which corresponds to 1202, 1204, respectively in FIG. 39) having a relatively large area, and silver (Ag) having low resistance is used for the gate electrode 1104.

Here, after forming the first insulating layer 1102, the gate electrode layer is formed so as to be fitted in the first insulating layer 1102. Alternatively, the first insulating layer 1102 and the gate electrode layer may be formed simultaneously by a droplet discharge method. Further alternatively, the first insulating layer 1102 may be formed in accordance with the following procedure in which a composition for composing the first insulating layer 1102 is discharged, and a composition for composing the gate electrode layer before the composition for the first insulating layer 1102 is dried and solidified (or after temporary bake), then, the both discharged compositions are dried and baked. In this instance, the steps of exposing and developing can be skipped; thus, the number of manufacturing steps can be drastically reduced. In the case of forming both of the first insulating layer 1102 and the gate electrode layer simultaneously, different kinds of materials are simultaneously discharged from a plurality of nozzles having different discharge opening diameters can be used as shown in FIG. 45.

Figure 56A:
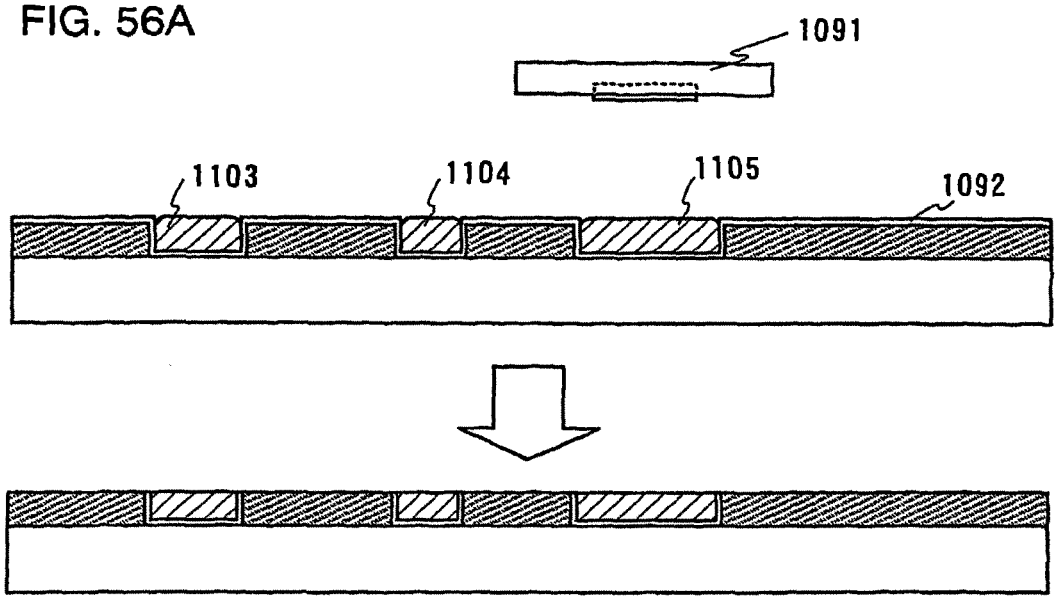
FIGS. 56A and 56B each show a method for forming a titanium film or a titanium oxide film according to the invention.
Figure 56B:
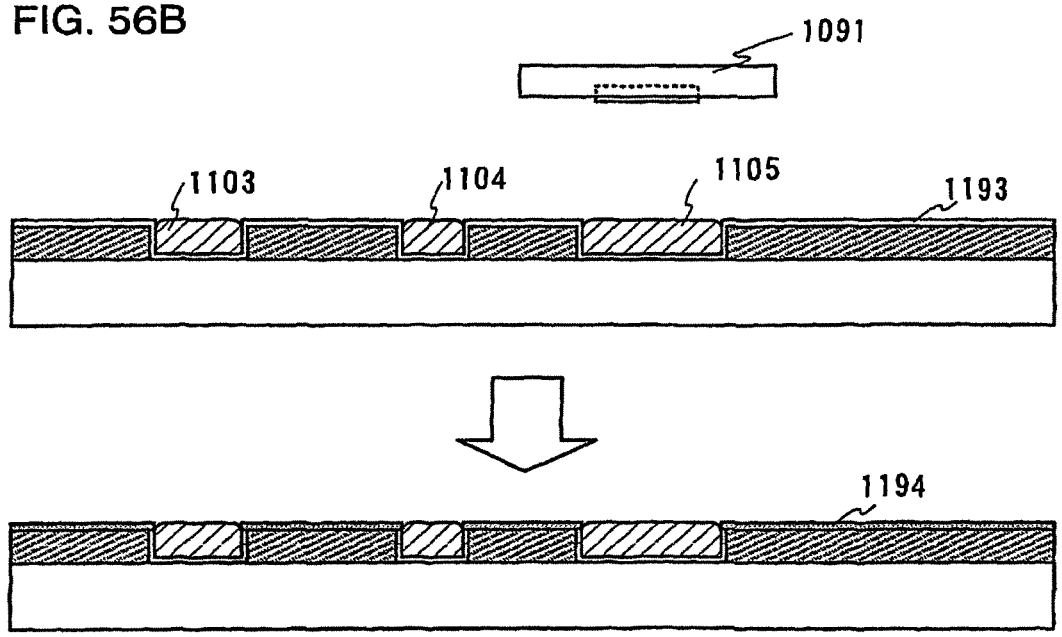

Here, the first insulating layer 1102 is formed after forming the titanium oxide layer 1001. Alternatively, as shown in FIGS. 56A and 56B, a titanium film 1092 may be formed after forming the first insulating layer 1102, and the gate electrode layer may be formed by using a nozzle 1091 used as a droplet discharge means, and then, the titanium film 1092 is etched away (FIG. 56A), or a portion except the gate electrode layer of the titanium film 1092 is oxidized to be insulated (FIG. 56B). Here, in the case of FIG. 56B, the gate electrode layer can be baked simultaneously with baking the titanium film 1092 to form the titanium oxide film 1194. In addition, the gate electrode layer can be smoothed and planarized. This method can be adopted in the case of forming another conductive film.

The diameter of a nozzle used for the foregoing droplet discharge means is set from 0.1 μm to 50 μm (preferably, 0.6 μm to 26 μm), and the discharge quantity is set from 0.00001 pl to 50 pl (preferably, 0.0001 pl to 40 pl). The discharge quantity is increased with the increase in the diameter of a nozzle. A subject and a discharge opening of a nozzle is preferably close to each other as possible to deliver droplets to a desired portion. The distance between the subject and the discharge opening is preferably set approximately from 0.1 mm to 2 mm. The discharge quantity can be controlled by changing a pulse voltage applied to a piezoelectric element without changing the nozzle diameter. These discharge conditions are preferably set so that a line width is 10 μm or less.

In consideration of the resistivity, the composition discharged from a discharge opening is preferably formed by dissolving or dispersing a material of gold, silver, or copper in a solvent. More preferably, low resistant silver or copper may be used. In the case of using copper, a barrier film is preferably provided in order to prevent impurities. As the solvent, an organic solvent selected from esters such as butyl acetate or ethyl acetate; alcohols such as isopropyl alcohol or ethyl alcohol; methyl ethyl ketone; and acetone; or the like can be used. As the barrier film in the case of using copper for a wiring, an insulative or conductive substance containing nitrogen, such as silicon nitride, silicon oxynitride, aluminum nitride, titanium nitride, or tantalum nitride (TaN) can be used to form the barrier film by a droplet discharge method.

A composition used for droplet discharging has preferably viscosity of 300 mPa·s or less, preferably, 50 mPa·s or less, to prevent the composition from drying and to discharge the composition smoothly from a discharge opening. The viscosity, the surface tension, or the like of the composition may be controlled depending on a solvent or the use. As an example, a composition formed by dissolving or dispersing ITO, ITSO, organic indium, or organotin in a solvent has viscosity of from 5 mPa·s to 50 mPa·s, preferably, 15 mPa·s to 20 mPa·s, a composition formed by dissolving or dispersing silver in a solvent has viscosity of from 5 mPa·s to 20 mPa·s, and a composition formed by dissolving or dispersing gold in a solvent has viscosity of from 10 mPa·s to 20 mPa·s.

The diameter of a particle of a conductive material is preferably small as much as possible such as 0.1 μm or less to prevent clogging and to manufacture a fine whereas it depends on the diameter of each nozzle, a pattern form, or the like. A composition is formed by a known method such as an electrolytic method, an atomization method, or a wet-reduction method to have generally a grain diameter of approximately 0.5 μm to 10 μm. In the case where the composition is formed by a gas evaporation method, a nanoparticle protected by a dispersing agent has a minute diameter of approximately 7 nm. Further, the nanoparticle whose surface is covered with a coating agent can be stably dispersed in a solvent without aggregation at room temperature, which shows just like the behavior of liquid. Therefore, a coating agent is preferably used.

Alternatively, a gate electrode layer may be formed by discharging a composition containing a particle in which a material of a conductivity type covered with another conductive material. In this instance, a buffer layer is preferably provided between both of the conductive materials. For example, as shown in FIG. 49, the particle formed by covering Cu 1310 with Ag 1311 (FIG. 49A) may have the structure in which a buffer layer 1312 of Ni or NiB (nickel boron) is provided between the Cu 1310 and Ag 1311 (FIG. 49B).

By actively using a gas mixed with oxygen of 10% to 30% in a division ratio in a process for baking a composition containing a conductive material, the resistivity of a conductive film for forming the gate electrode layer can be reduced, and the conductive film can be formed into a thin and smooth film. An outline of the state of changes in a conductive film through a process for baking is given as follows. A composition containing a conductive material such as Ag (also referred to as nano paste) is formed by dispersing or dissolving a conductive material into an organic solvent. Besides, a dispersing agent or thermosetting resin referred to as binder is also contained in the organic solvent. Especially, the binder can prevent the nano paste from being cracked and being unevenly baked. By the drying and the baking processes, the organic solvent is evaporated, and a dispersing agent is decomposed to be removed, then, the nano paste is cured and contracted due to the binder, simultaneously. Accordingly, nano particles are fused with each other and the nano paste is cured. Simultaneously, the nano particles are grown to a size of from tens of nm to a hundred and tens of nm, and the adjoining growing nano particles are welded and linked together to form metallic bonds. On the other hand, most of the left organic ingredients (approximately 80% to 90%) are pushed out to the outside of the metallic bonds. As a result, a conductive film containing metallic bonds and a film formed of the organic ingredients covering the surface are formed. In baking the nano paste in the presence of nitrogen and oxygen, the film formed of organic ingredients can be removed by the reaction of the oxygen in the gas and carbon or hydrogen contained in the film formed by organic ingredients. In the case where oxygen is not contained in the baking atmosphere, the film formed of organic ingredients can be separately removed by oxygen plasma treatment or the like. As discussed above, the film formed of organic ingredients is removed in accordance with the procedure in which the nano paste is baked or dried in the presence of nitrogen and oxygen, and oxygen plasma treatment is carried out. Thus, the conductive film containing metallic bonds can be formed into a thin and smooth film, and reduced its resistivity. Further, a solvent in a composition volatilizes when the composition containing a conductive material is discharged under reduced pressure; thus, the time for the subsequent heat treatment (drying or baking) can be reduced.

Figure 38A:
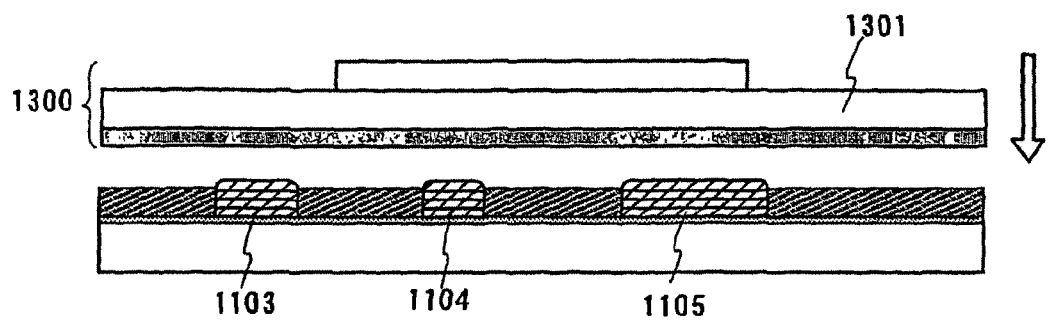
FIGS. 38A to 38C explain a method of planarization of a conductive layer according to the invention.
Figure 38B:
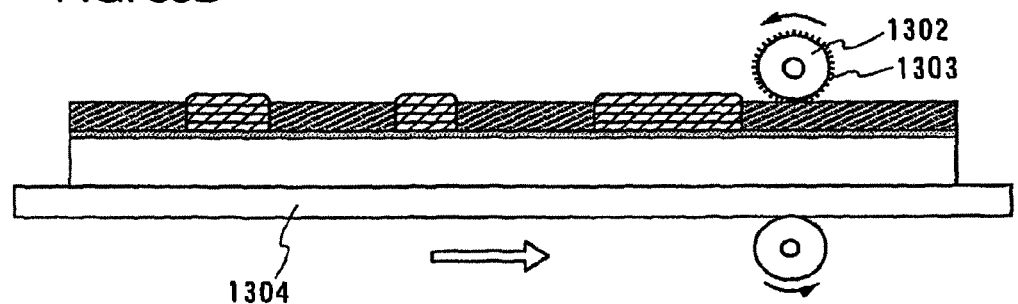
Figure 38C:
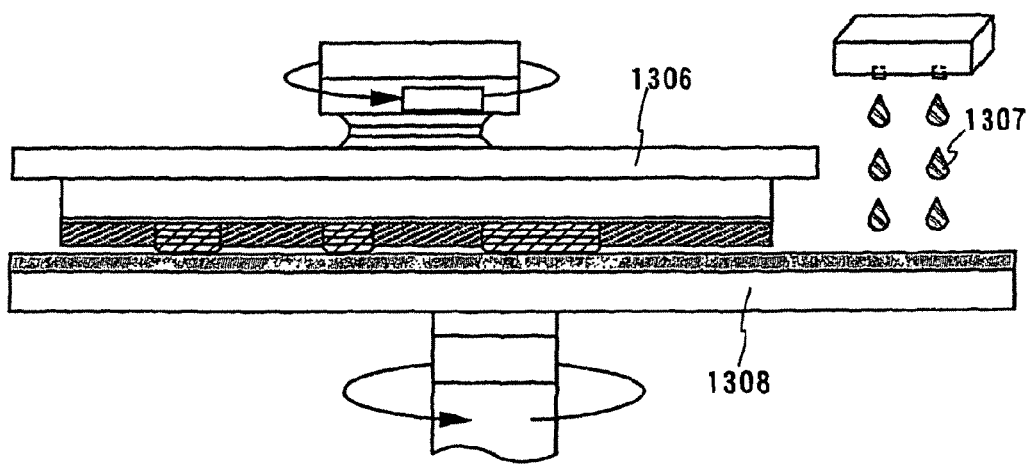

In addition to the foregoing drying and baking processes, a process for smoothing and flattening of a surface can be carried out. FIGS. 38A to 38C show typical examples of the process. FIG. 38A shows that a conductive film is flattened by a press mechanism 1300. The planarization process is preferably carried out while heating the conductive film with a heater 1301. FIG. 38B shows that the conductive film is flattened by transporting a stage 1304 carrying a substrate into the arrow direction between rollers 1302, either of which is provided with a micro brush 1303. Alternatively, the rollers themselves may be moved. FIG. 38C is a schematic view for showing a CMP method. The CMP method is carried out in accordance with the procedure in which abrasive solvent referred to as slurry 1307 is supplied to an abrasive pad 1308, and the conductive film is flattened by a pressure due to the rotation of a wafer carrier 1306 and the rotation of a turntable referred to as a platen, and by polish by the abrasive pad 1308. As the abrasive solvent, acidic solution mixed with a micro powder of alumina is mainly used for a metal, and acidic solution mixed with alkaline colloidal silica is mainly used for an insulator. Although not shown, an etch back method, a reflow method, or the like can be adopted. Further, the foregoing flattening method is effectively used for flattening not only a conductive film but also an insulating film formed or a semiconductor film by a droplet discharge method, or the like.

As the substrate, a substrate formed with an insulator such as glass, quartz, or alumina; plastic having heat resistance capable of resisting process temperature in the subsequent treatment; or the like can be used. In this instance, a base insulating film for preventing impurities from diffusing from a substrate such as a silicon oxide (SiOx), a silicon nitride (SiNx), a silicon oxynitride (SiOxNy) (x>y), silicon nitride oxide (SiNxOy) (x>y), or the like, (x, y=1, 2 . . . ) may be formed. Alternatively, a metal such as stainless or a semiconductor substrate, each of which is covered by an insulating film such as silicon oxide or silicon nitride can be used.

Figure 23C:
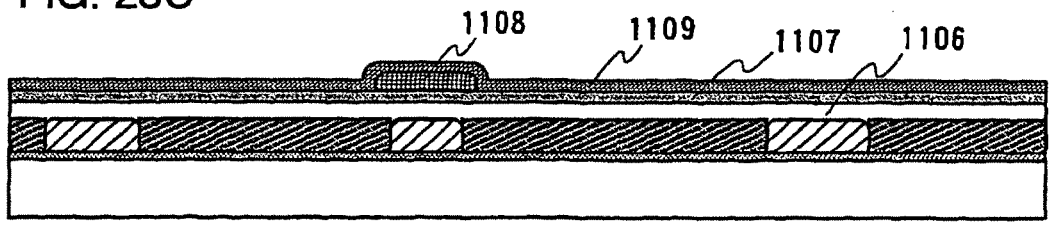

A gate insulating film 1106 is formed over the gate electrode layer (FIG. 23C). The gate insulating film is formed with a film containing silicon nitride, silicon oxide, silicon nitride oxide, or silicon oxynitride in a single layer or a laminated-layer by a thin film forming method such as plasma CVD, sputtering, or the like. In the case of stacking layers, for example, a silicon oxide film, a silicon nitride film, and a silicon oxide film are preferably formed sequentially over a substrate.

A semiconductor film 1107 is formed over the gate insulating film 1106 (FIG. 23C). The semiconductor film is formed from an amorphous semiconductor, a crystalline semiconductor, or a semiamorphous semiconductor. As these semiconductors, a semiconductor film containing silicon, silicon germanium (SiGe), or the like as its main component can be used. The semiconductor film can be formed by plasma CVD to have preferably a thickness of from 10 nm to 100 nm.

Among the foregoing semiamorphous semiconductors, a method for manufacturing SAS (semiamorphous silicon) will be briefly explained. The SAS can be obtained by glow discharge decomposition of a silicide gas. As a typical silicide gas, $SiH_4$ can be used. Other silicide gas such as $Si_2H_6$, $SiH_2Cl_2$, $SiHCl_3$, $SiCl_4$, $SiF_4$, or the like can be used. The SAS can be formed easily by diluting the silicide gas with one kind or a plurality of kinds of a rare gas element selected from the group consisting of hydrogen, hydrogen and helium, argon, krypton, and neon. The dilution rate is preferably in the range of from 10 to 1000 times. Of course, a reaction product for forming a film is formed by glow discharge decomposition at reduced pressure in the range of approximately from 0.1 Pa to 133 Pa. High frequency power of from 1 MHz to 120 MHz, preferably, from 13 MHz to 60 MHz may be supplied for forming glow discharge. Temperature for heating a substrate is preferably 300° C. or less, more preferably, from 100° C. to 200° C.

An energy bandwidth may be controlled to be from 1.5 eV to 2.4 eV, or from 0.9 eV to 1.1 eV by mixing a carbide gas such as $CH_4$ or $C_2H_6$, or a germanium gas such as $GeH_4$ or $GeF_4$ into the silicide gas.

The SAS shows weak n-type electrical conductivity when impurities for controlling valence electrons are deliberately not doped. This arises from the fact that oxygen is easily mixed into a semiconductor film since glow discharge at higher electricity is carried out than that for forming an amorphous semiconductor. Correspondingly, a p-type impurity element is doped into the first semiconductor film provided with a channel region for a TFT simultaneously with or after the formation of the film, so that a threshold value can be controlled. As the p-type impurity element, boron can be typically used. An impurity gas of from 1 ppm to 1000 ppm such as $B_2H_6$ or $BF_3$ may be mixed into a silicide gas. In the case where boron is used as a p-type impurity, the boron may have a concentration of from $1\times10^{14}$ atoms/cm$^3$ to $6\times10^{16}$ atoms/cm$^3$. By forming a channel region by the foregoing SAS, electron field-effect mobility of from 1 cm$^2$/V·sec to 10 cm$^2$/V·sec can be obtained.

A crystalline semiconductor film can be obtained in accordance with the following procedure in which an amorphous semiconductor film is treated in a solution containing catalyst such as nickel; heat crystallization treatment is carried out at 500 to 750° C. to obtain a crystalline silicon semiconductor film; and laser crystallization is carried out to improve the crystallinity.

The crystalline semiconductor film can be obtained by forming directly a poly-crystalline semiconductor film by LPCVD (low pressure CVD) using a material gas of disilane ($Si_2H_6$) and germanium fluoride ($GeF_4$). The LPCVD is carried out under conditions of: but not exclusively, a gas flow ratio of $Si_2H_6/GeF_4=20/0.9$, a film forming temperature of from 400° C. to 500° C., and a carrier gas of He or Ar.

A channel protective film 1108 is formed above the channel region of the semiconductor film 1107 (FIG. 23C). The channel protective film 1108 is preferably formed selectively by the droplet discharge method. As a composition to be discharged, a composition containing heat resistant resin such as siloxane, or a substance having etching resistivity and insulating property such as acrylic, benzocyclobutene, polyamide, polyimide, benzimidazole, or polyvinyl alcohol. Siloxane or polyimide is preferably used. To prevent the channel region from being over etched, the channel protective film 1108 is formed to a thickness of 100 nm or more, preferably 200 nm or more.

Although not shown, the channel protective film may be formed to have a laminated structure composed of a film such as a silicon nitride film formed by a thin film forming method such as CVD, or sputtering; and the foregoing organic resin formed by the droplet discharge method. For example, a semiconductor film 1107 is formed, a silicon nitride film is formed all over a surface by CVD, sputtering, or the like, and a channel protective film (organic resin) is formed by the droplet discharge method above the portion of the semiconductor film 1107 serving as a channel region over the silicon nitride film. The organic resin protects the channel region and serves as a mask for patterning a silicon nitride film; therefore, the organic resin is formed by discharging a composition of heat resistant resin such as siloxane, or a substance having etching resistivity and insulating property such as acrylic, benzocyclobutene, polyamide, polyimide, benzimidazole, or polyvinyl alcohol. Siloxane and polyimide are preferably used. To prevent the channel region from being over etched, the silicon nitride film and the organic resin are formed to a total thicknesses of 100 nm or more, preferably 200 nm or more. Thereafter, the channel protective film having a laminated structure is formed by etching the silicon nitride film away using the organic resin as a mask. Here, plasma etching is adopted using an etching gas of, but not exclusively, a chlorine gas such as $Cl_2$, $BCl_3$, $SiCl_4$, or $CCl_4$; a fluoride gas such as $CF_4$, $SF_6$, $NF_3$, or $CHF_3$; or $O_2$. The etching treatment can be carried out by using atmospheric plasma. By forming the channel protective film to have two layers, the function as a channel protective film can be improved, and damage of the channel region can be prevented without fault. Accordingly, a stable active element having high mobility can be obtained. Alternatively, the channel protective film may have three or more layers. The bottom layer may be formed with an insulating film containing silicon other than a silicon nitride film. Alternatively, a layer that can be formed by the droplet discharge method may be selectively stacked as with the channel protective film 1108.

An n-type semiconductor film 1109 is formed over a semiconductor film 1107. As an n-type impurity element, arsenic (As) or phosphorus (P) can be used. In the case of forming an n-type semiconductor film, an n-type (n+) silicon film can be formed by the glow discharge decomposition by plasma CVD using a mixed gas of $SiH_4$, $H_2$, and $PH_3$ (phosphine). Instead of the n-type semiconductor film 1109, a semiconductor film containing p-type impurity element such as boron (B) can be formed.

Figure 23D:
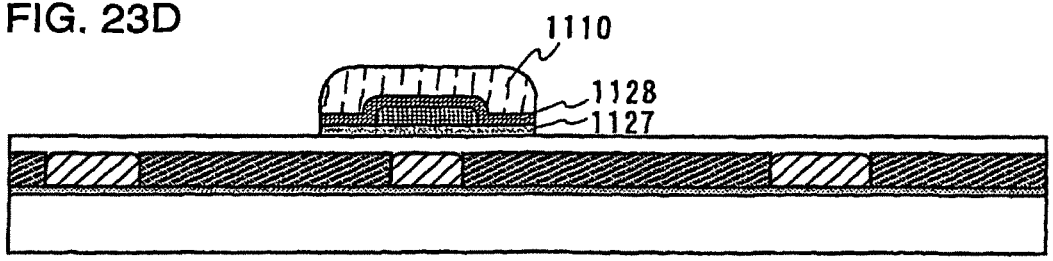

An island like semiconductor film 1127 and an island like n-type semiconductor film 1128 are formed by etching the semiconductor film 1107 and the n-type semiconductor film 1109 using a resist mask 1110 (FIG. 23D). As an etching gas, a chlorine gas such as $Cl_2$, $BCl_3$, $SiCl_4$, or $CCl_4$; a fluoride gas such as $CF_4$, $SF_6$, $NF_3$, or $CHF_3$; or $O_2$, but not exclusively, can be used. The etching can be carried out by using atmospheric plasma.

Figure 23E:
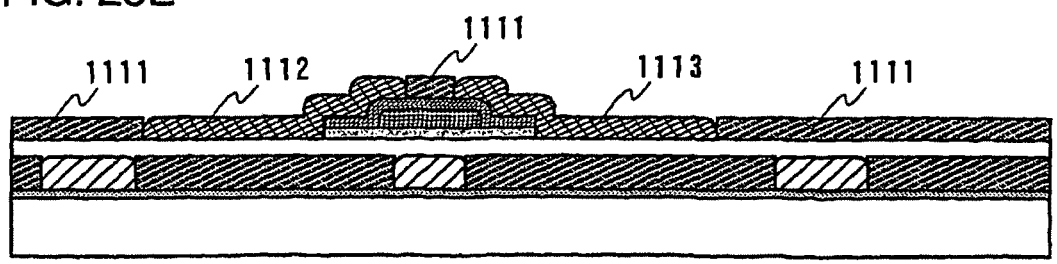

Then, a second insulating film 1111 for forming patterns of a source electrode 1112 and a drain electrode 1113 is formed over the gate insulating film 1106 and the island like n-type semiconductor film 1109 (FIG. 23E). The second insulating layer 1111 can be formed with the same material and by the same method as the first insulating layer 1102.

The source electrode 1112 and the drain electrode 1113 are formed by discharging a composition containing a second conductive material over a gap in the second insulating layer 1111 (FIG. 23E). The second conductive material, a conductive particle structure, a discharge condition, a drying condition, a baking condition, or the like can be appropriately selected from those explained about the foregoing first conductive material. Further, the first and the second conductive materials and the first and the second particle structures may be the same or different.

Here, after forming the second insulating layer 1111, the source electrode 1112 and the drain electrode 1113 are formed so as to fitted in the second insulating layer 1111. Alternatively, the second insulating layer 1111, the source electrode 1112, and the drain electrode 1113 may be formed simultaneously by the droplet discharge method. Further alternatively, the second insulating layer 1111 may be formed in accordance with the following procedure in which a composition for composing the second insulating layer 1111 is discharged, and a composition for composing the gate electrode layer before the composition for the second insulating layer 1111 is dried and solidified (or after temporary bake), then, the both discharged compositions are dried and baked. In this instance, the steps of exposing and developing can be skipped; thus, the number of manufacturing steps can be drastically reduced. In the case of forming both of the first insulating layer 1111 and the gate electrode layer simultaneously, different kinds of materials are simultaneously discharged from a plurality of nozzles having different discharge opening diameters can be used as shown in FIG. 45.

Although not shown, before discharging a composition containing a second conductive material, base pretreatment may be carried out over the gate insulating film 1106 and the island like n-type semiconductor film 1128 for improving the adhesion between these layers, and the source electrode 1112 and the drain electrode 1113. The base pretreatment can be carried out in accordance with the same procedure for forming the gate electrode layer.

Figure 24A:
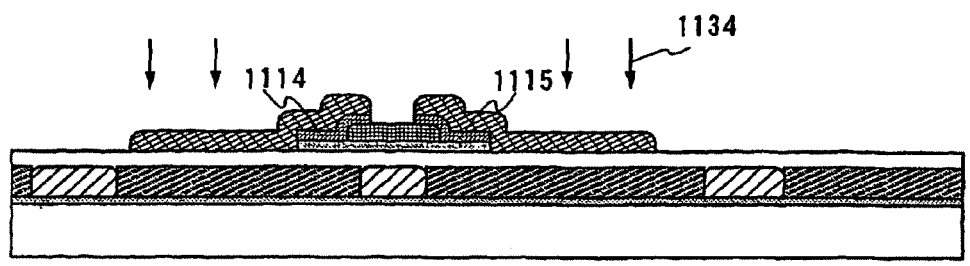
FIGS. 24A to 24C show manufacturing steps of an active element (channel protective type) according to the invention.

Then, the second insulating film 1111 is removed by $O_2$ ashing, etching, or atmospheric plasma. A source region 1114 and a drain region 1115 are formed by etching the island like n-type semiconductor film 1128 using the source electrode 1112 and the drain electrode 1113 as masks (FIG. 24A). Here, plasma etching is adopted using an etching gas of, but not exclusively, a chlorine gas such as $Cl_2$, $BCl_3$, $SiCl_4$, or $CCl_4$; a fluoride gas such as $CF_4$, $SF_6$, $NF_3$, or $CHF_3$; or $O_2$. The etching can be carried out by using atmospheric plasma. In this instance, a mixed gas of $CF_4$ and $O_2$ is preferably used as the etching gas. Since the channel protective film 1108 is formed over the channel region, the channel region is not damaged by overetching in etching the island like n-type semiconductor film 1128. Accordingly, a TFT having stable characteristics and high mobility can be obtained.

The surfaces of the source electrode 1112 and the drain electrode 1113 are reformed by being irradiated with UV light 1134 (FIG. 24A). Accordingly, adhesion between these electrodes, and a source wiring 1117 and a drain wiring 1118, which are formed across these electrodes, can be improved. Other treatment than the UV light irradiation may be carried out as long as it can improve the adhesion. For example, the foregoing base pretreatment can be carried out using a conductive material. Further, the treatment for reforming the surfaces of the electrodes can be omitted. In addition, the UV light irradiation can be carried out in forming the gate electrode layer.

A third insulating layer 1116 is formed to form patterns of the source wiring 1117 and the drain wiring 1118 (FIG. 24G). The third insulating layer 1116 can be formed with the same material and by the same method as those used for forming the first insulating layer 1102. The third insulating layer 1116 can serve as a planarizing film or an interlayer insulating film.

Figure 24B:
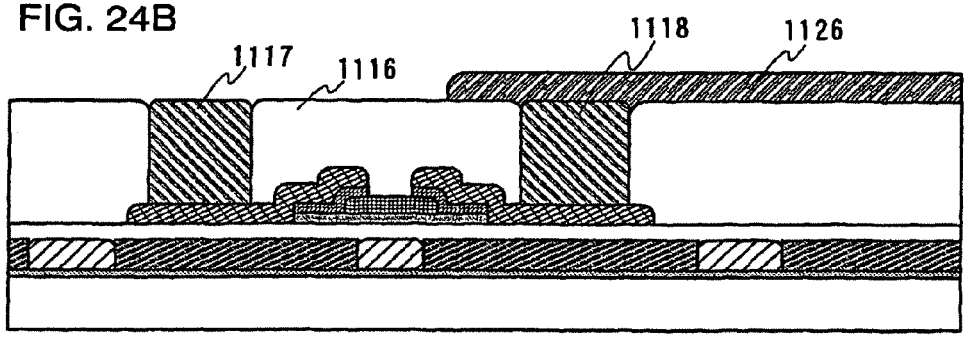

By discharging a composition containing a third conductive material over a gap in the third insulating layer 1116, the source wiring 1117 and the drain wiring 1118 are formed (FIG. 24B). The third conductive material, a conductive particle structure, a discharge condition, a drying condition, a baking condition, or the like can be appropriately selected from those explained about the foregoing first conductive material. Further, the third conductive material or the third particle structure may be the same or different from those of the first and the second.

Here, after forming the third insulating layer 1116, the source wiring 1117 and the drain wiring 1118 are formed so as to be fitted in the third insulating layer 1116. Alternatively, the third insulating layer 1116, the source wiring 1117, and the drain wiring 1118 may be formed simultaneously by a droplet discharge method. Further alternatively, the third insulating layer 1116 may be formed in accordance with the following procedure in which a composition for composing the third insulating layer 1116 is discharged, and a composition for composing the gate electrode layer before the composition for the second insulating layer 1111 is dried and solidified (or after temporary bake), then, the both discharged compositions are dried and baked. In this instance, the steps of exposing and developing can be skipped; thus, the number of manufacturing steps can be drastically reduced. In the case of forming both of the first insulating layer 1116 and the gate electrode layer simultaneously, different kinds of materials are simultaneously discharged from a plurality of nozzles having different discharge opening diameters can be used as shown in FIG. 45.

Then, a pixel electrode 1126 is formed over the drain wiring 1118 (or the source wiring 1117); thus, a TFT substrate is completed (FIG. 24B). As the pixel electrode, the foregoing conductive material can be used. In the case of a transmissive liquid crystal display device (FIG. 27A), a transparent conductive material such as indium tin oxide (ITO), zinc oxide (ZnO), gallium zinc oxide (GZO) composed of zinc oxide doped with gallium, indium tin oxide (IZO) composed of indium oxide mixed with 2% to 20% of zinc oxide, or organic indium, organotin, or the like is preferably used. In the case of a reflective liquid crystal display device, a reflective conductive material such as aluminum (Al), a magnesium-silver mixture, a magnesium-aluminum mixture, a magnesium-indium mixture, an aluminum-aluminum oxide mixture, or a lithium-aluminum mixture is preferably used. Further, in the case of a semitransparent liquid crystal display device (FIG. 27B), the foregoing materials can be used in combination as a transparent pixel electrode 1153 and a reflective pixel electrode 1152. The pixel electrode 1126 may be selectively formed by the droplet discharge method. Alternatively, the pixel electrode 1126 may be formed by sputtering in a conventional manner and patterning thereafter. Although not shown, before forming the pixel electrode 1126, the foregoing base pretreatment or UV light irradiation may be carried out to improve the adhesion between the pixel electrode 1126 and the source electrode, the drain electrode, and the interlayer insulating film (third insulating layer 1116) can be improved by.

Figure 24C:
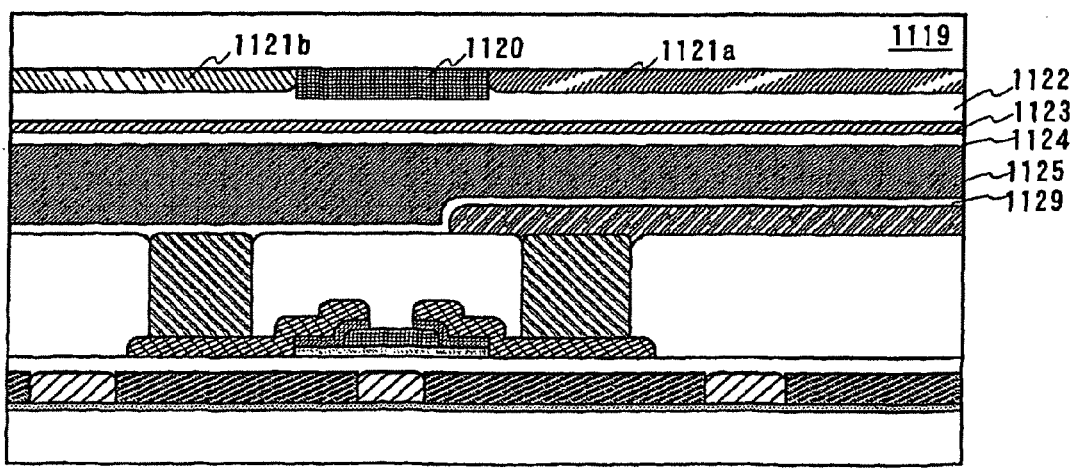

A counter substrate 1119 provided with a black matrix 1120, a color filter 1121, a transparent resin 1122, a counter electrode 1123, and an orientation film 1124 is prepared to paste onto a TFT substrate provided with an orientation film 1129 so as to sandwich a liquid crystal layer 1125 therebetween (FIG. 24C). The black matrix 1120 and the color filter 1121 may be formed by spin coating, dip coating, superposition, or the like. Alternatively, they can be formed by the droplet discharge method. In this instance, both the black matrix 1120 and the color filter 1121 may be formed simultaneously by a droplet discharge method. Alternatively, one of them may be selectively formed by a droplet discharge method or a conventional patterning process, and other may be formed by a droplet discharge method so as to be fitted. By actively using the droplet discharge method as above, a photolithography process can be omitted, and the number of manufacturing steps can be drastically reduced. Conventionally, four times photolithography processes were required to form a light-shielding film (black matrix) and an RGB color filter. In the case where a full color display is not manufactured, the color filter is not required.

The transparent resin 1122 can be formed by spin coating, dip coating, or the like. The counter electrode can be formed by a droplet discharge method or sputtering. The orientation film formed over the both substrates can be formed by the droplet discharge method.

Figure 41:
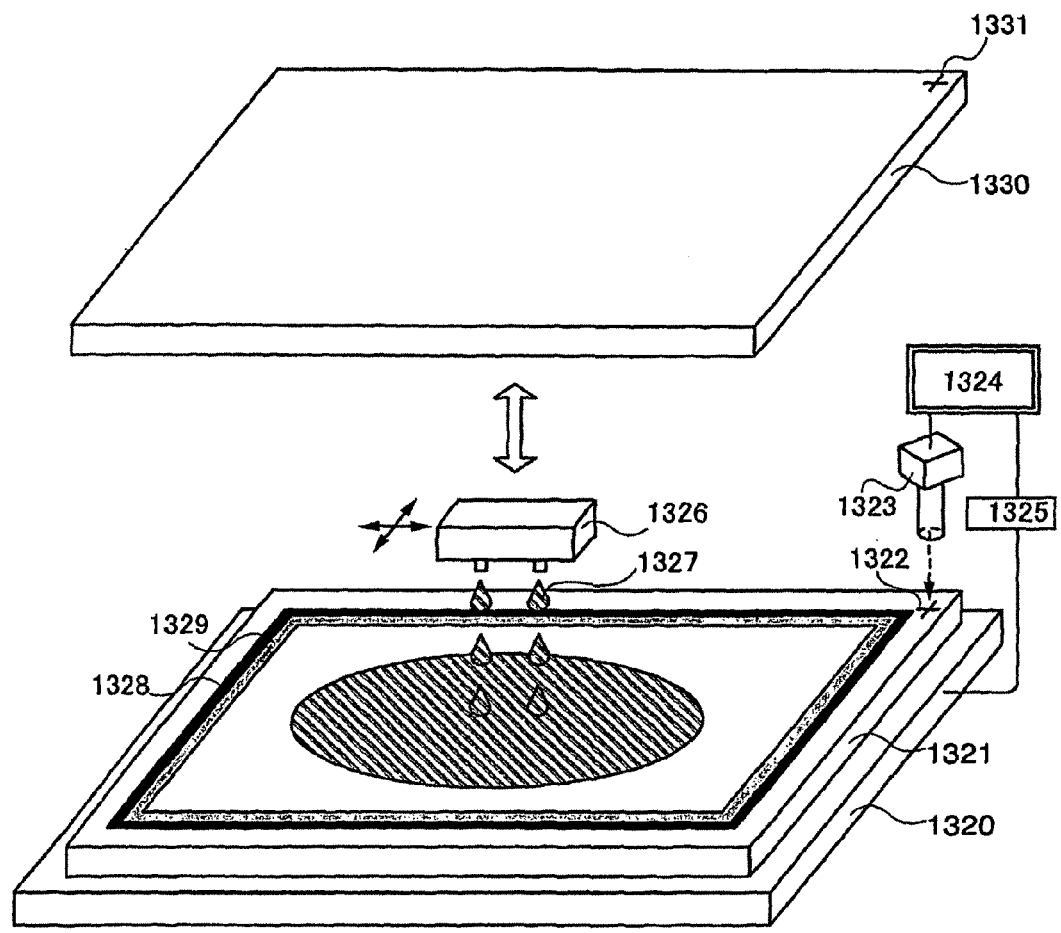
FIG. 41 explains a liquid crystal application method of the invention.

The liquid crystal layer 1125 can be formed by dip coating (pumping up method) in accordance with the following procedure in which both substrates are bonded together with sealant; and one side provided with a liquid crystal injecting opening of the bonded substrate (cell) is soaked in liquid crystals to inject the liquid crystal into the inside of the cell by capillary phenomenon. Alternatively, the liquid crystal layer 1125 can be formed by so-called droplet discharging as shown in FIG. 41, that is, liquid crystals are delivered by droplets from a nozzle (dispenser) 1326 over a substrate 1321, which is provided over a stage 1320, provided with sealant 1328 and a barrier layer 1329, and another substrate 1330 is pasted onto the foregoing substrate as indicated by arrow. Especially, the droplet discharge method can be used effectively in the case of using a large substrate. The barrier layer 1329 shown in FIG. 41 is provided to prevent chemical reaction between liquid crystal molecules 1327 and the sealant 1328. In the case where the both substrates are pasted to each other, an alignment marker 1322 or 1311 preliminarily provided over both of the substrates is detected by an imaging means 1323, and the stage provided with the both substrates is controlled through a CPU 1324 and a controller 1325.

FIG. 27 shows the state that a liquid crystal panel completed according to the foregoing process is provided with a backlight (light source) unit 1141. The backlight unit 1141 is composed of a cold-cathode tube (fluorescent lamp) 1142 emitting fluorescent light 1090; a lamp reflector 1143 for efficiently introducing fluorescent light to an optical waveguide 1144; the optical waveguide 1144 for introducing light with the total reflection of the fluorescent light to all over a liquid crystal panel; a diffuser 1145 for reducing unevenness of brightness; and a reflector plate 1146 for reusing leakage light below the optical waveguide 1144. A polarizing plate 1140 is provided between the liquid crystal panel and the backlight unit, and the opposite side thereof.

Figure 27A:
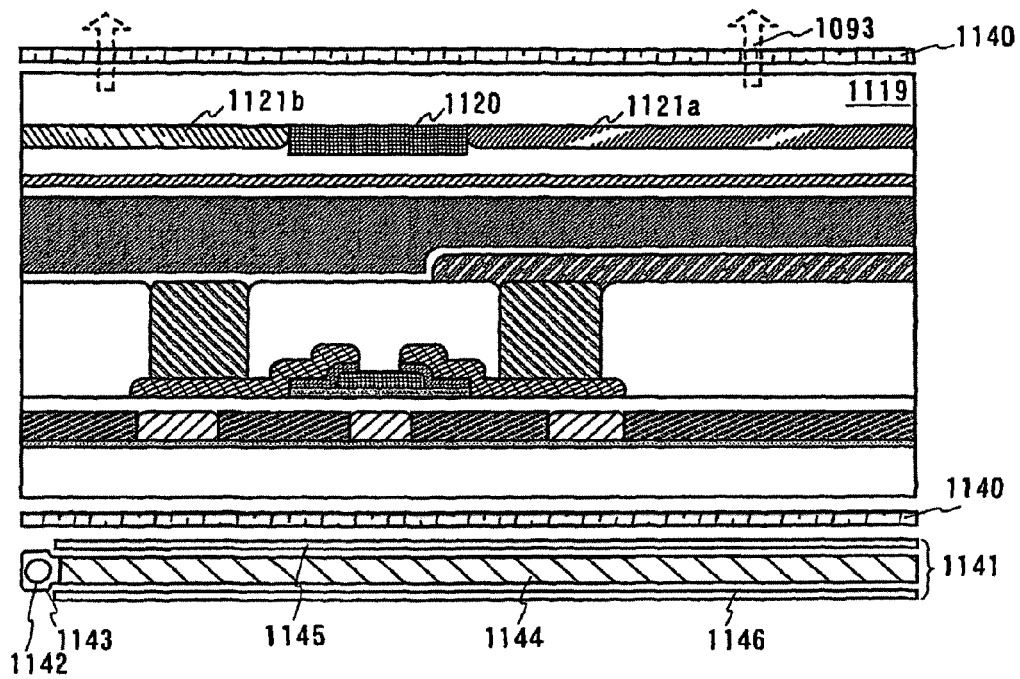
FIGS. 27A and 27B each show a completed liquid crystal display device according to the invention.

FIG. 27A shows a transmissive liquid crystal display panel. The backlight unit 1141 is installed below a TFT substrate; thus, a gate electrode 1104 is required to be formed by a material having a reflective property to prevent the channel region of the TFT from being exposed to light. Meanwhile, in the case where the backlight unit 1141 is installed above the TFT substrate (not shown), the channel region of the TFT is not exposed to light since the black matrix 1120 is provided.

Figure 27B:
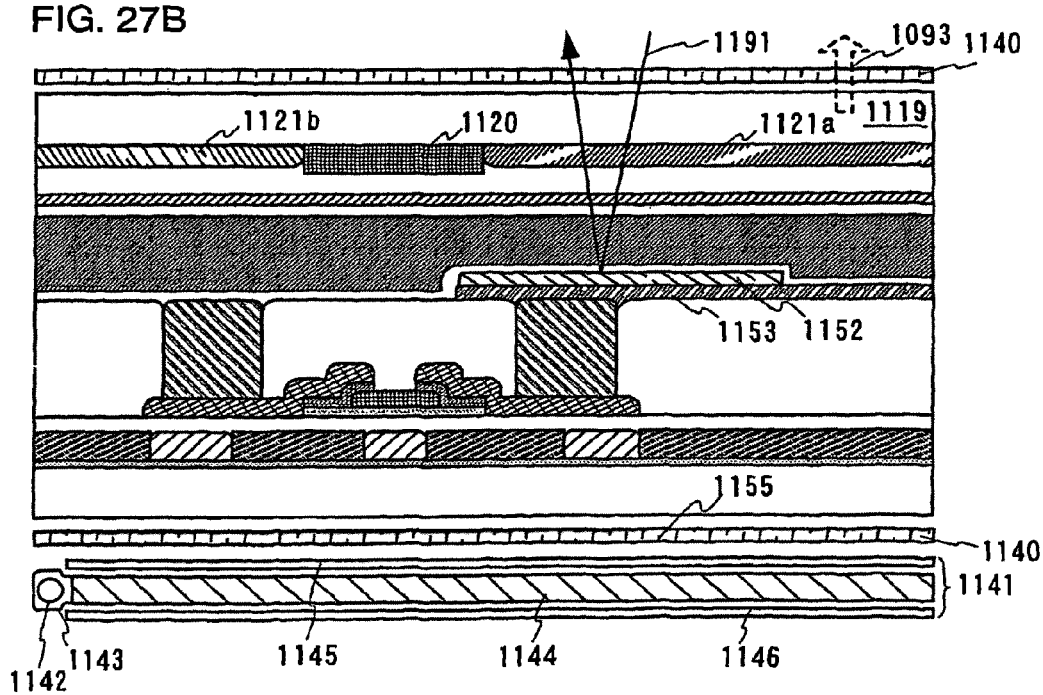

FIG. 27B shows a transflective liquid crystal display panel. The transflective liquid crystal display panel has the both functions of reflective type and a light transmitting property. A pixel electrode 1153 has a light transmitting property, thereby transmitting fluorescent light from the backlight unit 1141. The pixel electrode 1152 has a reflection property; thus, external light 1191 can be reflected at the pixel electrode 1152. The cold-cathode tube is laid down (side light system) as shown in FIG. 27 to reduce the thickness of a panel. Alternatively, the cold-cathode tube may be provided to below or above the liquid crystal panel to increase the amount of light.

As to the liquid crystal display device explained in this embodiment mode, an insulating layer is formed at the periphery of the gate electrode layer, the source electrode, the drain electrode, the source wiring, and the drain wiring; and a conductor is formed to be implanted in the insulating layer by the droplet discharge method. Accordingly, the foregoing electrodes and wirings can be formed precisely into a desired pattern, and the conductive material can be saved. In addition, dripping of a composition containing a conductive material that tends to occur in the case of using the droplet discharge method can be prevented; thus, a preferable pattern of a conductor can be formed, and the electrodes or wirings can be prevented from short-circuiting. In the case where a conductive material is discharged by only the droplet discharge method, it is difficult to increase the thickness of an electrode or a wiring since common compositions containing conductive materials are in liquid form. However, if the thickness of resin is controlled, an electrode or a wiring having a desired thickness can be formed even in the case of using the droplet discharge method.

According to the present invention using the droplet discharge method, the manufacturing steps and the material cost can be reduced, and the high throughput manufacture of a high stable liquid crystal display device can be realized with high yields. Even if the size of a glass substrate is increased more and more, for example, to 1500 mm×1800 mm, 2000 mm×2200 mm, 2700 mm×3600 mm; thus, on, a display panel can be manufactured at low cost with good productivity. It is not required to dispose a large amount of waste liquid including heavy metals or the like as a conductive material. Accordingly, the present invention is significant from the viewpoint of environmental consideration.

In this embodiment mode, a method that an insulating layer is formed at the periphery of the gate electrode layer, the source electrode, the drain electrode, the source wiring; a conductor is formed to be implanted in a pore of the insulating layer by the droplet discharge method. However, the method is not always required to apply all of the electrodes and wirings. For example, the gate electrode layer may be formed to be implanted; and the source electrode, the drain electrode, and the source wiring may be selectively formed by a droplet discharge method. Alternatively, the foregoing electrodes and wirings may be formed by sputtering and patterning thereafter.

A pair of the source electrode and the source wiring, and a pair of the drain electrode and the drain wiring can be formed in one layer, respectively. In this case, either one of a second or a third insulating layer is not required. Further, the source electrode (wiring) or the drain electrode (wiring) may be formed to serve as a pixel electrode. In the case where an interlayer insulating film or a planarizing film is not formed, a pixel electrode may be preliminarily formed over a gate insulating film, and thereafter, the pixel electrode may be connected to the source and the drain electrodes, or the source and the drain wirings.

Embodiment Mode 14

FIG. 25 is a process drawing of FIG. 39 taken along line C-D for showing the case where a channel etching TFT is used as a thin film transistor 1230. The process up to form a source electrode 1112 and a drain electrode 1113 can, be carried out in a way similar to the above explained embodiment mode (FIGS. 25A to 25C). Note that the steps of forming a channel protective film is not required in this embodiment mode.

Figure 25A:
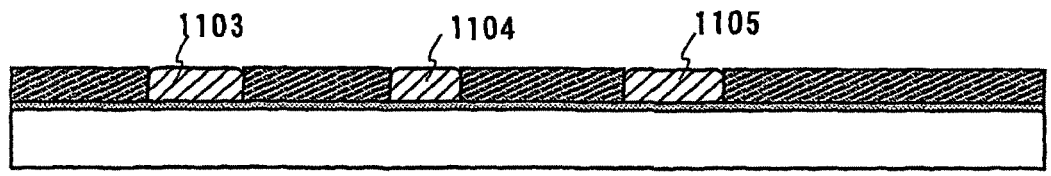
FIGS. 25A to 25D show manufacturing steps of an active element (channel etch type) according to the invention.
Figure 25B:
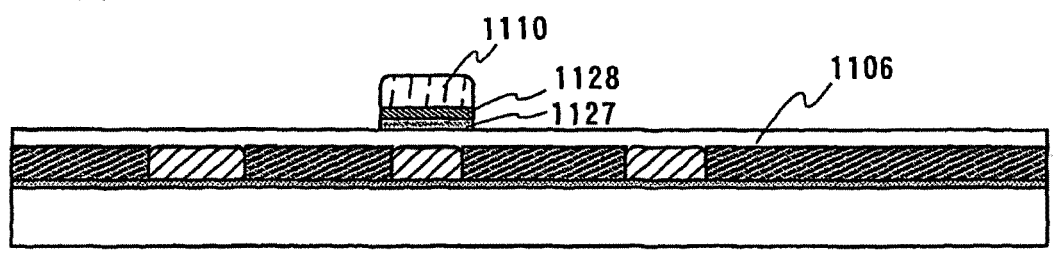
Figure 25C:
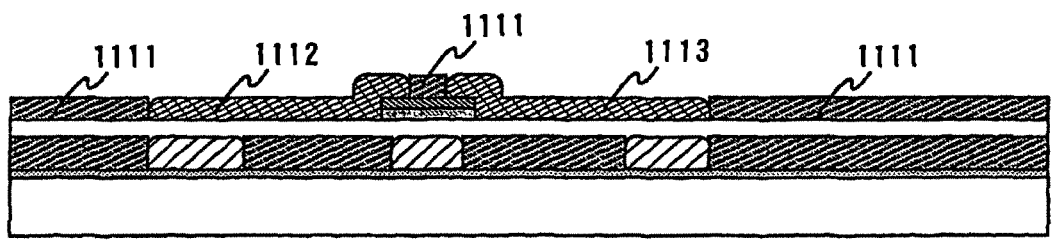
Figure 25D:
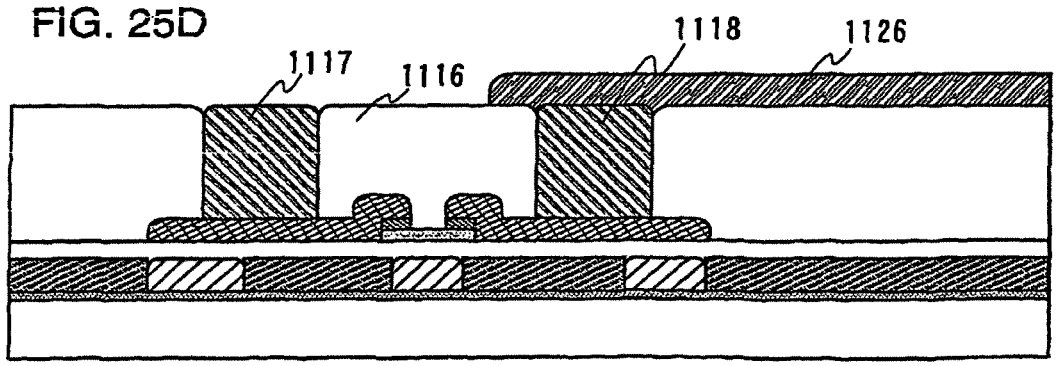

Then, the second insulating film 1111 is removed by $O_2$ aching, etching, or atmospheric plasma. A source region and a drain region are formed by etching the island like n-type semiconductor film 1128 using the source electrode 1112 and the drain electrode 1113 as masks (FIG. 25D). Here, plasma etching is adopted using an etching gas of, but not exclusively, a chlorine gas such as $Cl_2$, $BCl_3$, $SiCl_4$, or $CCl_4$; a fluoride gas such as $CF_4$, $SF_6$, $NF_3$, or $CHF_3$; or $O_2$. The etching can be carried out by using atmospheric plasma. In this instance, a mixed gas of $CF_4$ and $O_2$ is preferably used as the etching gas. In the case where the n-type semiconductor film and the semiconductor film are formed from the same semiconductor material, attention needs to be paid to the etching rate and the etching time since the island like semiconductor film 1127 is etched together when the n-type island like semiconductor film 1128 is etched.

Thereafter, steps of forming patterns of a source wiring 1117 and the drain wiring 1118 over the source electrode 1112 and the drain electrode 1113, and steps for forming a pixel electrode can be carried out in a similar way to Embodiment Mode 1 (FIG. 25D). Although not shown, steps for applying or injecting liquid crystal, boding substrates, installing a backlight unit, and the like can be carried out in a similar way to Embodiment Mode 13. A pair of the source electrode and the source wiring, and a pair of the drain electrode and the drain wiring can be formed in one layer, respectively. In this case, either one of a second or a third insulating layer is not required. Further, the source electrode (wiring) or the drain electrode (wiring) can be formed to serve as a pixel electrode.

Embodiment Mode 15

FIG. 26 is a process drawing of FIG. 39 taken along line C-D for showing the case where a TFT, which is formed by combining a channel etch TFT and a channel protective TFT is used as a thin film transistor 1230. The process up to form an n-type semiconductor film 1109 can be carried out in a way similar to the above explained embodiment mode (FIG. 26A). Note that the process for forming a channel protective film is not required.

Figure 26A:
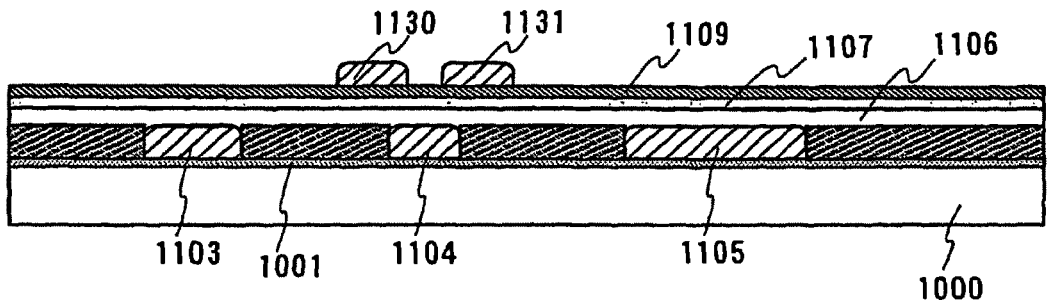
FIGS. 26A to 26D show manufacturing steps of an active element (combination of channel protective type and channel etch type) according to the invention.

Thereafter, metal masks 1130 and 1131 are formed over the portion that serves as source and drain regions of a semiconductor film 1107 (FIG. 26A). The metal masks 1130 and 1131 serve not only as masks for etching an n-type semiconductor film 1109 and a semiconductor film 1107 but also as a source and a drain electrodes. As a conductive material for the metal masks 1130 and 1131, the same material used for forming a gate electrode layer or the like can be used. A material that can highly withstand etching treatment is preferably used. Further, the metal masks 1130 and 1131 are preferably formed selectively by the droplet discharge method.

Figure 26B:
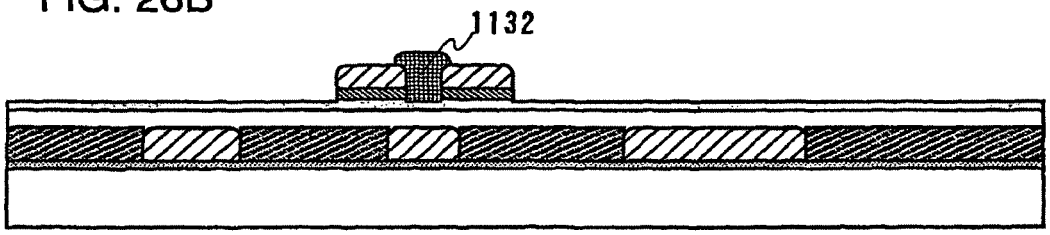

Then, source and drain regions are formed by etching the n-type semiconductor film 1109 using the metal masks 1130 and 1131 as masks (FIG. 26B). Here, plasma etching is adopted using an etching gas of, but not exclusively, a chlorine gas such as $Cl_2$, $BCl_3$, $SiCl_4$, or $CCl_4$; a fluoride gas such as $CF_4$, $SF_6$, $NF_3$, or $CHF_3$; or $O_2$. The etching can be carried out by using atmospheric plasma. In this instance, a mixed gas of $CF_4$ and $O_2$ is preferably used as the etching gas. In the case where the n-type semiconductor film and the semiconductor film are formed from the same semiconductor material, attention needs to be paid to an etching rate and an etching time since the island like semiconductor film 1127 is etched together when the n-type island like semiconductor film 1128 is etched. The function of the TFT will not be damaged as long as a semiconductor film at a channel forming region is formed to a thickness of 5 nm or more, preferably, 10 nm or more, more preferably, 50 nm or more even if a pall of the semiconductor film 1107 is etched as shown in FIG. 26B.

An insulating film 1132 is formed above the channel region of the semiconductor film 1107 (FIG. 26B). Since the insulating film 1132 serves as a channel protective film, it is preferably formed selectively by the droplet discharge method. As a composition to be discharged, a composition of heat resistant resin such as siloxane, or a substance having etching resistivity and an insulating property such as acrylic, benzocyclobutene, polyamide, polyimide, benzimidazole, or polyvinyl alcohol. Siloxane or polyimide is preferably used. To prevent the channel region from being over etched, the insulating film 1132 is formed to a thickness of 100 nm or more, preferably 200 nm or more. Therefore, the insulating film 1132 can be formed to overlap the metal masks 1130 and 1131 as shown in FIG. 26B. By forming the insulating film 1132 to a thickness of 100 nm or more, the function as a channel protective film can be improved, and damage of the channel region can be prevented without fault. Accordingly, a stable active element having high mobility can be obtained. It is also effective that the insulating film 1132 is formed to have a laminated structure. For example, a laminated layer composed of silicon nitride and organic resin as explained in the above explained embodiment mode can be adopted.

Figure 26C:
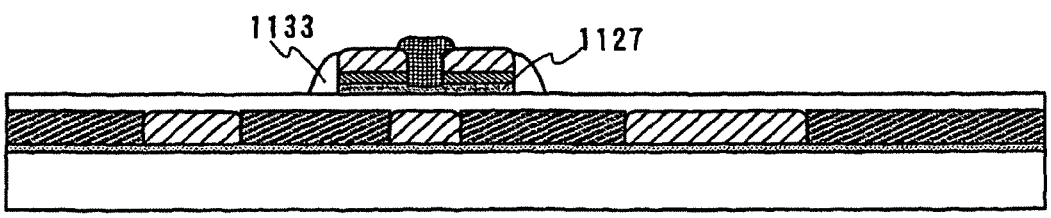

An island like semiconductor film 1127 is formed by etching the semiconductor film 1107 using the metal masks 1130, 1131, and the insulating film 1132 (FIG. 26C). Here, plasma etching is adopted using an etching gas of, but not exclusively, a chlorine gas such as $Cl_2$, $BCl_3$, $SiCl_4$, or $CCl_4$; a fluoride gas such as $CF_4$, $SF_6$, $NF_3$, or $CHF_3$; or $O_2$. The etching can be carried out by using atmospheric plasma. In this instance, a mixed gas of $CF_4$ and $O_2$ is preferably used as the etching gas. Since the insulating film 1132 (which corresponds to the channel protective film) is formed above a channel region 1119 of an island like semiconductor film 1127, the channel region is not damaged by overetching in the foregoing etching process. Hence, a channel protective type TFT (channel stopper type) having stable characteristics and high mobility can be manufactured without using any resist mask.

Insulators 1133 (also referred to as edge covers or the like) for improving step coverage are formed over a gate insulating film 1106, and at least at the side of the island like semiconductor film 1127 (FIG. 26C). The source electrode 1112 and the drain electrode 1113 are formed to be in contact with the metal masks 1130 and 1131. The wirings can be formed smoothly with good coverage since the edge cover is provided below the source electrode 1112 and the drain electrode 1113. Accordingly, breaking can be prevented.

Figure 26D:
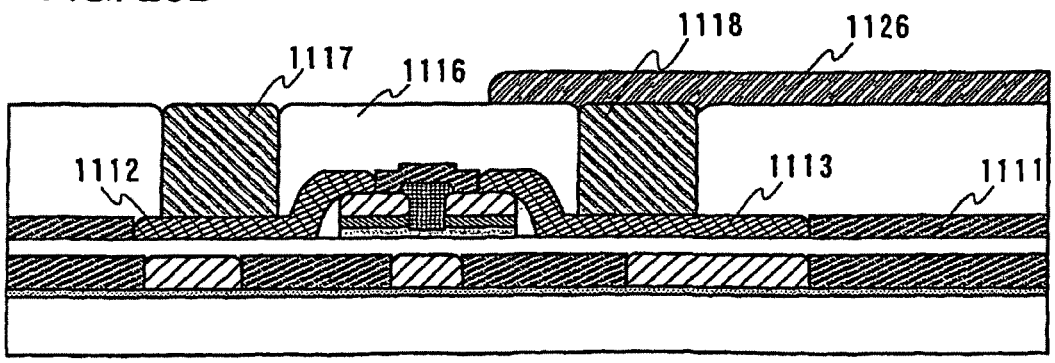

Thereafter, steps for forming patterns of a source wiring 1117 and the drain wiring 1118 over the source electrode 1112 and the drain electrode 1113, and forming a pixel electrode can be carried out in a similar way to the above explained embodiment mode (FIG. 26D). Although not shown, steps for applying or injecting liquid crystal, boding substrates, for installing a backlight unit, and the like can be carried out in a similar way to Embodiment Mode 13. A pair of the source electrode and the source wiring, and a pair of the drain electrode and the drain wiring can be formed in one layer, respectively. In this case, either one of a second or a third insulating layer is not required. Further, the source electrode (wiring) or the drain electrode (wiring) may be formed to serve as a pixel electrode.

As mentioned above, after forming the metal masks 1130 and 1131 serving as source and drain electrodes, a portion serving as a channel region is covered by the insulating film 1132 serving as a channel protective film, and an island like semiconductor film is formed according to the present invention. Accordingly, a resist mask is not required, and a manufacturing process can be simplified. This embodiment mode provides a novel means for forming an active element by combining a method for removing an n-type semiconductor film using the metal mask, and a method, which is specific to a channel protective type, for forming a channel protective film to prevent a channel region from being removed. An active element can be manufactured by using only a metal mask without using any resist mask according to the foregoing structure. As a result, the manufacturing process can be simplified and the cost can be drastically reduced by saving materials. The high throughput manufacture of a high stable active element can be realized at low cost with high yields in a shorter tact time.

Embodiment Mode 16

In this embodiment mode, the case that an insulating layer having a function of a color filter is formed as an interlayer insulating film or a planarizing film will be explained with reference to FIG. 28. The process up to forming a source electrode and a drain electrode can be carried out in a way similar to the foregoing embodiment mode.

Figure 28A:
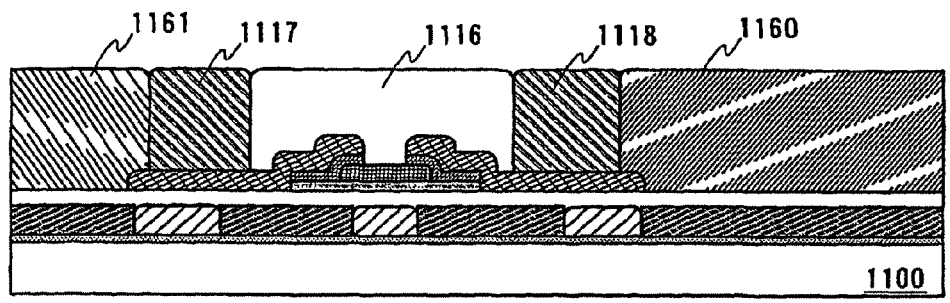
FIGS. 28A and 28B each show a process of a liquid crystal display device including an interlayer insulating film having a color filter function according to the invention.

Thereafter, third insulating layers 1160 and 1161 for forming patterns of a source wiring 1117 and a drain wiring 1118 are formed from a material for the first insulating film explained in the foregoing embodiment mode such as photosensitive polyimide, photosensitive acrylic, or photosensitive siloxane mixed with pigment or dye of red (R), green (G), and blue (B) (FIG. 28A). Accordingly, the third insulating layers 1160 and 1161 can have a function as a color filter in addition to a function of an interlayer insulating film or a planarizing film. The third insulating layer 1160 may be formed by resin that is not mixed with pigment or dye, or resin mixed with Cr (chromium) or the like to obtain a function of a black matrix. Alternatively, nonphotosentive resin (polyimide or the like) may be used to obtain a function of a black matrix. In the case where the third insulating layer 1116 has a function of a black matrix, a black matrix 1120 shown in FIG. 28B can be omitted.

By discharging a composition containing a third conductive material over a gap in the third insulating layers 1116, 1160, and 1161, the source wiring 1117 and the drain wiring 1118 are formed (FIG. 28A). The third conductive material, a conductive particle structure, a discharge condition, a drying condition, a baking condition, or the like can be appropriately selected from those explained about the foregoing first conductive material. Further, the third conductive material or particle structure may be the same or different from those of the first and the second conducive materials.

Here, after forming the third insulating layers 1116, 1160, and 1161, the source wiring 1117 and the drain wiring 1118 are formed so as to be fitted in the third insulating layers 1116, 1160, and 1161. Alternatively, the third insulating layer 1116, the source wiring 1117, and the drain wiring 1118 may be formed simultaneously by a droplet discharge method. Further alternatively, the third insulating layer 1116 may be formed in accordance with the following procedure in which a composition for composing the third insulating layer 1116 is discharged, and a composition for composing the gate electrode layer before the composition for the third insulating layer 1116 is dried and solidified (or after temporary bake), then, the both discharged compositions are dried and baked. In this instance, the processes of exposure and development can be omitted; thus, the number of manufacturing steps can be drastically reduced. In the case of forming both the third insulating layer 1116 and the gate electrode layer simultaneously, a method by which different kinds of materials are simultaneously discharged from a plurality of nozzles can be used as shown in FIG. 45.

Figure 28B:
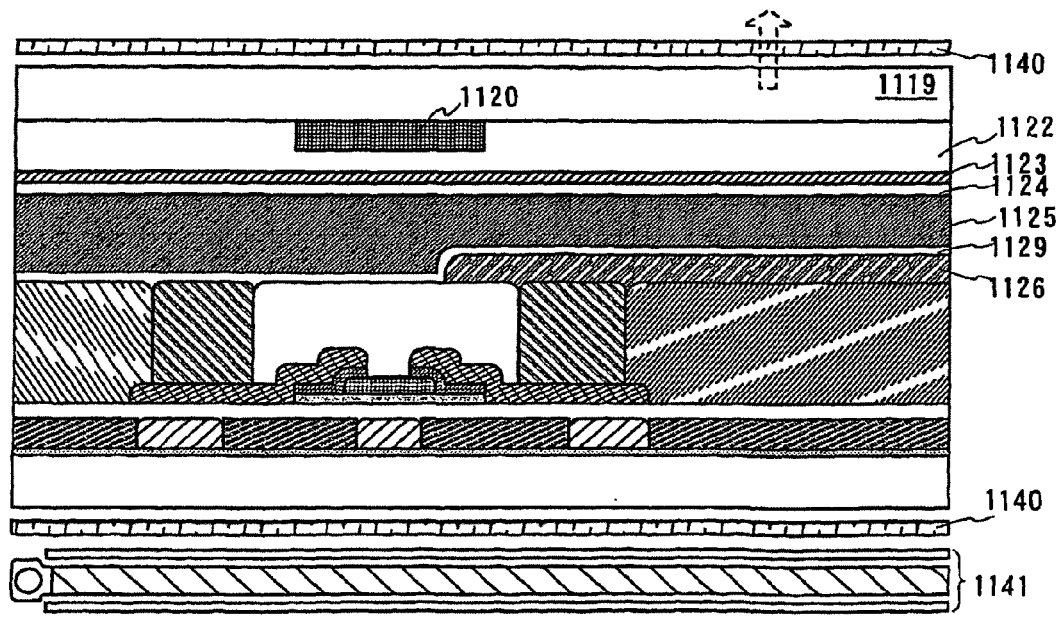

The steps of forming a pixel electrode, applying or injecting liquid crystal, boding substrates, installing a backlight unit, and the like can be carried out in a similar way to Embodiment Mode 13 (FIG. 28B). A pair of the source electrode and the source wiring, and a pair of the drain electrode and the drain wiring can be formed in one layer, respectively. In this instance, either one of a second or a third insulating layer is not required. Further, the source electrode (wiring) or the drain electrode (wiring) can be formed to serve as a pixel electrode. This embodiment mode can be freely combined with another embodiment mode.

Embodiment Mode 17

Figure 29A:
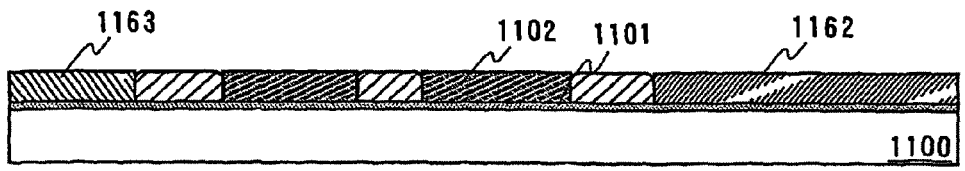
FIGS. 29A to 29C each show a process of a liquid crystal display device including a transparent resin having a color filter function according to the invention.

In this embodiment mode, the case where an insulating layer having a function of a color filter is formed as a first insulating layer will be explained with reference to FIG. 29. The process up to base pretreatment can be carried out in a way similar to the foregoing embodiment mode (FIG. 29A). Further, the base pretreatment can be omitted.

A first insulating layer (resin pattern) for forming patterns of a gate wiring 1103, a gate electrode 1104, and a capacitor wiring 1105 is formed over a substrate 1100 or above a portion treated with base pretreatment in the case of carrying out the foregoing base pretreatment. In this instance, the first insulating layers 1162, 1163 are formed using a material mixed with pigment or dye of red (R), green (G), and blue (B) for forming at least a portion of the first insulating layers that transmit light (FIG. 29A). Accordingly, the first insulating layers 1162, 1163 can have a function of a color filter in addition to a partition (also referred to as a bank) for forming a pattern of a gate electrode layer. The first insulating film 1102 may be formed by resin that is not mixed with pigment or dye, or resin mixed with Cr (chromium) or the like to obtain a function of a black matrix. Alternatively, nonphotosentive resin (polyimide or the like) may be used to have a function of a black matrix. In the case where the first insulating film 1102 has a function of a black matrix, a black matrix 1120 shown in FIG. 29C can be omitted.

Figure 29B:
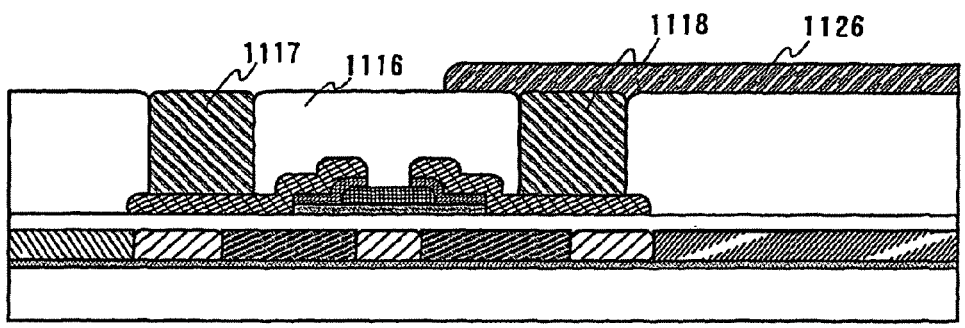
Figure 29C:
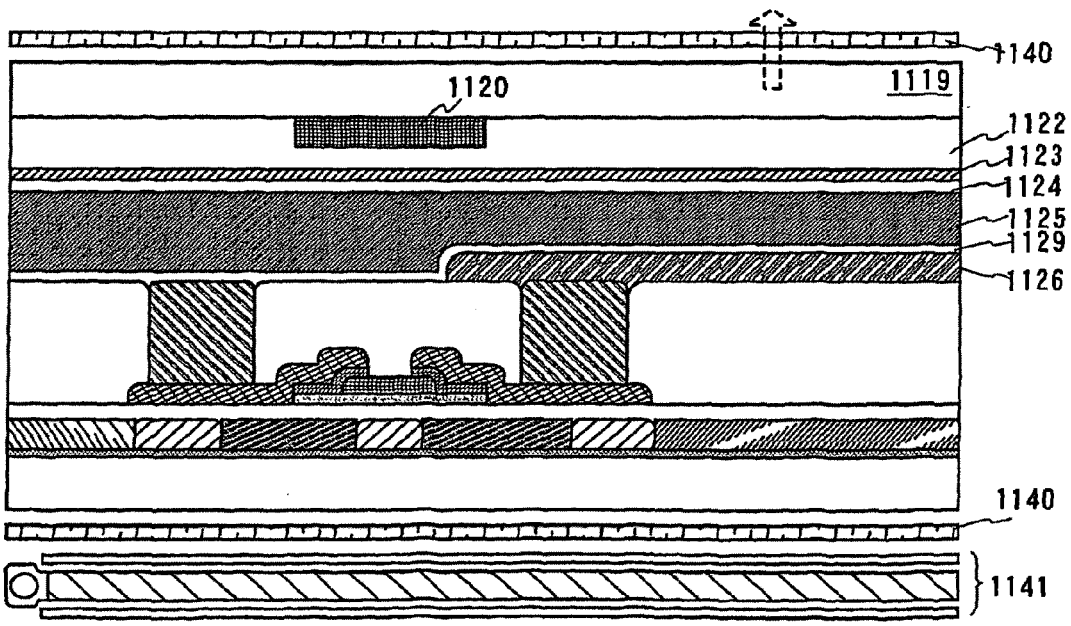

The steps of forming a TFT substrate, forming a pixel electrode, applying or injecting liquid crystal, boding substrates, installing a backlight unit, and the like can be carried out in a similar way to the foregoing embodiment mode (FIGS. 29B and 29C). A pair of the source electrode and the source wiring, and a pair of the drain electrode and the drain wiring can be formed in one layer, respectively. In this instance, either one of a second or a third insulating layer is not required. Further, the source electrode (wiring) or the drain electrode (wiring) can be formed to serve as a pixel electrode. This embodiment mode can be freely combined with another embodiment mode.

Embodiment Mode 18

In this embodiment mode, a method for connecting a TFT substrate according to the present invention to a pixel electrode will be explained with reference to FIGS. 30A to 32C.

Figure 30A:
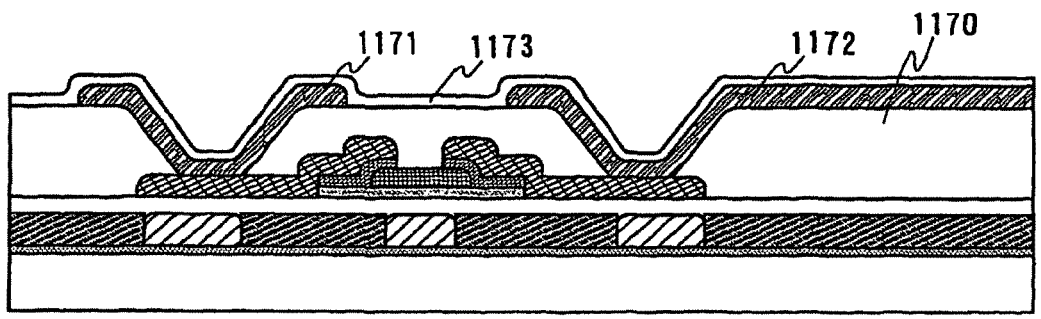
FIGS. 30A to 30D explain a method of connection between a TFT and a pixel electrode according to the invention.

As the first method, as shown in FIG. 30A, over the TFT manufactured according to the present invention, a planarizing film 1170 is selectively formed by the droplet discharge method, and a source wiring 1171 and a drain wiring 1172, each of which is connected to a source electrode and a drain electrode, are formed by the droplet discharge method over the region where the planarizing film is not formed. Further, the source wiring or the drain wiring in a pixel TFT can also serve as a pixel electrode as shown in FIG. 30A. Alternatively, a pixel electrode can be separately formed to connect to the source wiring or the drain wiring. The source electrode, the drain electrode, the source wiring, and the drain wiring can be formed from the same conductive material, or different conductive material.

The method does not use the concept that a contact hole is formed in the planarizing film. However, it seems that the contact hole is formed in appearance. Hence, the method is referred to as loose contact. As the planarizing film, organic resin such as acrylic, polyimide, or polyamide; or an insulating film containing siloxane is preferably used.

An orientation film 173 is formed over a TFT substrate and rubbing treatment is carried out. The orientation film 173 is preferably formed by the droplet discharge method selectively.

Figure 30B:
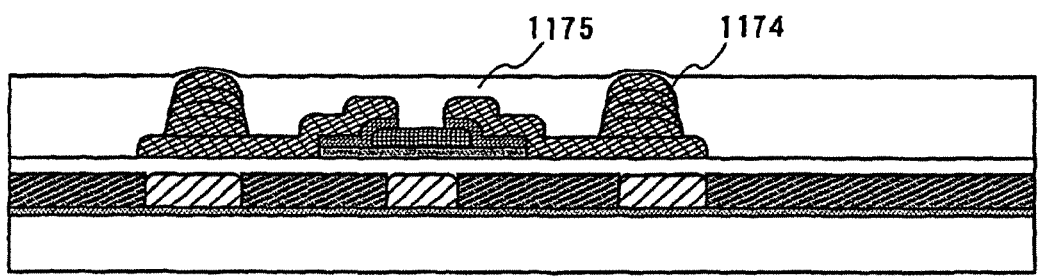
Figure 30C:
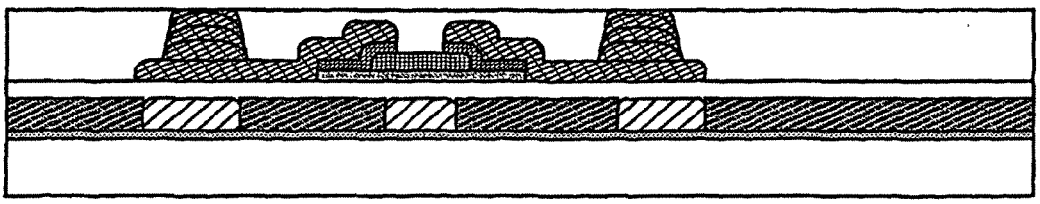
Figure 30D:
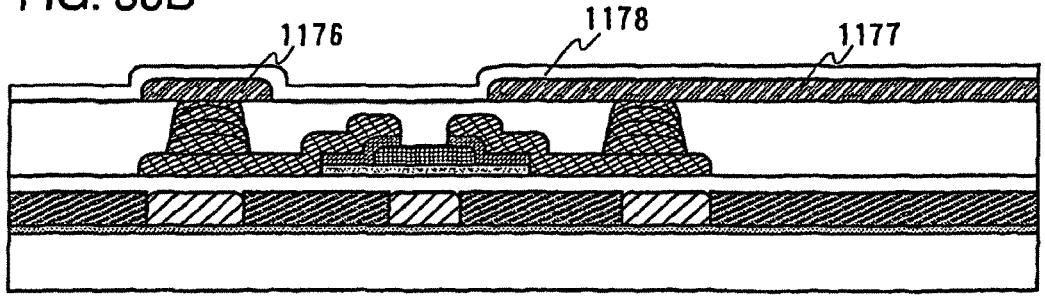

As the second method, as shown in FIG. 30B, a column like conductor 1174 (also referred to as a pillar, plug, or the like) is formed by the droplet discharge method over a source electrode or a drain electrode of a TFT manufactured according to the present invention. As a conductive material for forming the pillar, a similar material for forming the foregoing gate electrode layer or the like can be used. A planarizing film 1175 is formed over the column like conductor 1174 by the droplet discharge method or the like. The planarizing film is preferably formed from organic resin such as acrylic, polyimide, or polyamide; or an insulating film containing siloxane by a droplet discharge method selectively.

In the case where a planarizing film is formed over the pillar, the surface of the planarizing film and the pillar are etched back to obtain a pillar having a planarized surface as shown in a diagram at the center of FIG. 30B. A source wiring and a drain wiring for connecting to a source electrode and a drain electrode are formed over the planarizing film by a droplet discharge method. Thereafter, a pixel electrode is formed to connect to the source wiring or the drain wiring. Further, the source electrode, the drain electrode, the pillar, the source wiring, and the drain wiring are formed from the same conductive materials or different conductive materials.

An orientation film 1178 is formed over a TFT substrate and rubbing treatment is carried out. The orientation film 1178 is preferably formed from a droplet discharge method selectively.

Figure 31A:
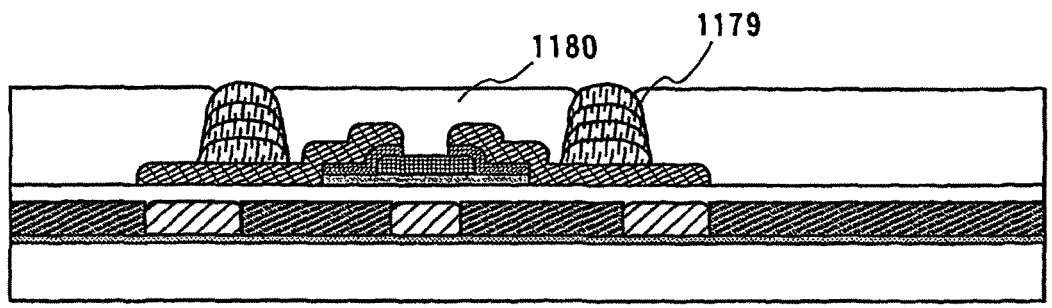
FIGS. 31A to 31C explain a method of connection between a TFT and a pixel electrode according to the invention.
Figure 31B:
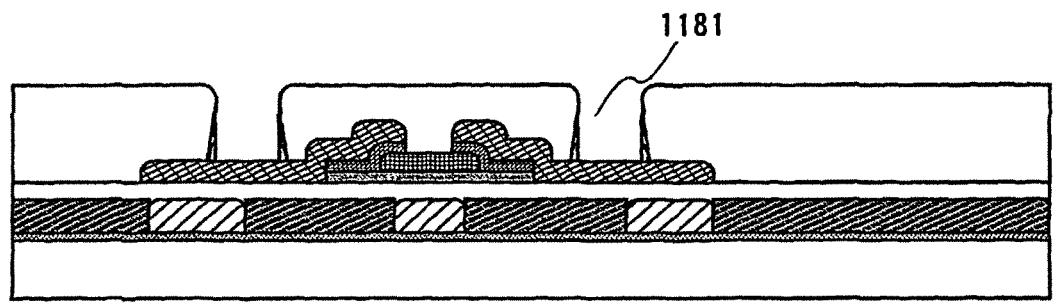
Figure 31C:
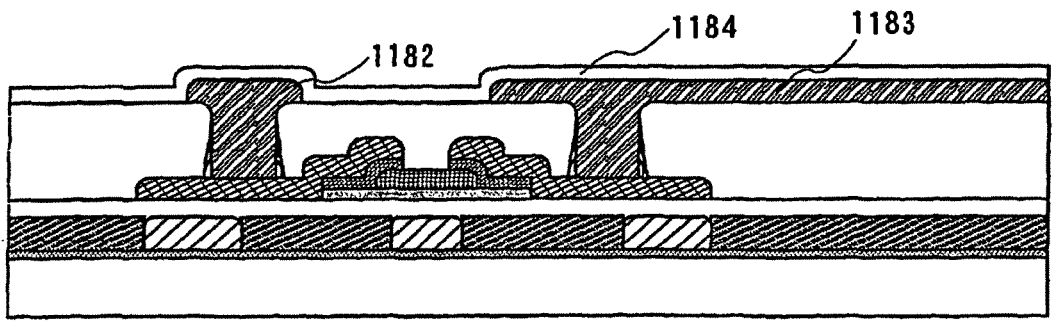

As the third method, as shown in FIG. 31, a columnar insulator 1179 (also referred to as a pillar insulator) which is repellent to the material of a planarizing film 1180 is formed over the source electrode or the drain electrode of the TFT manufactured according to the present invention by a droplet discharge method; and the planarizing film 1180 is formed at the periphery of the pillar insulator 1179. As a material for the pillar insulator, water-soluble organic resin such as PVA (polyvinyl alcohol) is treated in $CF_4$ plasma or the like to obtain liquid repellency can be used. The planarizing film is preferably formed by organic resin such as acrylic, polyimide, or polyamide; or an insulating film containing siloxane by a droplet discharge method selectively. After forming the planarizing film 1180 at the periphery of the pillar insulator 1179, the pillar insulator 1179 can be easily removed by water washing, etching, or the like. In the case of removing by etching, an anisotropic etching is preferably carried out to prevent a contact hole from having a reverse-taper shape. Further, since the pillar insulator such as PVA has an insulating property, there will arise no problem even if a part of the pillar insulator is left at the sidewall of the contact hole.

Thereafter, a source wiring and a drain wiring connected to a source electrode and a drain electrode through a contact hole are formed by a droplet discharge method over the planarizing film. The source wiring or the drain wiring in the pixel TFT can serve as a pixel electrode as shown in a diagram at the bottom of FIG. 31C. Needless to say, the pixel electrode can be formed separately to connect to the source wiring or the drain wiring. Further, the source electrode, the drain electrode, the source wiring, and the drain wiring are formed from the same conductive materials or different conductive materials. In the case where a contact hole is formed to have a reverse-taper shape due to a removing process of the foregoing pillar insulator, a composition containing a conductive material may be stacked by a droplet discharge method to fill the contact hole in forming the source wiring and the drain wiring.

An orientation film 1184 is formed over a TFT substrate and rubbing treatment is carried out. The orientation film 1184 is preferably formed selectively by a droplet discharge method.

Figure 32A:
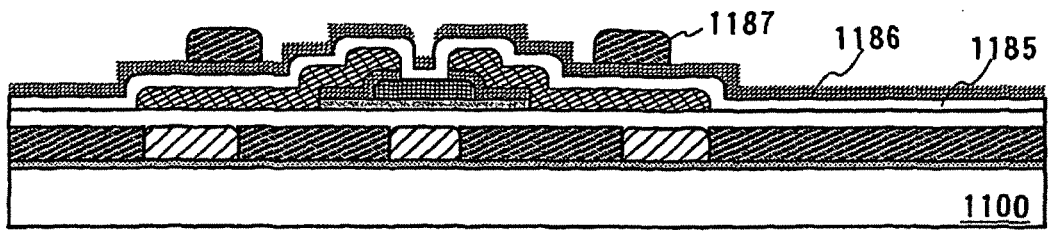
FIGS. 32A to 32C explain a method of connection between a TFT and a pixel electrode according to the invention.
Figure 32B:
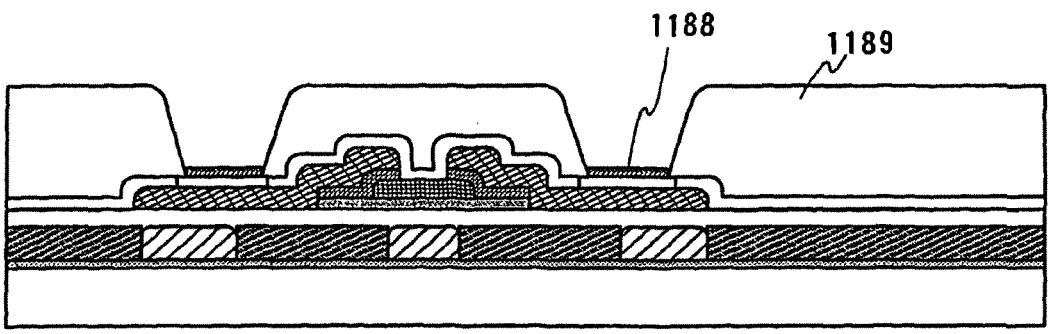
Figure 32C:
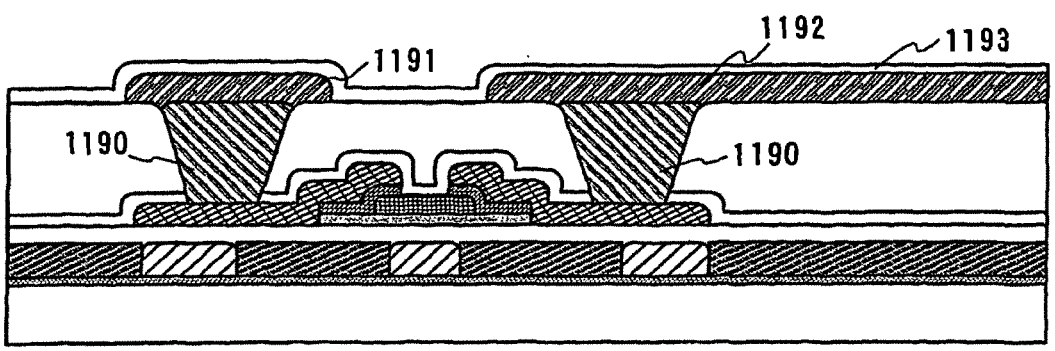

As the fourth method, as shown in FIG. 32, a material 1186 which is repellent to a material of a planarizing film 1189 (hereinafter, liquid-repellent material 1186) is formed over a source electrode and a drain electrode of a TFT manufactured according to the present invention by a droplet discharge method, spin coating, spraying, or the like; a mask 1187 is formed from PVA, polyimide, or the like is formed over the region where a contact hole is to be formed; the liquid repellent material 1186 is removed by using PVA or the like; and a planarizing film 1189 is formed at the periphery of the left liquid repellent material 1186. As a material for forming the liquid repellent material 1186, a fluorine-based silane coupling agent such as FAS (fluoroalkylsilane) or the like can be used. The mask 1187 of PVA, polyimide, or the like may be selectively formed by a droplet discharge method. The liquid repellent material 1186 can be removed by $O_2$ aching or atmospheric pressure plasma. Further, the mask 1187 formed from PVA can be easily removed by water washing, or the mask 1187 formed by polyimide can be easily removed by a stripper N300.

In the state that the liquid repellent material 1186 is left in the region where a contact hole is to be formed (FIG. 32B), the planarizing film 1170 is formed by a droplet discharge method, spin coating, or the like. Since the liquid repellent material 1186 is partially left in the region where a contact hole is to be formed, the planarizing film is not formed thereover. Further, the contact hole is not likely to be formed to a reverse-taper shape. The planarizing film is preferably formed from organic resin such as acrylic, polyimide, or polyamide; or an insulating film having a Si—O bond and a Si—$CH_x$ bond, which is formed from a siloxane based material as a starting material selectively by a droplet discharge method. After forming the planarizing film 1189, a liquid repellent material 1182 is removed by $O_2$ ashing or atmospheric pressure.

Since a passivation film 1185 for protecting a TFT is provided, the surfaces of the source electrode and the drain electrode are exposed by etching simultaneously with or after removing the liquid repellent material 1182. The passivation film 1185 is desirably formed as much as possible to protect the TFT against dispersion of impurities or the like.

Thereafter, a source wiring or a drain wiring 1190 connected to a source electrode or a drain electrode through a contact hole is formed over the planarizing film by a droplet discharge method. A pixel electrode 1192 is formed to connect to the source wiring or the drain wiring. Further, the source electrode, the drain electrode, and the source wiring, and the drain wiring are formed from the same conductive materials or different conductive materials.

An orientation film 1193 is formed over a TFT substrate and rubbing treatment is carried out. The orientation film 1193 is preferably formed by a droplet discharge method selectively.

In the foregoing first to fourth methods, not shown in FIGS. 30A to 32C, the adhesion between the substrate and the gate electrode layer may be improved by interposing a TiOx film or the like therebetween by pretreatment. The pretreatment can be carried out also in the case of forming the source wiring, the drain wiring, the pillar, the conductors 1172, 1173, and the like. As the pretreatment, the treatment explained in Embodiment Modes can be used.

The steps of applying or injecting liquid crystal, boding substrates, installing a backlight unit, and the like after the formation of a TFT substrate can be carried out in a similar way to the foregoing embodiment mode. This embodiment mode can be freely combined with another embodiment mode.

Embodiment Mode 19

In this embodiment mode, a method for manufacturing an active matrix LCD panel according to the present invention will be explained with reference to FIGS. 33A to 35H. FIGS. 33A to 35H are process drawings of FIG. 39 taken along lines A-B and C-D.

Over a substrate 1600, a titanium oxide 1601 is formed firstly; a first insulating layer 1602 is formed; gate electrode layers 1603a, 1603b of driver circuit TFTs 1652, 1653 provided in a driver circuit area 1657 are formed; a gate electrode layer 1604 of a pixel TFT 1654 provided to a pixel area 1658; a capacitor electrode 1605 of a storage capacitor 1655 is formed; a wiring 1606 connected to an FPC of a terminal area 1651 (FIG. 33A).

Next, a gate insulating film 1607 is formed; and a semiconductor film 1608 is formed, then, a channel protective film 1609 is formed (FIG. 33B).

After forming an n-type semiconductor film all over a substrate, an island like semiconductor film 1612 is formed by etching using a photoresist 1611 provided over a region where n-channel TFTs 1652, 1654, and a storage capacitor 1655 are formed, as a mask (FIG. 33C). The photoresist 1611 is preferably formed by a droplet discharge method selectively.

Figure 34A:
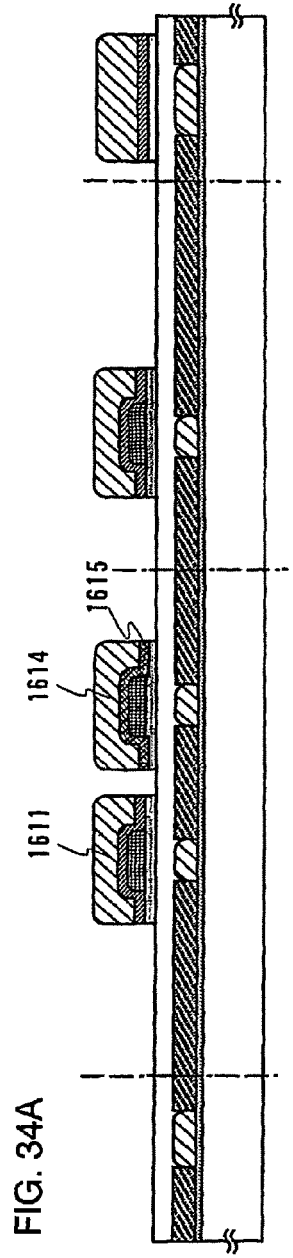
FIGS. 34A to 34C show manufacturing steps of a liquid crystal display device according to the invention (driver circuit CMOS).

In the state that the photoresist 1611 is left, a p-type semiconductor film is formed all over the substrate, and an island like semiconductor film 1615 and an island like semiconductor film are formed by etching using a photoresist 1614 provided over a region where a p-channel TFT 1653 is formed, as a mask (FIG. 34A). Further, the photoresist is preferably formed by a droplet discharge method selectively. A p-type semiconductor film may be formed at the storage capacitor instead of forming an n-type semiconductor film.

Figure 34B:
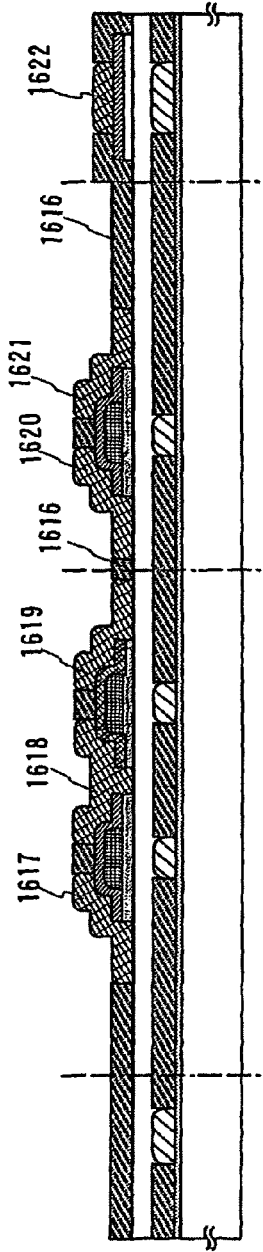

Then, the photoresist 1611 and 1614 are removed by $O_2$ ashing, atmospheric plasma, or the like; and a second insulating layer 1616 is formed; and then, source electrodes and drain electrodes 1617 to 1621, and a counter electrode 1622 of the storage capacitor are formed in a pore of the second insulating layer 1616 (FIG. 34B).

Figure 34C:
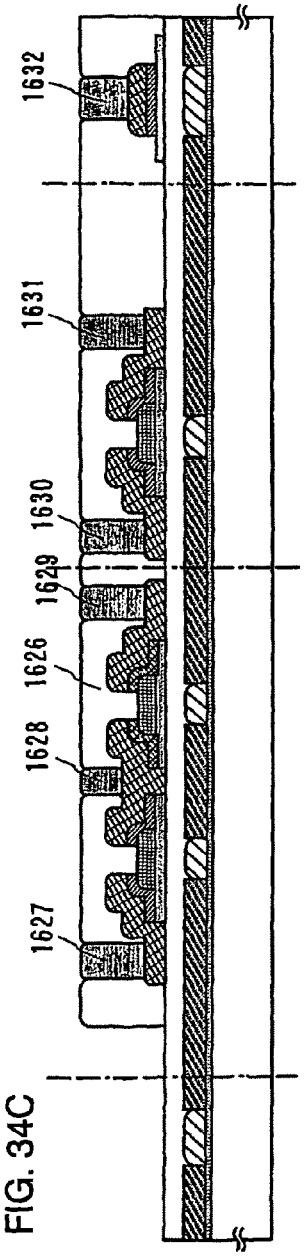

After the second insulating layer 1616 is removed, a source region and a drain region are formed by channel etching. After a third insulating film 1626 is formed, source wirings and drain wirings 1627 to 1631 and a capacitor wiring 1632 are formed in a pore of the third insulating layer 1626 (FIG. 34C).

A first insulating layer 1602 and a gate insulating film 1607, each of which is provided over a terminal area, are removed by etching using the third insulating layer 1626 as a mask to expose a wiring 1606 of a portion connected to an FPC (FIG. 35A). Here, plasma etching is adopted using an etching gas of, but not exclusively, a chlorine gas such as $Cl_2$, $BCl_3$, $SiCl_4$, or $CCl_4$; a fluoride gas such as $CF_4$, $SF_6$, $NF_3$, or $CHF_3$; or $O_2$. The etching can be carried out by using atmospheric plasma. In this case, a mixed gas of $CF_4$ and $O_2$ is preferably used as an etching gas. In addition, $O_2$ ashing can be used. The first insulating layer 1602 and the gate insulating film 1607 may be removed separately by combining the foregoing methods. If the wiring 1606 is exposed, the first insulating layer 1602 is not required to be removed. Thereafter, a pixel electrode 1633 is formed to connect to a source wiring or a drain wiring of a pixel TFT (FIG. 35A).

The state is shown where a TFT substrate and the counter substrate 1636 are pasted to each other with sealant 1640 with a liquid crystal layer 1635 interposed therebetween. A column like spacer 1639 is formed over the TFT substrate. The column like spacer 1639 may be formed along with a concave of a contact portion formed over the pixel electrode. The height of the column like spacer 1639 is, although it depends on a liquid crystal material, preferably 3 to 10 µm. A concave portion corresponding to a contact hole is formed at the contact portion. The distortion of liquid crystal orientation can be prevented by forming the spacer along with the concave.

An orientation film 1634 is formed over the TFT substrate, and rubbing treatment is carried out. A transparent conductive film 1637 and an orientation film 1638 are provided on the counter substrate 1636. Thereafter, the TFT substrate is pasted onto the counter substrate 1636 with sealant. Then, liquid crystal is injected between the TFT substrate and the counter substrate 1636 to form a liquid crystal layer 1635. Thus, an active matrix liquid crystal display device can be completed. Further, the liquid crystal layer 1635 may be formed by applying liquid crystals as shown in FIG. 41. It is effective especially in the case of manufacturing a liquid crystal display device using a large active matrix substrate.

The orientation films 1634, 1638, and the column like spacer 1639 may be selectively formed by a droplet discharge method. The droplet discharging can be effectively used for manufacturing a liquid crystal display device using a large active matrix substrate.

With respect to the terminal area, as shown in FIGS. 33A to 34F, a gate insulating film is left in the terminal area. Therefore, a contact hole is required to be formed or the gate insulating film 1607 is required to be removed to connect a wiring that is formed simultaneously with forming a gate electrode layer to an FPC (Flexible Printed Circuit) 1643. Here, as above described, the first insulating layer 1602 and the gate insulating film 1607 are removed by etching. By pasting the wiring 1606 and the FPC 1628 to a terminal electrode 1641 with an anisotropic conductive film 1642 by a known method, the wiring 1606 and the FPC 1643 can be connected with each other. The terminal electrode 1641 is preferably formed with a transparent conductive film.

As another method for forming a contact hole, a method in which a periphery portion of a part to be provided with a contact hole is covered with a conductor formed by a droplet discharge method, and a contact hole may be formed by using the conductor as a mask. Moreover, a plug like conductor can be formed over a gate insulating layer by filling the contact hole with a conductor that is the same or different from the foregoing conductor. Moreover, the wiring 1606 can be connected to the FPC 1643 by pasting the plug like conductor and the FPC 1643 to the terminal electrode 1641 by a known method using an anisotropic conductive film 1642. In this instance, the contact hole at the FPC portion may be formed in manufacturing the TFT, or the contact hole may be formed by forming the plug like conductor simultaneously with forming the source wiring and the drain wiring. As an advantage of the droplet discharge method, a composition can be selectively discharged onto the desired area. Hence, the one step can preferably replaces a plurality of steps.

By removing the gate insulating film simultaneously with forming the island like semiconductor film or the island like n-type semiconductor film by etching, a contact hole is not required to be formed in connecting the FPC. Note that an insulator is required to be formed separately by a droplet discharge method over a storage capacitor, a intersection of a scan line and a signal line, or the like since the gate insulating film except the TFT portion is all removed.

The gate insulating film can be formed by a linear plasma method over a region except an FPC connecting region of the substrate.

Through the foregoing processes, an active matrix LCD panel using a TFT manufactured according to the present invention is completed. The TFT can be manufactured by using methods explained in the foregoing embodiment mode. Here, one transistor is provided per one pixel; however, two or more transistors can be provided per one pixel to acquire a multi-gate structure. The TFT may have either n-type polarity or n-type polarity. Further, the TFT may have a CMOS structure composed of an n-type TFT and a p-type TFT. In the case of forming a CMOS structure, after selectively forming the foregoing planarizing film, wirings for forming each TFT can be formed of a composition containing a conductive material discharged by a droplet discharge method.

This embodiment mode can be freely combined with another embodiment mode.

Embodiment Mode 20

Figure 36A:
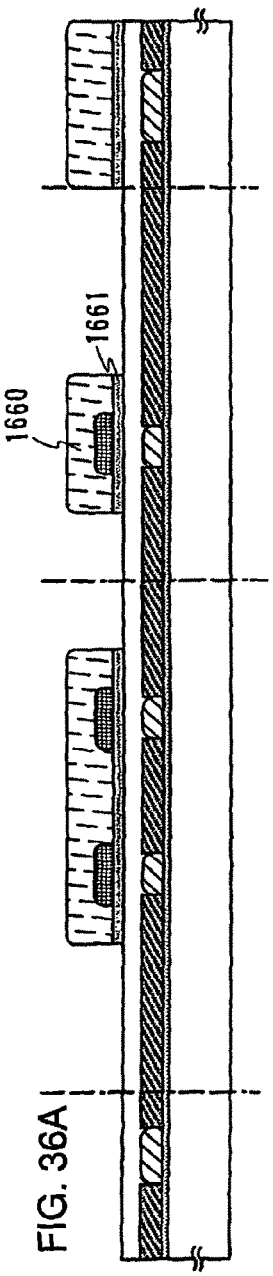
FIGS. 36A to 36D show manufacturing steps of a liquid crystal display device according to the invention (laser doping).

In this embodiment mode, another manufacturing method of an active matrix LCD panel according to the present invention will be explained with reference to FIGS. 36A to 37C. FIGS. 36A to 37C are process drawings of FIG. 39 taken along lines A-B and C-D. The process up to forming a channel protective film and forming an island like semiconductor film 1661 can be carried out in a way similar to another embodiment mode (FIG. 36A).

Figure 36B:
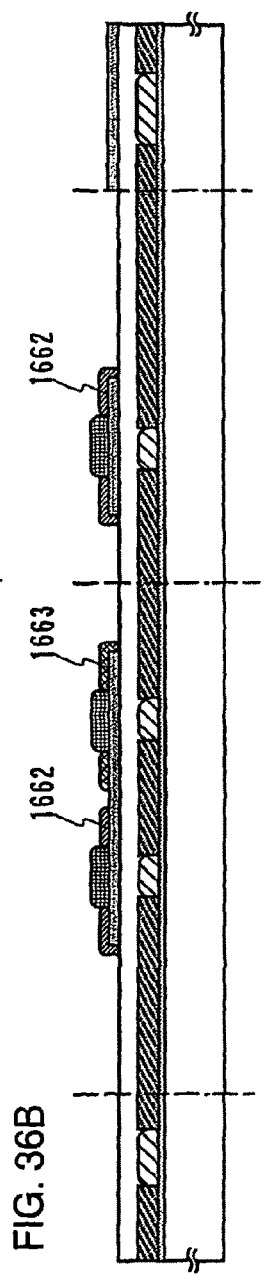

After a photoresist 1660 used for forming an island like semiconductor film 1661 is removed, a dopant source containing an n-type impurity 1662 is selectively formed over island like semiconductor films of n-channel TFTs 1652, 1654 by a droplet discharge method; and a dopant source containing a p-type impurity 1663 is selectively formed over an island like semiconductor film of a p-channel TFT 1653 by a droplet discharge method. (FIG. 36B)

Figure 36C:
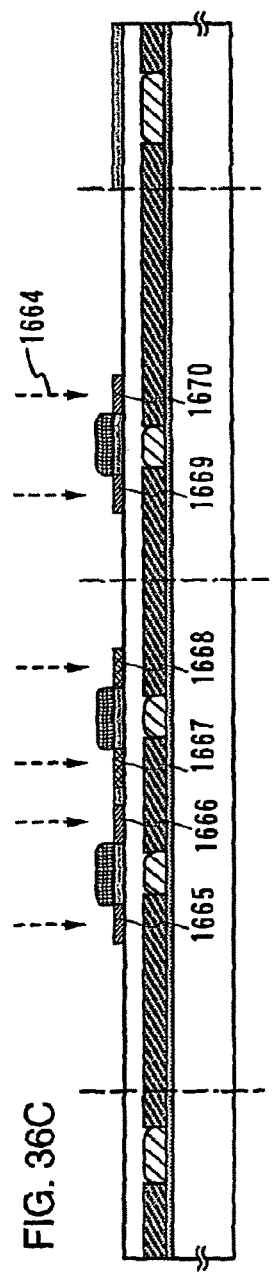

A substrate is irradiated with laser 1664 (referred to as laser doping); thus, the dopant sources 1662, 1663 are introduced into the island like semiconductor film 1661 to form source and drain regions 1665 to 1670 (FIG. 36C). As the laser 1664, excimer, Nd: YAG, $CO_2$, ruby, alexandrite, or the like can be used. Especially, the excimer laser is suitable for forming an extreme shallow doping layer since the excimer laser emits short pulse light with a short wavelength in a ultraviolet range; thus, it intrudes into a semiconductor film lightly and it has a short thermal effect time. As the dopant source, a dopant source in a solid state or a liquid state applied by a droplet discharge method is used here. Alternatively, gas can be used. In this instance, atmosphere is required to be changed depending on an n-type or p-type. In the case of adopting a dopant source in a solid state or a liquid state, there is an advantage that an impurity region can be formed by a single laser irradiation. By using the laser doping method, a channel etching process can be omitted; thus, a manufacturing process can be drastically simplified.

Figure 36D:
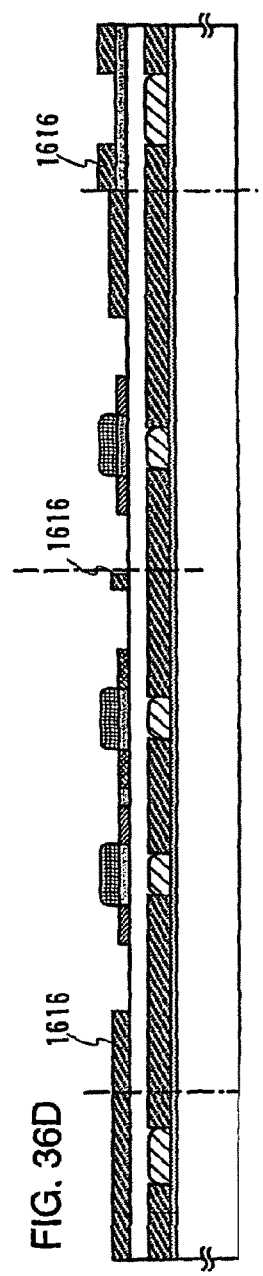

After forming a second insulating layer 1616, source and drain electrodes 1617 to 1621, and a counter electrode 1622 of the storage capacitor is formed in a pore of the second insulating layer 1616 (FIG. 36D, FIG. 37A).

A first insulating layer 1602 and a gate insulating film 1607, each of which is provided in a terminal area, are removed by etching using the third insulating layer 1626 as a mask to expose a wiring 1606 of a portion connected to an FPC (FIG. 37B). Here, plasma etching is adopted using an etching gas of, but not exclusively, a chlorine gas such as $Cl_2$, $BCl_3$, $SiCl_4$, or $CCl_4$; a fluoride gas such as $CF_4$, $SF_6$, $NF_3$, or $CHF_3$; or $O_2$. The etching can be carried out by using atmospheric plasma. In this instance, a mixed gas of $CF_4$ and $O_2$ is preferably used as an etching gas. In addition, $O_2$ ashing can be used. The first insulating layer 1602 and the gate insulating film 1607 may be removed separately by combining the foregoing methods. Thereafter, a pixel electrode 1633 is formed so as to connect to a source wiring or a drain wiring of a pixel TFT (FIG. 37B).

A liquid crystal layer 1635 is interposed between a TFT substrate and the counter substrate 1636, which are bonded together with sealant 1640. A column like spacer 1639 is formed over the TFT substrate. The column like spacer 1639 may be formed along with a concave of a contact portion formed over the pixel electrode. The height of the column like spacer 1639 is, although it depends on a liquid crystal material, preferably 3 μm to 10 μm. A concave corresponding to a contact hole is formed at the contact portion. Thus, distortion of liquid crystal orientation can be prevented by forming the spacer along with to the concave portion.

An orientation film 1634 is formed over the TFT substrate, and rubbing treatment is carried out. A transparent conductive film 1637 and an orientation film 1638 are provided on the counter substrate 1636. Thereafter, the TFT substrate is pasted onto the counter substrate 1636 with sealant. Then, liquid crystal is injected between the TFT substrate and the counter substrate 1636 to form a liquid crystal layer 1635. Thus, an active matrix liquid crystal display device can be completed. Further, the liquid crystal layer 1635 may be formed by discharging liquid crystal as shown in FIG. 41. The droplet discharge method can be effectively used especially for manufacturing a liquid crystal display device using a large active matrix substrate.

The orientation films 1634, 1638, and the column like spacer 1639 may be selectively formed by a droplet discharge method. The droplet discharge method can be effectively used especially for manufacturing a liquid crystal display device using a large active matrix substrate.

The terminal area can be formed in a way similar to Embodiment Mode 19.

Through the foregoing steps, an active matrix LCD panel using a TFT manufactured according to the present invention is completed. The TFT can be manufactured by using methods explained in the foregoing embodiment mode. Here, one transistor is provided per one pixel; however, two or more transistors can be provided per one pixel to acquire a multi-gate structure. The TFT may have either n-type polarity or n-type polarity. Further, the TFT may have a CMOS structure composed of an n-type TFT and a p-type TFT. In the case of forming a CMOS structure, after selectively forming the foregoing planarizing film, wirings for forming each TFT can be formed of a composition containing a conductive material discharged by a droplet discharge method.

This embodiment mode can be freely combined with another embodiment mode.

Embodiment Mode 21

Figure 55:
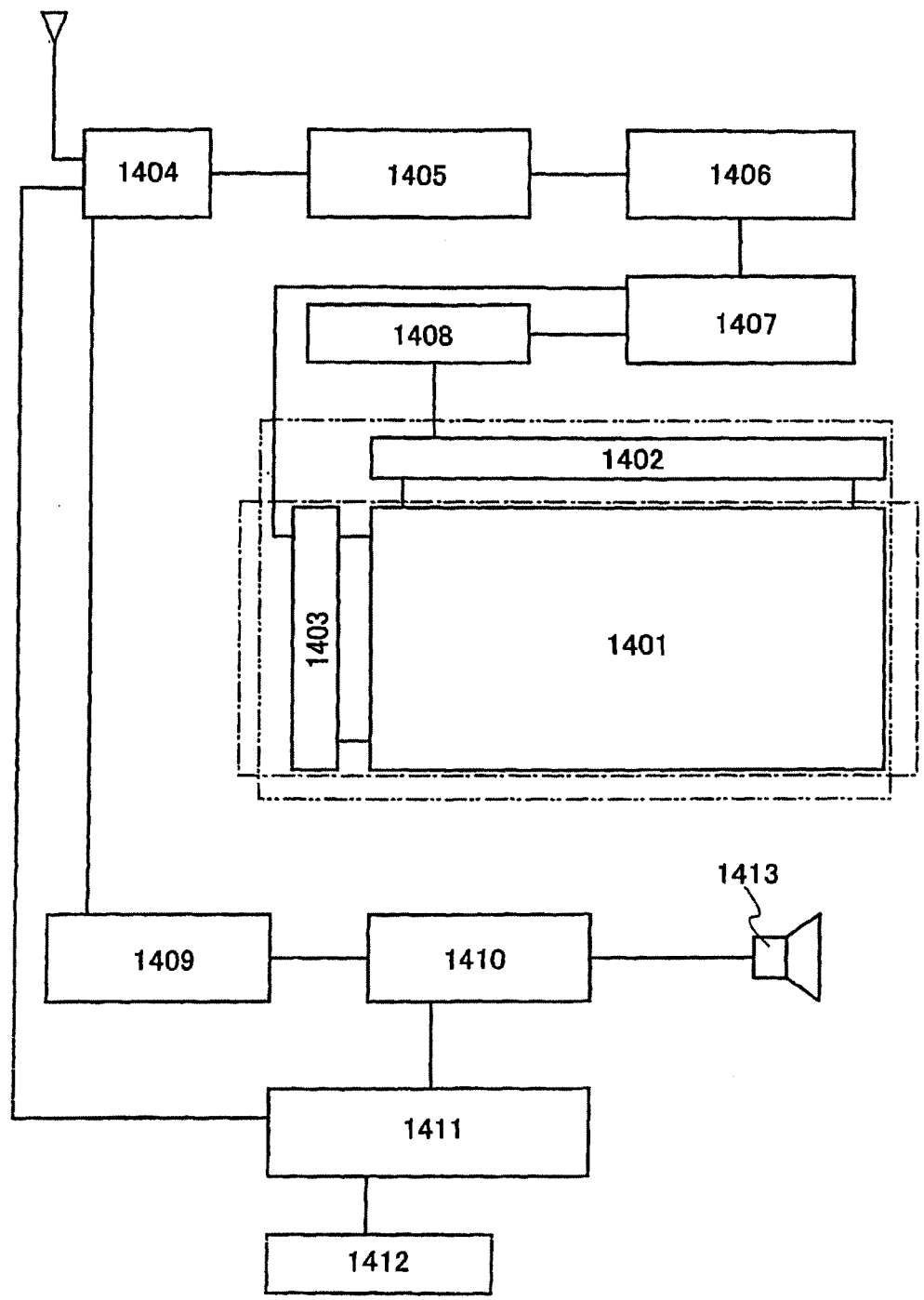
FIG. 55 is a block diagram showing a main structure of a liquid crystal is a television receiver according to the invention.

In this embodiment mode, a liquid crystal television system using a liquid crystal panel manufactured according to the foregoing embodiment mode will be explained. FIG. 55 is a block diagram showing main components of the liquid crystal television system. The liquid crystal panel has various structures in which (1) only a pixel area 1401 is formed, and a scan line driver circuit 1403 and a signal line driver circuit 1402 are installed by TAB; (2) the pixel area 1401 is installed by COG system, and the scan line driver circuit 1403 and the signal line driver circuit 1402 are installed at the periphery of the pixel area 1401 by COG; and (3) a TFT is formed from SAS, the pixel area 1401 and the scan line driver circuit 1403 are integrally formed over the substrate, and the signal line driver circuit 1402 is separately installed as a driver IC. Any method among the foregoing methods can be adopted.

As another external circuit, a video signal amplifier circuit 1405 for amplifying a video signal among signals received by a tuner 1404 at an input side of the r; an video signal processing circuit for converting signals outputted from the video signal amplifier circuit 1405 into color signals corresponding to red, green, and blue; a control circuit 1407 for converting the video signal into input specification of the driver IC; and the like are provided. In the control circuit 1407, signals are outputted to the side of a scan line and the side of the signal line, respectively. In the case of digital driving, a signal separation circuit 1408 may be provided at the side of a signal line to separate an input digital signal into m pieces and to supply the separated signals.

An audio signal among the signals received by the tuner 1404 is transmitted to an audio signal amplifier circuit 1409, and the output is supplied to a speaker 1413 via an audio signal processing circuit 1410. A control circuit 1411 receives control information of a reception station (reception frequency) or volume to send the signals to the tuner 1404 or the sound signal processing circuit 1410.

Embodiment Mode 22

In this embodiment mode, the state where the LCD panel explained in the foregoing embodiment mode is modulated will be explained with reference to FIGS. 40A and 40B.

Figure 40A:
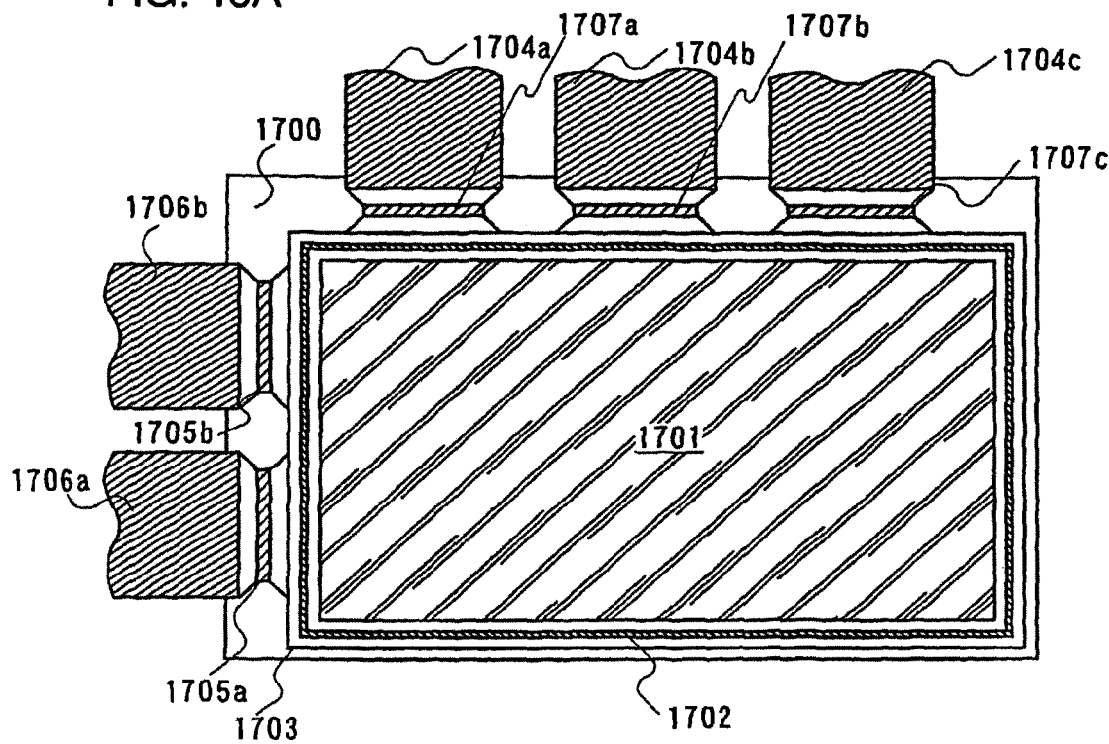
FIGS. 40A and 40B each explains a liquid crystal module of the invention.

In a module shown in FIG. 40A having a pixel area provided with a driver circuit at the periphery thereof, a driver IC is mounted by COG (Chip On Glass). Alternatively, the driver IC can be mounted by TAB (Tape Automated Bonding).

A substrate 1700 is fixed by a counter substrate 1703 and sealant 1702. A pixel area 1701 may utilize liquid crystals as a display medium as shown in the foregoing embodiment mode, or a light-emitting element as a display medium. Driver ICs 1705a, 1705b, and driver ICs 1707a, 1707b, and 1707c can utilize integrated circuits formed from a single crystal semiconductor or a polycrystalline semiconductor. Signals and power are supplied to the driver ICs 1705a, 1705b, and the driver ICs 1707a, 1707b, and 1707c through FPCs 1704a, 1704b, and 1704c, or FPCs 1706a, 1706b.

Figure 40B:
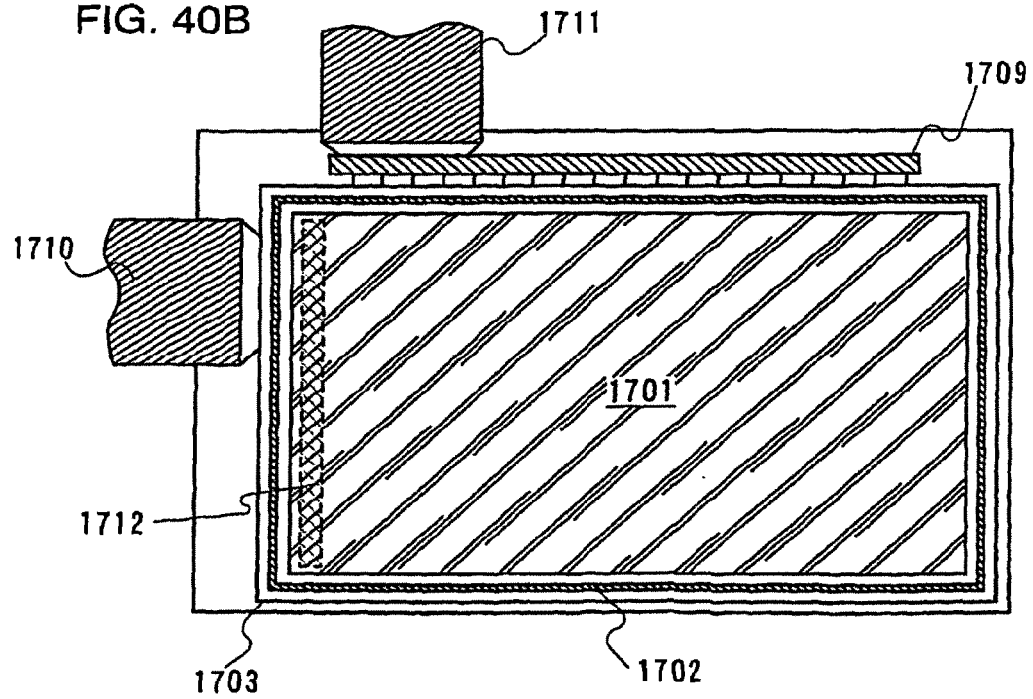

In a module shown in FIG. 40B, a gate driver 1712 is integrally formed over a substrate and connected to an FPC 1710. The gate driver 1712 is preferably manufactured by using semiamorphous silicon (SAS) having high mobility. A source driver 1709 is separately formed from polycrystalline silicon and divided into sticks. The stick of the gate driver is pasted and connected to an FPC 1711. A gate driver 1712 separately formed from polycrystalline silicon and divided into sticks may be used. By forming a driver (driver circuit) portion integrally over a substrate or dividing it into sticks, a manufacturing process can be simplified compared with that for pasting a number of IC chips. Further, space between substrates can be used efficiently.

Embodiment Mode 23

Figure 51A:
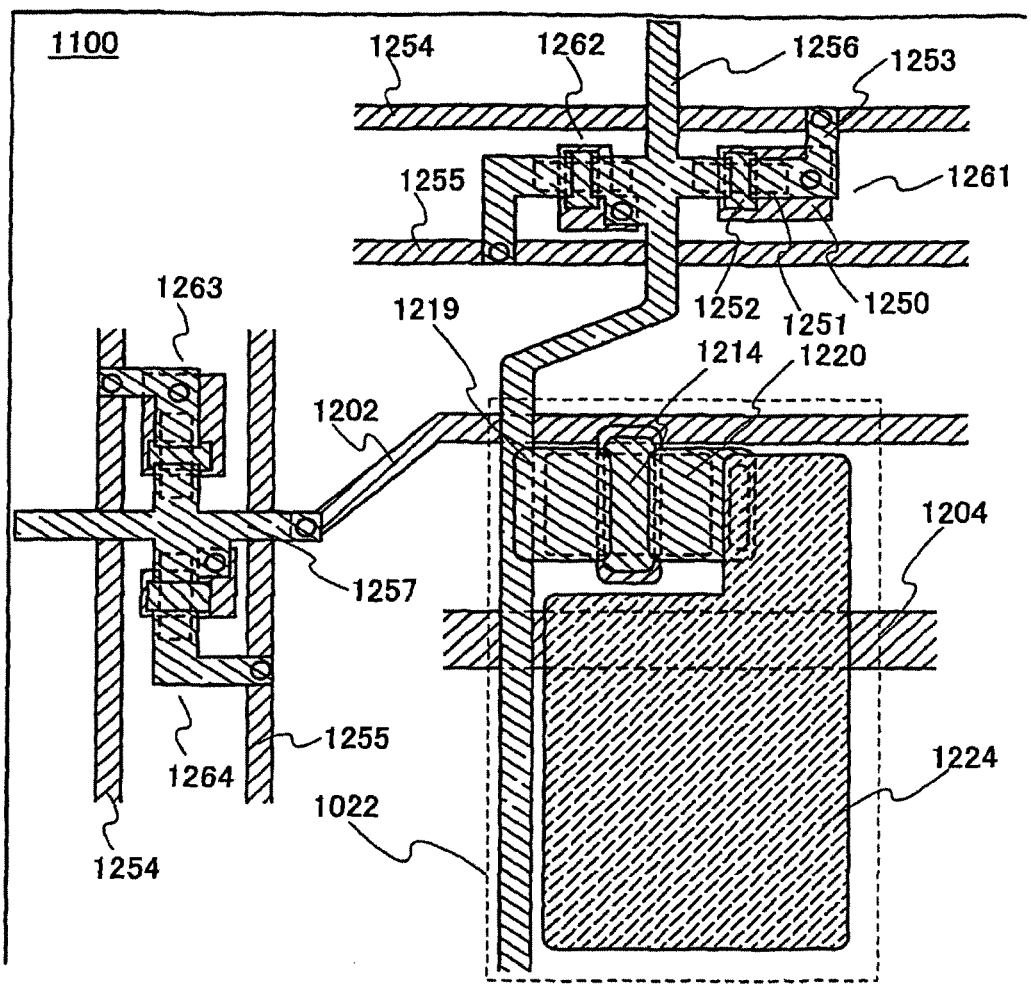
FIGS. 51A and 51B are top views each showing a protective circuit area of a liquid crystal display panel according to the invention.
Figure 51B:
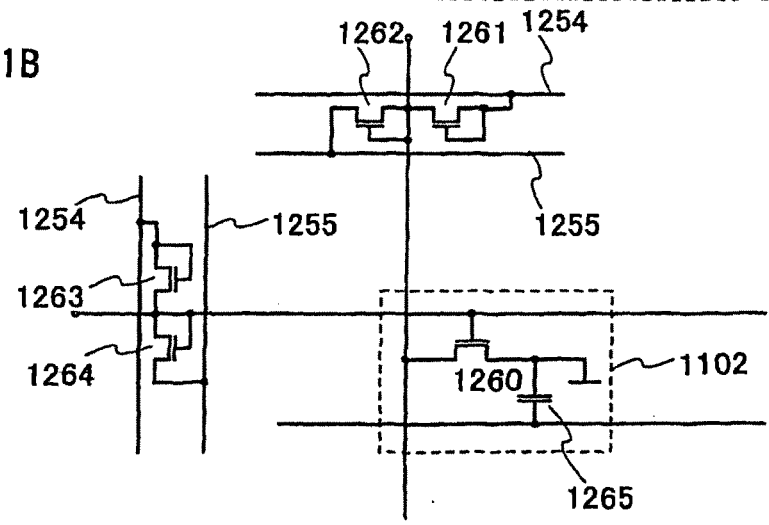

In this embodiment mode, the state where a protection diode is provided in a scan line input terminal area and a signal line input terminal area will be explained with reference to FIGS. 51A and 51B. In FIG. 51A, a TFT 1260 is provided in a pixel 1022. The TFT has a structure similar to that explained in the foregoing embodiment mode.

The signal line input terminal area is provided with protection diodes 1261 and 1262. The protection diodes are manufactured by a process similar to that for forming a TFT. The diode is operated by connecting a gate to a drain or a source. FIG. 51B is an equivalent circuit diagram of a top view shown in FIG. 51A.

The protection diode 1261 is composed of a gate electrode layer 1250, a semiconductor layer 1251, a channel protective insulating layer 1252, and a wiring layer 1253. The TFT 1262 has a structure similar to that of the protection diode 1261. Wirings 1254, 1255 connected to the protection diodes are formed in the same layer as the gate electrode layer. Therefore, a contact hole is required to be formed in the gate insulating layer to electrically connect the protection diode to the wiring layer 1253.

For forming the contact hole in the gate insulating layer, the mask layer is formed by a droplet discharge method, and etching treatment may be carried out. In this instance, the mask layer is not required to be formed all over a substrate in the case where an etching process of atmospheric discharge that allows a local discharge processing is carried out.

The protection diodes 1261, 1262, and a source and drain wiring layer 1219 are formed in one layer. A signal wiring layer 1256 connected to the protection diodes 1261, 1262 is connected to the source side or the drain side.

An input terminal at the side of a scanning signal line has a structure similar to the foregoing structure. According to the present invention, a protection diode provided at an input stage can be formed simultaneously. The position of inserting the protection diode is not limited to this embodiment mode. The protection diode can be provided between a driver circuit and a pixel. This embodiment mode can be freely combined with another embodiment mode.

Embodiment Mode 24

In this embodiment mode, the case that a driver circuit at a scan line side is formed over a substrate 100 by forming a semiconductor layer from SAS will be described.

Figure 52:
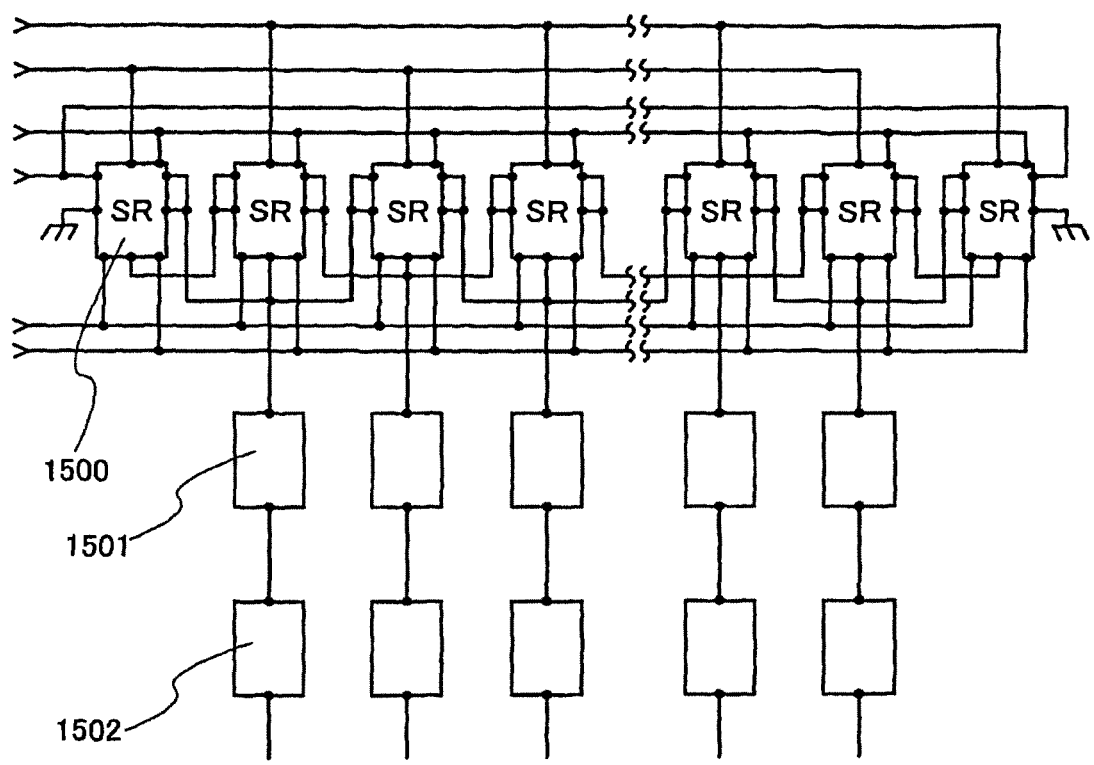
FIG. 52 explains a circuit structure in the case of forming a scan line driver circuit with a TFT in a liquid crystal display panel according to the invention.

FIG. 52 is a block diagram for showing a scan line driver circuit composed of an n-channel TFT using SAS that gives field effect mobility of 1 cm$^2$/V·sec to 15 cm$^2$V·sec.

In FIG. 52, a block denoted by reference numeral 1500 corresponds to a pulse output circuit for outputting sampling pulses of one stage. A shift resistor is composed of n pieces of pulse output circuits. Reference numeral 1501 denotes a buffer circuit to be connected to a pixel 502.

Figure 53:
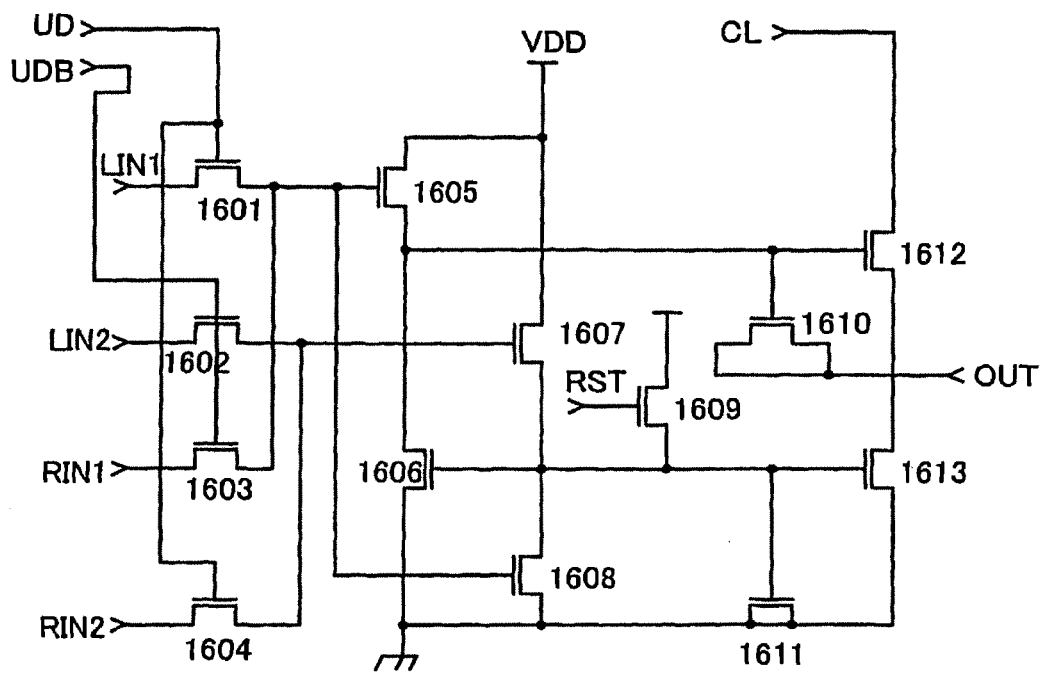
FIG. 53 explains a circuit structure in the case of forming a scan line driver circuit with a TFT in a liquid crystal display panel according to the invention (a shift register circuit).

FIG. 53 shows a specific structure of the pulse output circuit 1500 composed of n-channel TFTs 1601 to 1612. In this instance, the size of the TFTs may be determined in consideration of operation characteristics of the n-channel TFT using SAS. For example, a channel width can be set in the range of 10 μm to 80 μm in the case of a channel length of 8 μm.

Figure 54:
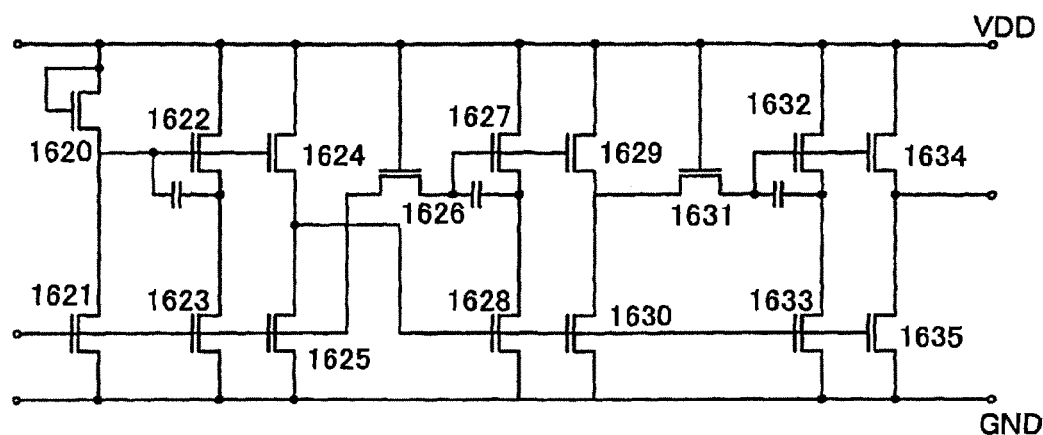
FIG. 54 explains a circuit structure in the case of forming a scan line driver circuit with a TFT in a liquid crystal display panel according to the invention (a buffer circuit).

FIG. 54 shows a specific structure of the buffer circuit 1501. Similarly, a buffer circuit is formed of n-channel TFTs 1620 to 1636. In this instance, the size of the TFTs may be determined in consideration of operation characteristics of the n-channel TFTs using SAS. For example, a channel width can be set in the range of 10 μm to 1800 μm in the case of a channel length of 10 μm.

This embodiment mode can be freely combined with another embodiment mode.

Embodiment Mode 25

Figure 19A:
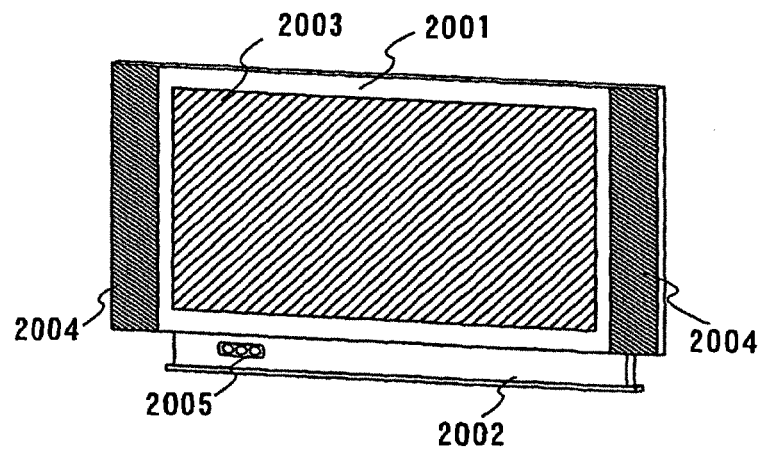
FIGS. 19A and 19B each show a television system of the invention.
Figure 19B:
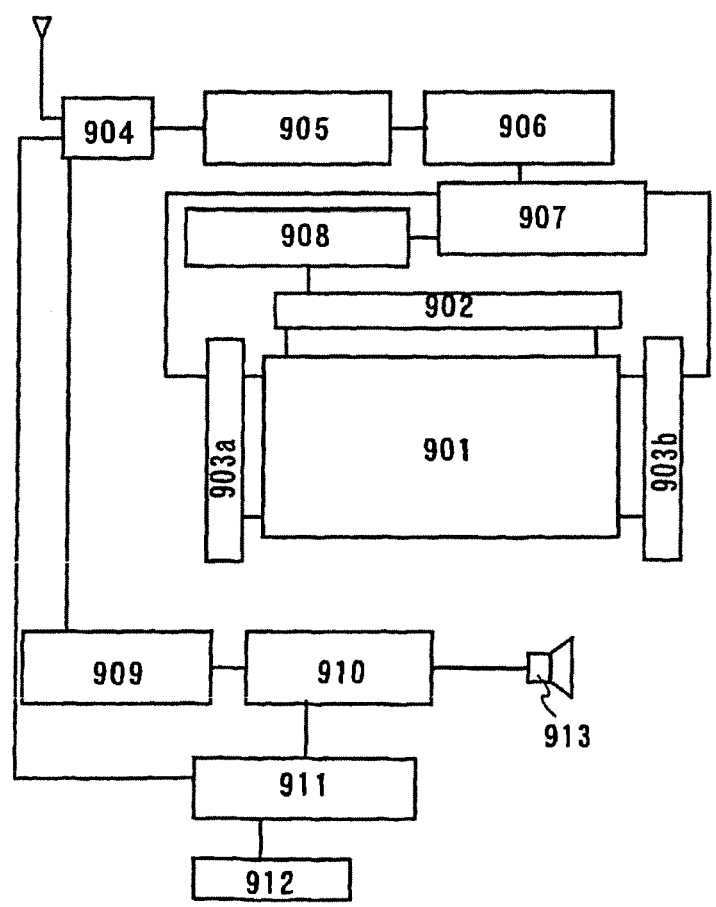

Given as examples of such electronic devices provided with a module explained in the foregoing embodiment mode are: a camera such as a video camera or a digital camera, a goggles-type display (head mounted display), a navigation system, a sound reproduction device (a car audio system, an audio set and the like), a personal computer, a game machine, a portable information terminal (a mobile computer, a cellular phone, a portable game machine, an electronic book, or the like), and an image reproduction device including a recording medium (more specifically, a device which can reproduce a recording medium such as a digital versatile disc (DVD) and so forth, and includes a display for displaying the reproduced image). The droplet discharging method explained in the foregoing embodiment mode is preferably used for manufacturing a large television or the like having a large screen. FIGS. 19A and 19B show various specific examples of such electronic devices.

FIG. 19A shows a large EL television system including a chassis 2001, a support stage 2002, a display area 2003, a speaker 2004, a video signal input terminal 2005, and the like. The display area 2003 is provided with a module having a pixel area and a driver circuit area. The pixel area has a light-emitting element, and a TFT manufactured by the droplet discharging method explained in the foregoing embodiment mode. A display device includes all information display device such as a personal computer, a TV broadcasting receiver, or an advertisement display.

At least a pixel area may preferably be provided with a polarizing plate or a circularly polarizing plate so as to improve contrast. For example, a quarter wave plate, a half wave plate, and a polarizing plate may preferably be provided sequentially over a sealing substrate. Further, an anti-reflective film may be provided over the polarizing plate.

FIG. 19B is a block diagram for showing a main structure of an EL television system. A pixel area 603 is formed to have a structure explained in the foregoing embodiment mode.

As another external circuit, a video signal amplifier circuit 905 for amplifying a video signal among signals received by a tuner 904 at an input side of the video signal; a video signal processing circuit 906 for converting signals outputted from the video signal amplifier circuit 905 into color signals corresponding to red, green, and blue; a control circuit 907 for converting the video signal into input specification of the driver IC; and the like are provided. In the control circuit 907, signals are outputted to a signal line driver circuit 605, scan line driver circuits 604a, and 604b, respectively. In the case of digital driving, a signal separation circuit 908 may be provided between the control circuit and the signal line driver circuit to separate an input digital signal into m pieces and to supply the separated signals.

As shown in FIG. 19B, two scan line driver circuits 604a, 604b are preferably provided since signal delay or the like that generates as the size of a display panel increases can be prevented. The scan line driver circuit is not limited to two. Only one scan line driver circuit may be provided, or two or more scan line driver circuits may be provided. Similarly, one, or two or more of the signal line driver circuits may be provided.

A sound signal among the signals received by the tuner 904 is transmitted to an audio signal amplifier circuit 909, and the output is supplied to a speaker 913 via an audio signal processing circuit 910. A control circuit 911 receives control information of a reception station (reception frequency) or volume to send the signals to the tuner 901 or the sound signal processing circuit 910.

A television system can be completed by installing the display area having such the external circuit into the chassis 2001. As another accessory, a speaker 2004, a video signal input terminal 2005, operation switches, and the like are provided. As described above, an EL television system can be completed.

The present invention can be applied to not only a television system, but also to a display medium especially with large area, such as a monitor of a personal computer; an information display board at train stations or airports; or an advertisement display board in the street. Alternatively, a television system having a liquid crystal element can be manufactured.

Figure 20A:
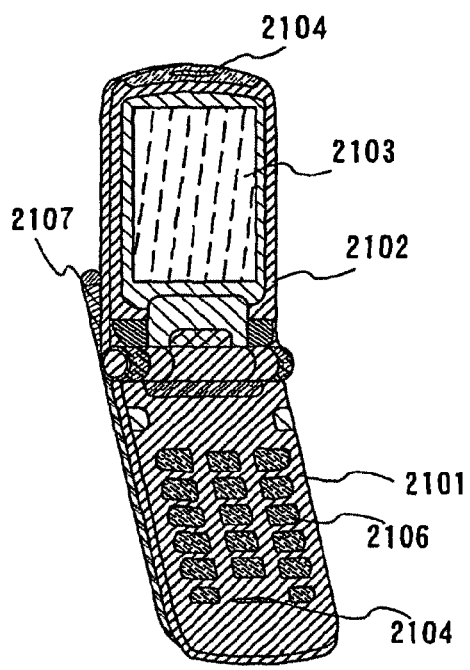
FIGS. 20A to 20C each show an electronic device of the invention.

FIG. 20A shows a cellular phone among portable terminals including a main body 2101, a chassis 2102, a display area 2103, a voice input unit 2104, an operation key 2106, an antenna 2107, and the like. The display area 2103 is provided with a module having a pixel area and a driver circuit area. The pixel area has a light-emitting element or a liquid crystal element, and a TFT manufactured by the droplet discharge method explained in the foregoing embodiment mode. By forming a plurality of display areas 2103 using one large mother glass substrate, the manufacturing costs of the cellular phone can be reduced.

Figure 20B:
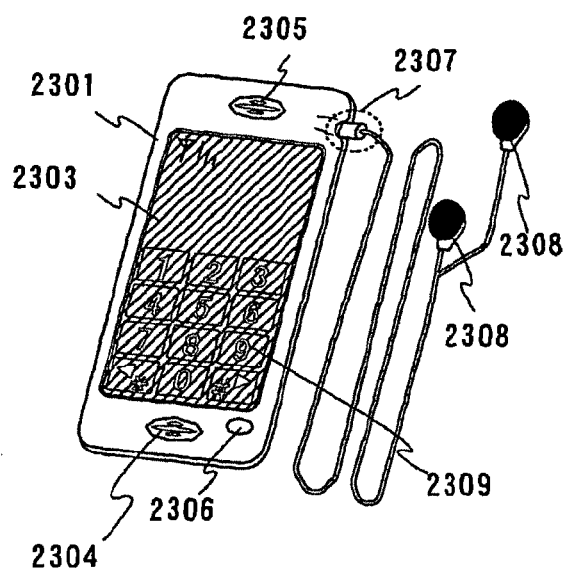

FIG. 20B shows a sheet shaped cellular phone including a main body 2301, a display area 2303, a voice input unit 2304, a voice output unit 2305, a switch 2306, an external connecting port 2307, and the like. Earphones 2308 prepared separately can be connected to the cellular phone via the external connecting port 2307. The display area 2303 has a display screen with a tough panel. By touching a tough panel operation key 2309 displayed on the display area 2303, a series of operation can be conducted. The display area 2303 is provided with a module having a pixel area and a driver circuit area. The pixel area has a light-emitting element or a liquid crystal element, and a TFT manufactured by the droplet discharge method explained in the foregoing embodiment mode. By forming a plurality of display areas 2303 using one large mother glass substrate, the manufacturing costs of the cellular phone can be reduced.

Figure 20C:
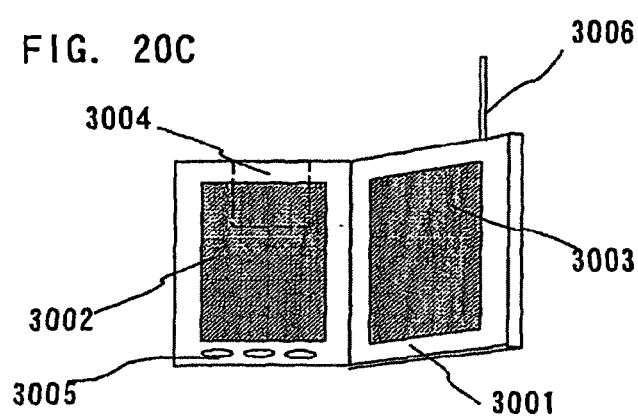

FIG. 20C shows a portable book (electronic book) including a main body 3101, display areas 3102, 3103, a memory medium 3104, an operation switch 3105, an antenna 3106, and the like. The display areas 3102, 3103 are provided with a module having a pixel area and a driver circuit area. The pixel area has a light-emitting element or a liquid crystal element and a TFT manufactured by the droplet discharge method explained in the foregoing embodiment mode. By forming a plurality of display areas 3102, 3103 using one large mother glass substrate, the manufacturing costs of the cellular phone can be reduced.

Even in the case of small electronic devices, a plurality of display areas can be obtained from one large mother glass by forming a display area according to the present invention. Accordingly, the manufacturing costs of the electronic devices can be reduced.

What is claimed is:

1. A method for manufacturing a display device, comprising the steps of:
   forming a gate electrode over a first substrate;
   forming a gate insulating film over the gate electrode;
   forming a semiconductor film over the gate insulating film;
   forming a source electrode and a drain electrode over the semiconductor film;
   forming a first protection diode and a second protection diode; and
   discharging a material of a color filter by a droplet discharge method over the gate insulating film after forming the source electrode and the drain electrode,
   wherein the first protection diode is electrically connected to one of the source electrode and the drain electrode, and
   wherein the second protection diode is electrically connected to the gate electrode.

2. The method for manufacturing a display device according to claim 1,
   wherein the material of the color filter is in contact with the gate insulating film.

3. The method for manufacturing a display device according to claim 1, further comprising the step of forming a pixel electrode over the color filter.

4. The method for manufacturing a display device according to claim 3,
   wherein the pixel electrode comprises a material having light-transmitting property.

5. The method for manufacturing a display device according to claim 1, further comprising the step of simultaneously removing a part of the gate insulating film and a part of the semiconductor film.

6. The method for manufacturing a display device according to claim 1,
   wherein the display device is a liquid crystal display or an organic electroluminescent display.

7. The method for manufacturing a display device according to claim 1, further comprising the step of forming an insulating film having a depression and a projection,
   wherein the gate electrode is formed in the depression by droplet discharge method.

8. The method for manufacturing a display device according to claim 1, wherein a photolithography is not used for forming the color filter.

9. The method for manufacturing a display device according to claim 1, further comprising the step of forming a channel protective film over the semiconductor film.

10. A method for manufacturing a display device, comprising the steps of:
    forming a gate electrode over a first substrate;
    forming a gate insulating film over the gate electrode;
    forming a semiconductor film over the gate insulating film;
    forming a source electrode and a drain electrode over the semiconductor film;
    forming a first protection diode and a second protection diode; and
    discharging a material of a black matrix by a droplet discharge method over the source electrode and the drain electrode,
    wherein the first protection diode is electrically connected to one of the source electrode and the drain electrode, and
    wherein the second protection diode is electrically connected to the gate electrode.

11. The method for manufacturing a display device according to claim 10,
    wherein the material of the black matrix overlaps the gate electrode and the semiconductor film.

12. The method for manufacturing a display device according to claim 10, further comprising the step of forming a pixel electrode over the black matrix.

13. The method for manufacturing a display device according to claim 12, wherein the pixel electrode comprises a material having light-transmitting property.

14. The method for manufacturing a display device according to claim 10, further comprising the step of simultaneously removing a part of the gate insulating film and a part of the semiconductor film.

15. The method for manufacturing a display device according to claim 10,
wherein the display device is a liquid crystal display or an organic electroluminescent display.

16. The method for manufacturing a display device according to claim 10, further comprising the step of forming an insulating film having a depression and a projection,
wherein the gate electrode is formed in the depression by droplet discharge method.

17. The method for manufacturing a display device according to claim 10, further comprising the step of forming a channel protective film over the semiconductor film.

18. A method for manufacturing a display device, comprising the steps of:
forming a gate electrode over a first substrate;
forming a gate insulating film over the gate electrode;
forming a semiconductor film over the gate insulating film;
forming a source electrode and a drain electrode over the semiconductor film;
forming a color filter over the gate insulating film after forming the source electrode and the drain electrode;
forming a first protection diode and a second protection diode; and
discharging a material of a black matrix by a droplet discharge method over the source electrode and the drain electrode,
wherein the first protection diode is electrically connected to one of the source electrode and the drain electrode, and
wherein the second protection diode is electrically connected to the gate electrode.

19. The method for manufacturing a display device according to claim 18,
wherein the material of the black matrix overlaps the gate electrode and the semiconductor film.

20. The method for manufacturing a display device according to claim 18,
wherein the material of the color filter is in contact with the gate insulating film.

21. The method for manufacturing a display device according to claim 18, further comprising the step of forming a pixel electrode over the color filter after discharging the material of the black matrix.

22. The method for manufacturing a display device according to claim 21,
wherein the pixel electrode comprises a material having light-transmitting property.

23. The method for manufacturing a display device according to claim 18, further comprising the step of simultaneously removing a part of the gate insulating film and a part of the semiconductor film.

24. The method for manufacturing a display device according to claim 18, wherein the display device is a liquid crystal display or an organic electroluminescent display.

25. The method for manufacturing a display device according to claim 18, further comprising the step of forming an insulating film having a depression and a projection,
wherein the gate electrode is formed in the depression by droplet discharge method.

26. The method for manufacturing a display device according to claim 18, wherein a photolithography is not used for forming the color filter.

27. The method for manufacturing a display device according to claim 18, further comprising the step of forming a channel protective film over the semiconductor film.

* * * * *